US005475632A

United States Patent [19]
Sugiyama

[11] Patent Number: 5,475,632
[45] Date of Patent: Dec. 12, 1995

[54] METHOD OF AND APPARATUS FOR IDENTIFYING UNKNOWN SYSTEM USING ADAPTIVE FILTER

[75] Inventor: Akihiko Sugiyama, Tokyo, Japan

[73] Assignee: NEC Corporation, Japan

[21] Appl. No.: 924,340

[22] Filed: Jul. 30, 1992

[30] Foreign Application Priority Data

| Jul. 30, 1991 | [JP] | Japan | 3-189092 |
| Nov. 25, 1991 | [JP] | Japan | 3-308687 |
| Feb. 14, 1992 | [JP] | Japan | 4-061257 |

[51] Int. Cl.$^6$ .................................... G06G 7/02
[52] U.S. Cl. ...................... 364/825; 364/724.19
[58] Field of Search ................ 364/825, 724.19, 364/724.2; 375/11–14

[56] References Cited

U.S. PATENT DOCUMENTS

| 4,791,390 | 12/1988 | Harris et al. | 364/724.19 |
| 4,922,530 | 5/1990 | Kenney et al. | 364/724.19 |
| 5,230,006 | 7/1993 | Kurokami | 364/724.2 X |
| 5,245,561 | 9/1993 | Sugiyama | 364/724.19 |
| 5,247,470 | 9/1993 | McKown et al. | 364/724.19 |
| 5,260,896 | 11/1993 | Iwasaki | 364/724.19 |

OTHER PUBLICATIONS

Widrow et al, "Adaptive Noise Canceling: Principles and Application", Proc. IEEE, vol. 63, No. 12, pp. 1692–1716, Dec. 1975.

Mathews et al, "Stochastic Gradient Adaptive Filter with Gradient Adaptive Step Size" Proc. ICASSP '90, pp. 1385–1388, Apr. 1990.

Akihiko Sugiyama et al., "A Fast Convergence Algorithm For Adaptive Fir Filters", Speech Processing 2 Digital Signal Processing, vol. 2, (1989), pp. 892–895.

*Primary Examiner*—Tan V. Mai
*Attorney, Agent, or Firm*—Ostrolenk, Faber, Gerb & Soffen

[57] ABSTRACT

A method of and an apparatus for identifying an unknown system using an adaptive filter wherein the step size is subsequently supplied to the adaptive filter so that the identification error may be decreased. Value of the step size is calculated by using a gradient of power of error signal according to the LMS or LIM (learning identification method) algorithm, and limited by the previous value of step size. Further, when a sudden change in the error signal is detected, the step size can be re-setted or the limitation to the step size can be released.

93 Claims, 27 Drawing Sheets

METHOD OF AND APPARATUS FOR IDENTIFYING UNKNOWN SYSTEM USING ADAPTIVE FILTER

BACKGROUND OF THE INVENTION

1. Field of the Invention

This invention relates to a method of and an apparatus for identifying an unknown system using an adaptive filter.

2. Description of the Related Art

Identification of an unknown system using an adaptive filter proceeds such that the same signal is inputted both to an unknown system to be identified and to an adaptive filter, and coefficients of the adaptive filter are updated using the identification error obtained by subtracting an output of the adaptive filter from the output of the unknown system. The identification error will hereinafter be referred to as an error signal. This identification of an unknown system using an adaptive filter can be applied, for example, to an echo canceler for removing echoes which may be produced at a two-line to four-line converting portion on a transmission line, an equalizer for removing intersymbol interference between codes which may take place in transmission lines, a noise canceler for removing noise which may leak into a sound inputting microphone, a howling canceler for removing howling which may be caused by acoustic coupling from a loudspeaker to a microphone, and various other apparatus. An exemplary common document regarding an adaptive filter is B. Widrow et al., "Adaptive Signal Processing", (Prentice-Hall, N.J., 1985) (hereinafter referred to as reference 1.) Here, operation of an adaptive filter is described taking a noise canceler as an example.

A noise canceler generally operates such that, using an adaptive filter having a transfer function approximated to an impulse response of a path from a noise source to a main input terminal, a noise replica corresponding to a noise component mixed into the main input terminal is produced to suppress the noise which is admitted into the main input terminal and gives a disturbance to a signal. In this instance, coefficients at taps of the adaptive filter are successively modified by taking the correlation between a difference signal obtained by subtraction of the noise replica from a mixed signal in which noise and an original signal are mixed and a reference noise available at a reference input terminal. As an exemplary algorithm for this coefficient modification of an adapive filter, that is, for convergence of a noise canceler, the LMS algorithm disclosed in reference 1 above and the learning identification method (LIM) disclosed in J. Nagumo et al., IEEE Transactions on Automatic Control, Vol. AC-12, No. 3, pp. 282–287 (1967) (hereinafter referred to as reference 2) are known.

FIG. 1 is a block diagram showing the construction of an example of a conventional noise canceler. Referring to FIG. 1, a mixed signal in which a signal detected at main input terminal 1 and noise are mixed is supplied to subtracter 4. A reference noise signal detected at reference input terminal 2 is supplied to adaptive filter 3. A noise replica generated by adaptive filter 3 is subtracted from the mixed signal at subtracter 4. Consequently, the noise components in the mixed signal are cancelled and a signal wherein the noise is removed is supplied to output terminal 6. Output of subtracter 4 is supplied also to multiplier 5, at which it is multiplied by $2\alpha$. Output of multiplier 5 is used for updating of the coefficients of adaptive filter 3. Here, $\alpha$ is a constant and called a step size. Now, if a signal is represented by $s_k$ (k is an index representative of time), reference noise by $n_k$, noise to be erased by $v_k$, and additional noise that signal $s_k$ undergoes by $\delta_k$, then signal $w_k$ to be supplied from input terminal 1 to subtracter 4 is given by:

$$w_k = s_k + v_k + \delta_k \tag{1}$$

The object of the noise canceler is to produce replica $u_k$ of noise component $v_k$ defined by equation (1) to cancel noise. By producing noise replica $u_k$ adaptively using a closed loop circuit consisting of adaptive filter 3, subtracter 4 and multiplier 5 shown in FIG. 1, difference signal $d_k$ given by the following equation can be obtained as an output signal of subtracter 4:

$$d_k = s_k + v_k - u_k \tag{2}$$

Since it is considered that generally $\delta_k$ is small enough compared with $s_k$, $\delta_k$ is ignored here. $(v_k - u_k)$ in equation (2) above is called residual noise, and from the point of view of system identification, this residual noise is equal to an error signal. If the LMS algorithm is assumed, then m-th coefficient $c_{m,k+1}$ of adaptive filter 3 is updated in accordance with the following equation:

$$c_{m,k+1} = c_{m,k} + 2\alpha \cdot d_k \cdot n_{m,k} \tag{3}$$

If equation (3) is represented in a matrix form for all N coefficients, then $$c_{k+1} = c_k + 2\alpha \cdot d_k \cdot n_k \tag{4}$$

where $c_k$ and $n_k$ are given by the following equations, respectively:

$$c_k = [c_{0,k} c_{1,k} \ldots c_{N-1,k}]^T \tag{5}$$

$$n_k = [n_k n_{k-1} \ldots n_{k-N+1}]^T \tag{6}$$

where $[.]^T$ represents transposition of the matrix. On the other hand, according to LIM, updating of coefficients are performed in accordance with following equation (7) in place of equation (4):

$$c_{k+1} = c_k + (2\mu/N\sigma_n^2) \cdot d_k \cdot n_k \tag{7}$$

where $\mu$ is a step size in LIM, and $\sigma_n^2$ is an average power inputted to adaptive filter 3. Parameter $\sigma_n^2$ is used so that the value of step size $\mu$ may increase in inverse proportion to the average power in order to assure stabilized convergence. Various methods are available to calculate $\sigma_n^2$, and $\sigma_n^2$ can be calculated, for example, in accordance with following equation (8):

$$N \cdot \sigma_n^2 = \sum_{j=k}^{k-N+1} n_j^2 \tag{8}$$

Step sizes $\alpha$ and $\mu$ in equations (4) and (7) define the rate of convergence of the adaptive filter and the level of residual noise after convergence. In the case of LMS, as the value of $\alpha$ increases, the convergence occurs more rapidly, but the residual noise level increases. On the contrary, in order to attain a sufficiently low residual noise level, $\alpha$ having a corresponding low value must necessarily be adopted, which results in deterioration in convergence rate. This similarly applies to step size $\mu$ in LIM.

In order to satisfy the contradictory requirements for the step sizes and the residual noise, an algorithm wherein the step size is variable has been proposed and is disclosed in Proceeding of International Conference on Acoustics, Speech and Signal Processing, pp. 1385–1388, 1990 (hereinafter referred to as reference 3.) The algorithm will be hereinafter referred to as SGA-GAS (Stochastic Gradient Adaptive Filters with Gradient Adaptive Step Size).

SGA-GAS uses $\alpha_k$ in place of step size $\alpha$ of the LMS algorithm of equation (4). Parameter $\alpha_k$ is defined by equation (9) below as a value which increases in proportion to the negative gradient of power $d_k^2$ of difference signal $\alpha_k$:

$$\alpha_k = \alpha_{k-1} + \frac{\rho}{2} \cdot \frac{\partial d_k^2}{\partial \alpha_{k-1}} \quad (9)$$

wherein $\rho$ is a positive constant and normally a very small value is used therefor. Equation (9) can be rewritten, using noise $n_k$, as:

$$\alpha_k = \alpha_{k-1} + \rho d_k d_{k-1} n_{k-1}^T n_k \quad (10)$$

Further, $\alpha_k$ must satisfy the following condition:

$$0 < \alpha_k < \frac{2}{3 \cdot tr\{R\}} \quad (11)$$

where $\{.\}^T$ is transposition of the matrix, $tr\{.\}$ a trace of the matrix, and $R$ an autocorrelation matrix of noise $n_k$.

FIG. 2 is a block diagram showing an example of construction of a noise canceler which employs the SGA-GAS algorithm. While the step size is fixed in the noise canceler shown in FIG. 1, it is variable in the noise canceler shown in FIG. 2. In particular, step size $\alpha_k$ represented by equation (10) is calculated by step size controller 8 and then limited by limiter 9, whereafter it is supplied to adaptive filter 3 via multiplier 5. An example of construction of step size controller 8 is shown in a block diagram of FIG. 3.

Referring to FIG. 3, step size controller 8 has two input terminals 90 and 93 and single output terminal 100 and includes correlation calculating circuit 94, three multipliers 92, 96 and 97, two delay elements 91 and 99 and adder 98. Difference signal $d_k$ is supplied to first input terminal 90 while reference noise $n_k$ is supplied to second input terminal 93. Step size $\alpha_k$ which is an output of step size controller 8 is supplied from output terminal 100 to limiter 9 of FIG. 2. Signal $d_k$ supplied to first input terminal 90 is delayed by one sample period by first delay element 91 to make $d_{k-1}$ and is supplied to first multiplier 92. Signal $d_k$ is also supplied to first multiplier 92, and $d_k \cdot d_{k-1}$ which is an output of first multiplier 92 is transmitted to second multiplier 96:

Reference noise $n_k$ supplied to second input terminal 93 is transmitted to correlation calculating circuit 94. Correlation $C_k$, which is defined by the following equation, is calculated by correlation calculating circuit 94 and transmitted to second multiplier 96.

$$C_k = n_{k-1}^T n_k \quad (12)$$

Correlation $C_k$ is multiplied by $d_k \cdot d_{k-1}$ by second multiplier 96 and is further multiplied by $\rho$ by third multiplier 97, whereafter it is transmitted as $\rho \cdot d_k \cdot d_{k-1} \cdot n_{k-1}^T \cdot n_k$ to adder 98. At adder 98, the signal from third multiplier 97 is added to the signal which is an output of second delay element 99 and was obtained one sample period earlier, and the sum signal is transmitted to output terminal 100. Accordingly, signal $\alpha_k$ transmitted to output terminal 100 is given by $\alpha_{k-1} + \rho d_k d_{k-1} n_{k-1}^T n_k$, which coincides with equation (10) above.

FIG. 4 is a block diagram showing construction of correlation calculating circuit 94. Correlation calculating circuit 94 includes N-input adder 123, N delay elements $121_1$ to $121_N$ and N multipliers $122_1$ to $122_N$. Delay elements $121_1$ to $121_N$ are connected in series and form a tapped delay line, to which multipliers $122_1$ to $122_N$ are connected respectively. Input terminal 120 of correlation calculating circuit 94 corresponds to second input terminal 93 in FIG. 3 and receives $n_k$ thereat. Signal $n_k$ is supplied to the delay line with taps and first multiplier $122_1$. For $2 \leq i \leq N$, outputs of (i−1)-th and i-th delay elements $121_{i-1}$ and $121_i$ are supplied to i-th multiplier $122_i$. Accordingly, $(n_k, n_{k-1})$, $(n_{k-1}, n_{k-2})$, ..., $(n_{k-N+1}, n_{k-N})$ are inputted to multipliers $122_1$, $122_2$, ..., $122_N$, respectively, and outputs of the multipliers are given by $n_k n_{k-1}$, $n_{k-1} n_{k-2}$, ..., $n_{k-N+1} n_{k-N}$.

Outputs of multipliers $122_1$ to $122_N$ are all supplied to adder 123, and a value given by $$\sum_{j=k}^{k-N-1} n_{j-1} n_j = n_{k-1}^T \cdot n_k \quad (13)$$

is outputted from adder 123. Output $n_{k-1}^T \cdot n_k$ is transmitted as correlation $C_k$ to output terminal 124 of correlation calculating circuit 94.

Referring now to FIG. 5, limiter 9 includes 2-input minimum value circuit 22 and 2-input maximum value circuit 21. Step size $\alpha_k$ is supplied to minimum value circuit 22 from step size controller 8 by way of input terminal 23. $Th_H$, which is a threshold value for a maximum value, is supplied to the other input terminal of minimum value circuit 22, and a smaller value of $\alpha_k$ and $Th_H$ is supplied as a minimum value from minimum value circuit 22 to maximum value circuit 21. $Th_L$, which is a threshold value for a minimum value, is supplied to the other input terminal of maximum value circuit 21, and a greater value of the output of minimum value circuit 22 and $Th_L$ is supplied as a maximum value from maximum value circuit 21 to output terminal 20. In other words, step size $\alpha_k$ supplied to input terminal 23 is limited, at upper and lower limits thereof, with minimum value $Th_L$ and maximum value $Th_H$, respectively, so that it is outputted as $\overline{\alpha_k}$ given by the following equation:

$$\overline{\alpha_k} = \begin{cases} Th_L & \text{for } \alpha_k \leq Th_L \\ \alpha_k & \text{for } Th_L < \alpha_k \leq Th_H \\ Th_H & \text{for } Th_H < \alpha_k \end{cases} \quad (14)$$

Here, if $Th_L = 0$ and $Th_H = 2/(3 \cdot tr\{R\})$, then a value equivalent to a value obtained by execution of equation (11) is outputted from limiter 9.

Maximum value circuit 21 and minimum value circuit 22 can each be realized by a combination of selector 31 and comparator 32 as shown in FIG. 6. Minimum value circuit 21 will be described first. The two input terminals of minimum value circuit 22 in FIG. 5 correspond to two input terminals 33 and 34, respectively, of FIG. 6. Signals supplied to input terminals 33 and 34 are transmitted simultaneously to both selector 31 and comparator 32. Comparator 32 compares the two input signals with each other and generates a controlling signal such that a smaller signal is selected by selector 31. The controlling signal is transmitted to selector 31, and the signal from input terminal 33 or 34 selected by selector 31 is transmitted as a minimum value to output terminal 30. On the other hand, in the case of maximum value circuit 21, comparator 32 generates a controlling signal such that selector 31 selects the greater signal of the two input signals supplied thereto. Selector 31 then supplies the signal selected in accordance with the controlling signal as a maximum value to output terminal 30.

Identification of an unknown system based upon the SGA-GAS algorithm has been described so far by way of an example of a noise canceler. Here, in an ideal case wherein $d_k = v_k - u_k$ is met with difference signal $d_k$, the negative gradient of power $d_k^2$ of difference signal $d_k$ coincides with a system identification error, and consequently, $d_k^2$ can be used for step size control. However, in an actual noise canceler, $d_k$ is given by $d_k=s_k+v_k-u_k$ as represented in equation (2) and accordingly is influenced by signal $s_k$. Therefore, a correct gradient of $d_k^2$ cannot be obtained, and the step size cannot be controlled correctly. In some other apparatus described above other than a noise canceler, even when $s_k=0$, when additional noise $\delta_k$ in equation (1) cannot be ignored, difference signal $d_k$ is given by $$d_k=v_k-u_k+\delta_k \qquad (15)$$

and consequently, $\delta_k$ makes an obstruction to error signal $v_k-u_k$ similar to $s_k$. The presence of parameter $\delta_k$ or $s_k$ will result in elongation in converging time or an increase in final misadjustment after convergence.

SUMMARY OF THE INVENTION

It is an object of the present invention to provide a method of identifying an unknown system using an adaptive filter which is robust even with an obstruction signal to an error signal $v_k-u_k$ and short in converging time and can minimize the final misadjustment after convergence.

It is another object of the present invention to provide an apparatus for identifying an unknown system using an adaptive filter which is robust even with an obstruction signal to an error signal $v_k-u_k$ and short in converging time and can minimize the final misadjustment after convergence.

The first object of the present invention is achieved by a method of identifying an unknown system using an adaptive filter, which delays an input signal successively by one sample period to form a plurality of samples, calculates products between the samples and corresponding samples of a plurality of multiplicands provided correspondingly to the plurality of samples, and outputs the sum total of the products, wherein the unknown system is identified by adding to each of the multiplicands a product among a difference signal obtained by subtraction of an output of said adaptive filter from an output of the unknown system, the sample corresponding to the multiplicand and a parameter as an updated amount for unit updating to update the multiplicands so that the difference signal may be decreased, characterized in that a value which increases in proportion to a gradient of the difference signal with respect to the parameter is added to the parameter to obtain a sum and the parameter is modified using a limited sum obtained by applying a limit to the sum, and a threshold value for applying the limit is determined using a previous limited sum or sums.

The first object of the present invention can also be achieved by a method of identifying an unknown system using an adaptive filter, which delays an input signal successively by one sample period to form a plurality of samples, calculates products between the samples and corresponding samples of a plurality of multiplicands provided correspondingly to the plurality of samples, and outputs the sum total of the products, wherein the unknown system is identified by adding to each of the multiplicands a product among a difference signal obtained by subtraction of an output of said adaptive filter from an output of the unknown system, the sample corresponding to the multiplicand and a parameter as an updated amount for unit updating to update the multiplicands so that the difference signal may be decreased, characterized in that a value which increases in proportion to a gradient of the difference signal with respect to the parameter is added to the parameter to obtain a sum and a limit is applied to the sum to obtain a limited sum, and when it is detected that there is a sudden change in the difference signal, the sum is regarded as the limited sum only for a period of time of a number of clocks equal to a predetermined first constant, and then the parameter is modified using the limited sum, and a threshold value for applying the limit is determined using a previous limited sum or sums.

Further, the first object of the present invention can also be achieved by a method of identifying an unknown system using an adaptive filter, which delays an input signal successively by one sample period to form a plurality of samples, calculates products between the samples and corresponding samples of a plurality of multiplicands provided correspondingly to the plurality of samples, and outputs the sum total of the products, wherein the unknown system is identified by adding to each of the multiplicands a product among a difference signal obtained by subtraction of an output of said adaptive filter from an output of the unknown system, the sample corresponding to the multiplicand and a parameter as an updated amount for unit updating to update the multiplicands so that the difference signal may be decreased, characterized in that a value which increases in proportion to a gradient of the difference signal with respect to the parameter is added to the parameter to obtain a sum and a limit is applied to the sum to obtain a limited sum, and then, an average value of these limited sums is calculated and is determined as the parameter for calculation of the updated amount.

The first object of the present invention can also be achieved by a method of identifying an unknown system using an adaptive filter, which delays an input signal successively by one sample period to form a plurality of samples, calculates products between the samples and corresponding samples of a plurality of multiplicands provided correspondingly to the plurality of samples, and outputs the sum total of the products, wherein the unknown system is identified by adding to each of the multiplicands a normalized value of a product among a difference signal obtained by subtraction of an output of said adaptive filter from an output of the unknown system, the sample corresponding to the multiplicand and a parameter as an updated amount for unit updating to update the multiplicands so that the difference signal may be decreased, said normalized value being obtained by normalization of the product with a value of input power to said adaptive filter, characterized in that a value which increases in proportion to a gradient of the difference signal normalized with the value of input power to said filter with respect to the parameter is added to the parameter to obtain a sum, and the parameter is modified using the sum.

Furthermore, the first object of the present invention can also be achieved by a method of identifying an unknown system using an adaptive filter, which delays an input signal successively by one sample period to form a plurality of samples, calculates products between the samples and corresponding samples of a plurality of multiplicands provided correspondingly to the plurality of samples, and outputs the sum total of the products, wherein the unknown system is identified by adding to each of the multiplicands a normalized value of a product among a difference signal obtained by subtraction of an output of said adaptive filter from an output of the unknown system, the sample corresponding to the multiplicand and a parameter as an updated amount for unit updating to update the multiplicands so that the difference signal may be decreased, said normalized value being obtained by normalization of the product with a value of input power to said adaptive filter, characterized in that a value which increases in proportion to a gradient of the difference signal normalized with the value of input power to said filter with respect to the parameter is added to the parameter to obtain a sum and the parameter is modified using a limited sum obtained by applying a limit to the sum, and a threshold value for applying the limit is calculated using a previous limited sum or sums.

The second object of the present invention is achieved by an identifying apparatus for identifying a characteristic of an unknown system using an adaptive filter, characterized in that it comprises: a subtracter for subtracting an output of said adaptive filter from an output signal of the unknown system to obtain a difference signal; a step size controller for receiving the difference signal and an input signal to said adaptive filter and successively calculating a step size for use for the updating of coefficients of said adaptive filter; a limiter for receiving an output of said step size controller and limiting the received output; a first delay element for feeding back an output of said limiter to said limiter and said step size controller; and a first multiplier for multiplying the output of said limiter by the difference signal; and in that an output of said first multiplier is used as the step size for the updating of coefficients of said adaptive filter.

The second object of the present invention can be also achieved by an identifying apparatus for identifying a characteristic of an unknown system using an adaptive filter, characterized in that it comprises: a subtracter for subtracting an output of said adaptive filter from an output signal of the unknown system to obtain a difference signal; a first delay element; an error change detecting circuit for receiving the difference signal and detecting a sudden change of the received difference signal; a counter for receiving an output of said error change detecting circuit and counting clocks; a first selector for receiving an output of said error change detecting circuit and an output of said first delay element and selectively outputting one of the two received outputs in response to an output of said counter; a step size controller for receiving the difference signal and an input signal to said adaptive filter and successively calculating a step size for use for the updating of coefficients of said adaptive filter; a limiter for receiving an output of said step size controller and limiting the received output; a second selector for receiving an output of said limiter and the output of said step size controller and selectively outputting one of the two received outputs in response to an output of said first selector; a second delay element for feeding back an output of said second selector to said limiter; and a first multiplier for multiplying the output of said second selector by the difference signal; and in that said first delay element delays the output of said first selector and feeds back the delayed output to an input of said first selector; and an output of said first multiplier is used as a step size for the updating of coefficients of said adaptive filter.

Further, the second object of the present invention can be also achieved by an identifying apparatus for identifying a characteristic of an unknown system using an adaptive filter, characterized in that it comprises: a subtracter for subtracting an output of said adaptive filter from an output signal of the unknown system to obtain a difference signal; a step size controller for receiving the difference signal and an input signal to said adaptive filter and successively calculating a step size for use for the updating of coefficients of said adaptive filter; a limiter for receiving an output of said step size controller and limiting the received output; and an averaging circuit for receiving an output of said limiter and calculating an average value from the received output; and in that an output of said averaging circuit is used as a step size for the updating of coefficients of said adaptive filter.

Furthermore, the second object of the present invention can be also achieved by an identifying apparatus for identifying a characteristic of an unknown system using an adaptive filter, characterized in that it comprises: a subtracter for subtracting an output of said adaptive filter from an output signal of the unknown system to obtain a difference signal; a correlation calculating circuit for receiving an input signal to said adaptive filter and calculating and outputting a power value and a correlation of the input signal; a first delay element for receiving the power value and delaying the received power value by one sample period; a second delay element; a step size controller for receiving the difference signal, the correlation value, an output of said first delay element and an output of said second delay element and successively calculating a step size for use for the updating of coefficients of said adaptive filter; a limiter for receiving an output of said step size controller and limiting the received output; a first multiplier for multiplying an output of said limiter by the difference signal; and a first normalizing circuit for normalizing an output of said first multiplier with the power value; and in that said second delay element delays the output of said limiter by one sample period and feeds back the thus delayed output to said step size controller; and an output of said first normalizing circuit is used as a step size for updating of coefficients of said adaptive filter.

The above and other objects, features and advantages of the present invention will be apparent from the following description referring to the accompanying drawings which illustrate an example of a preferred embodiment of the present invention.

DETAILED DESCRIPTION OF THE PREFERRED EMBODIMENTS

Figure 1:
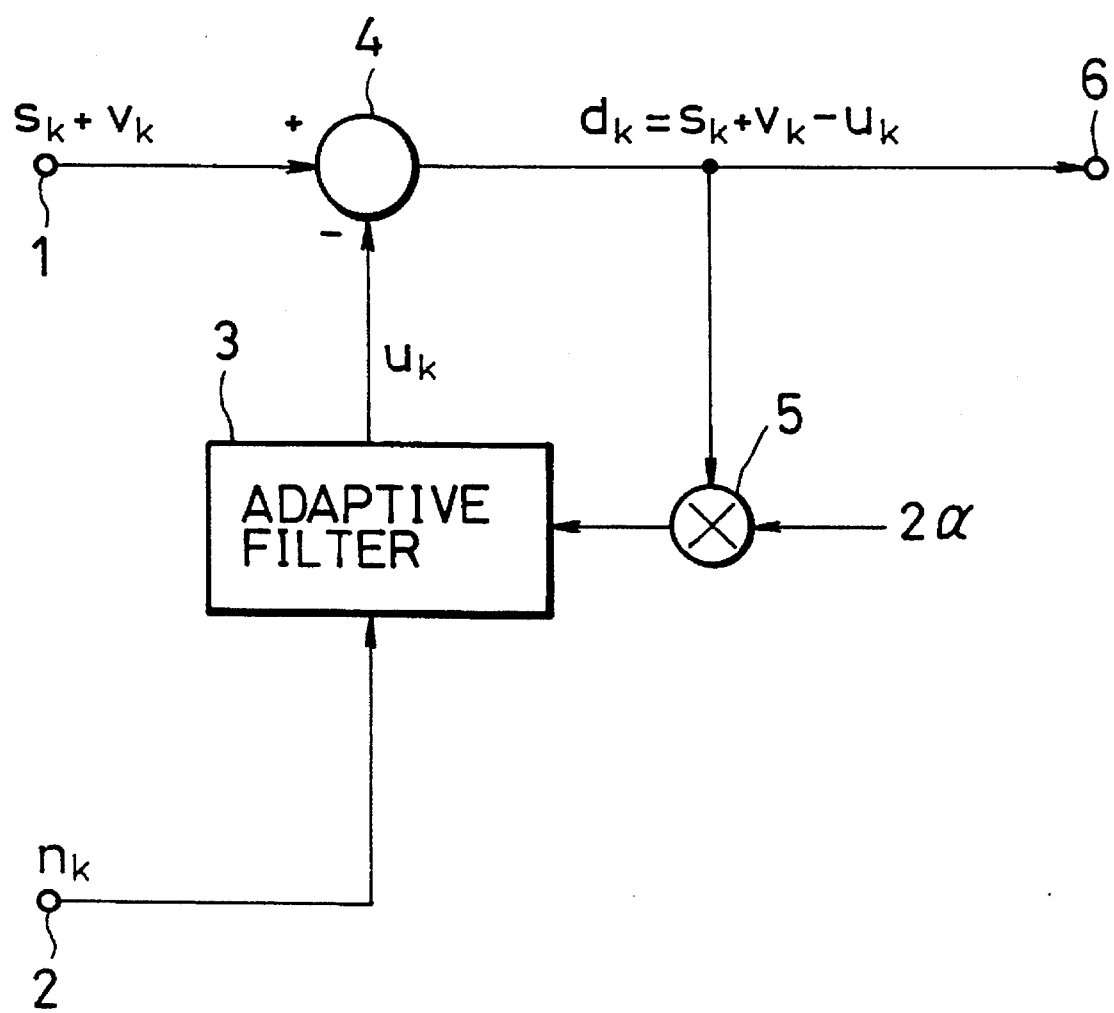
FIG. 1 is a block diagram showing an example of construction of a conventional exemplary noise canceler.
Figure 2:
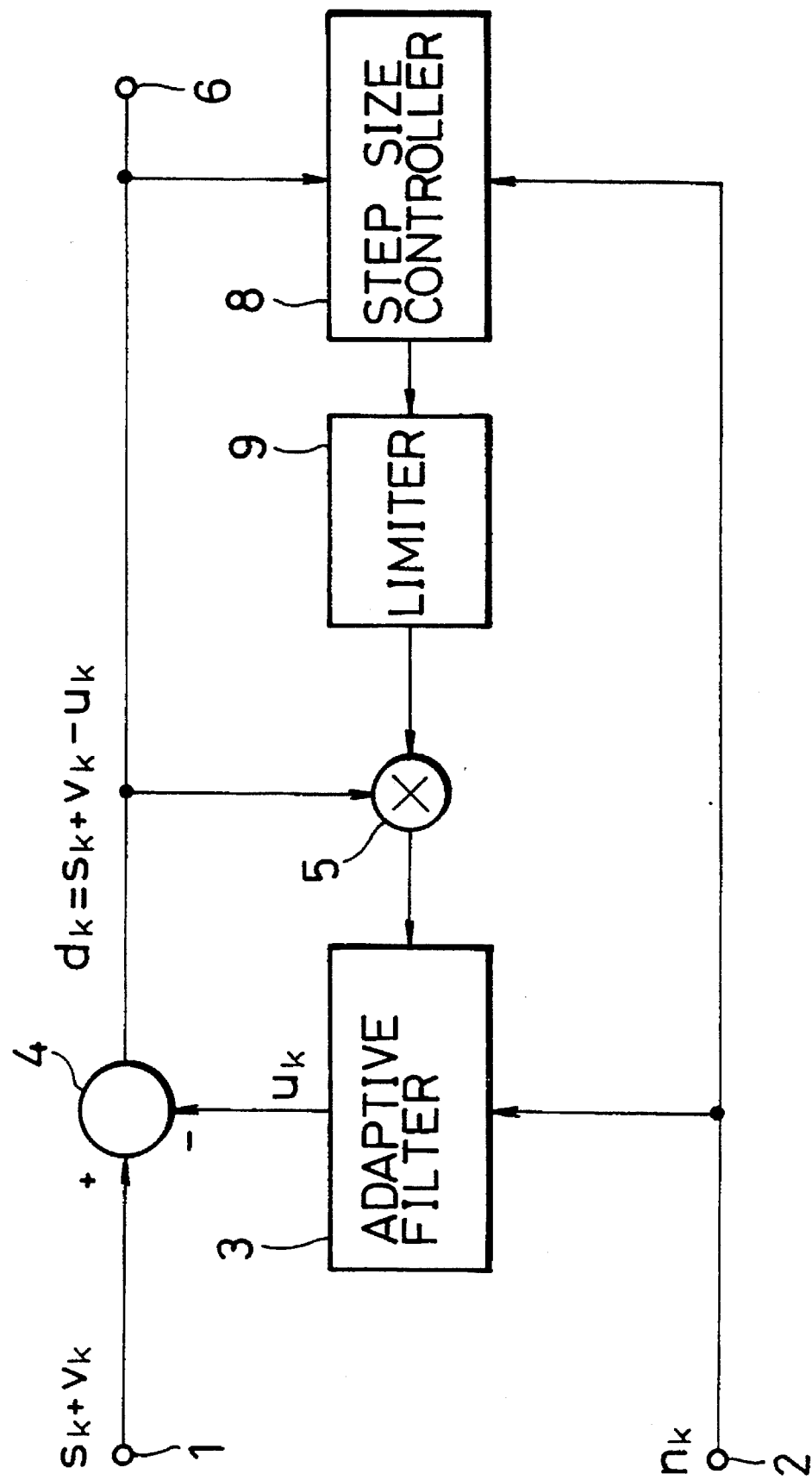
FIG. 2 is a block diagram showing an example of construction of a conventional noise canceler based on the SGA-GAS algorithm.
Figure 7:
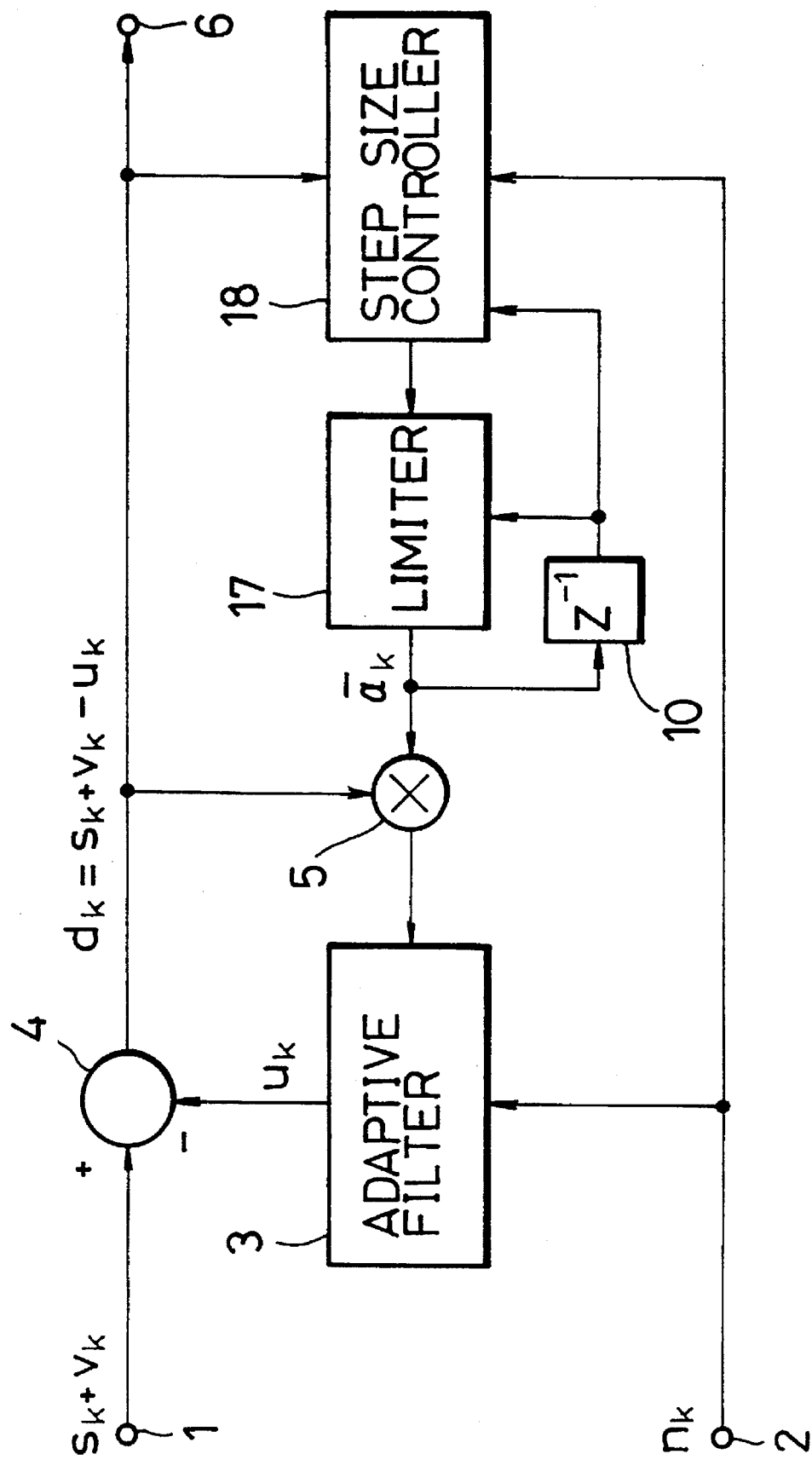
FIG. 7 is a block diagram showing construction of an apparatus for identifying an unknown system using an adaptive filter according to a first preferred embodiment of the present invention.

An apparatus for identifying an unknown system using an adaptive filter according to a first preferred embodiment of the present invention is shown in FIGS. 7 to 14. Referring first to FIG. 7, the identifying apparatus is generally constructed such that it removes, from a mixed signal $s_k+v_k$ of a signal $s_k$ and noise $v_k$, which is inputted to main input terminal 1, the noise and outputs a resultant signal from output terminal 6. The identifying apparatus includes adaptive filter 3, subtracter 4, multiplier 5, step size controller 18, limiter 17 and delay element 10. The apparatus is different from the conventional apparatus shown in FIG. 2 in construction of the limiter, step size controller and further in that output of limiter 17 is fed back to limiter 17 and step size controller 18 by way of delay element 10. The function blocks in FIG. 7 which are denoted by the same reference numerals to those of FIG. 2 have the same functions. Limited step size $\overline{\alpha_k}$ is supplied from limiter 17 to delay element 10.

Figure 3:
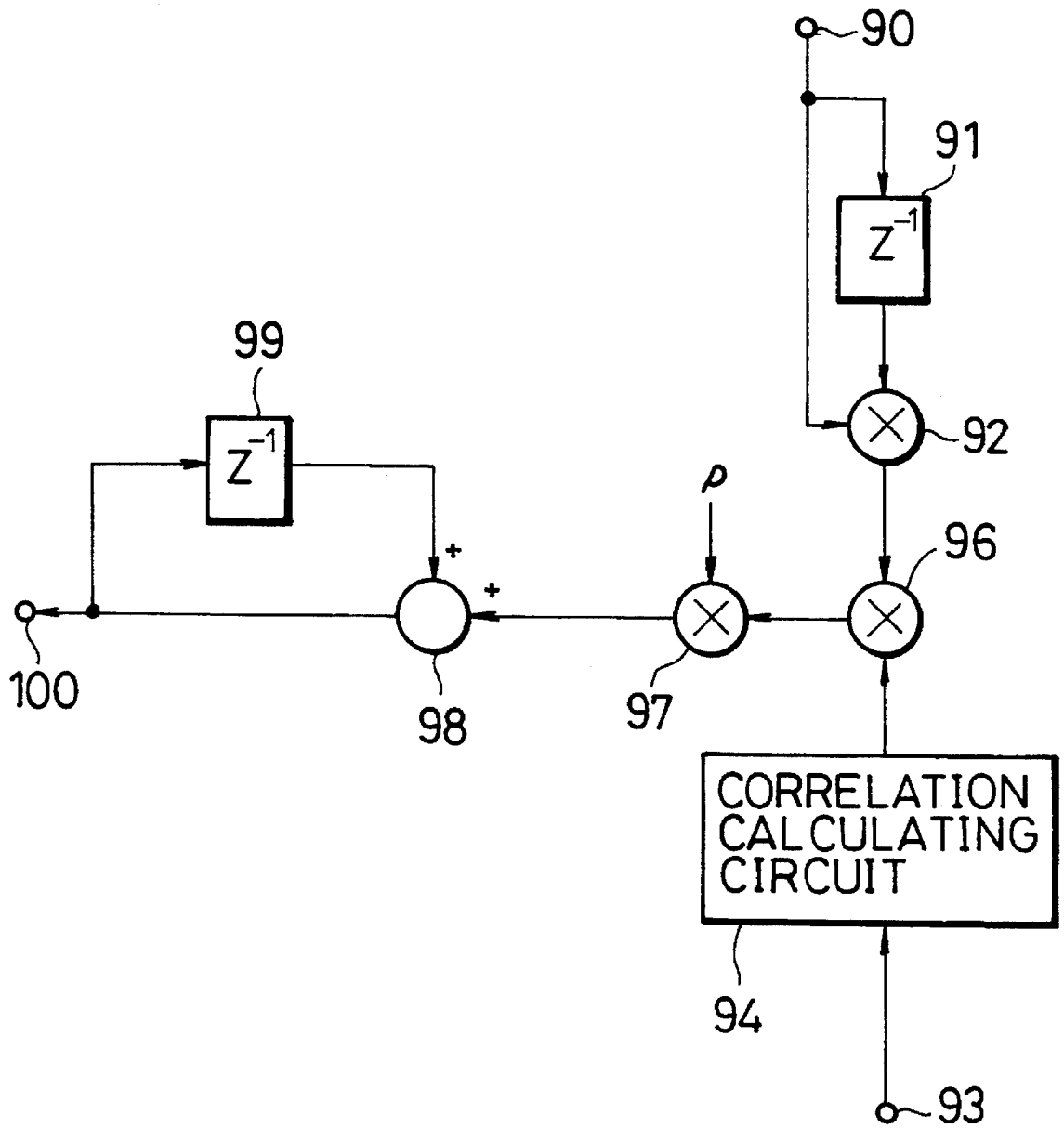
FIG. 3 is a block diagram showing construction of the step size controller in the apparatus shown in FIG. 2.
Figure 4:
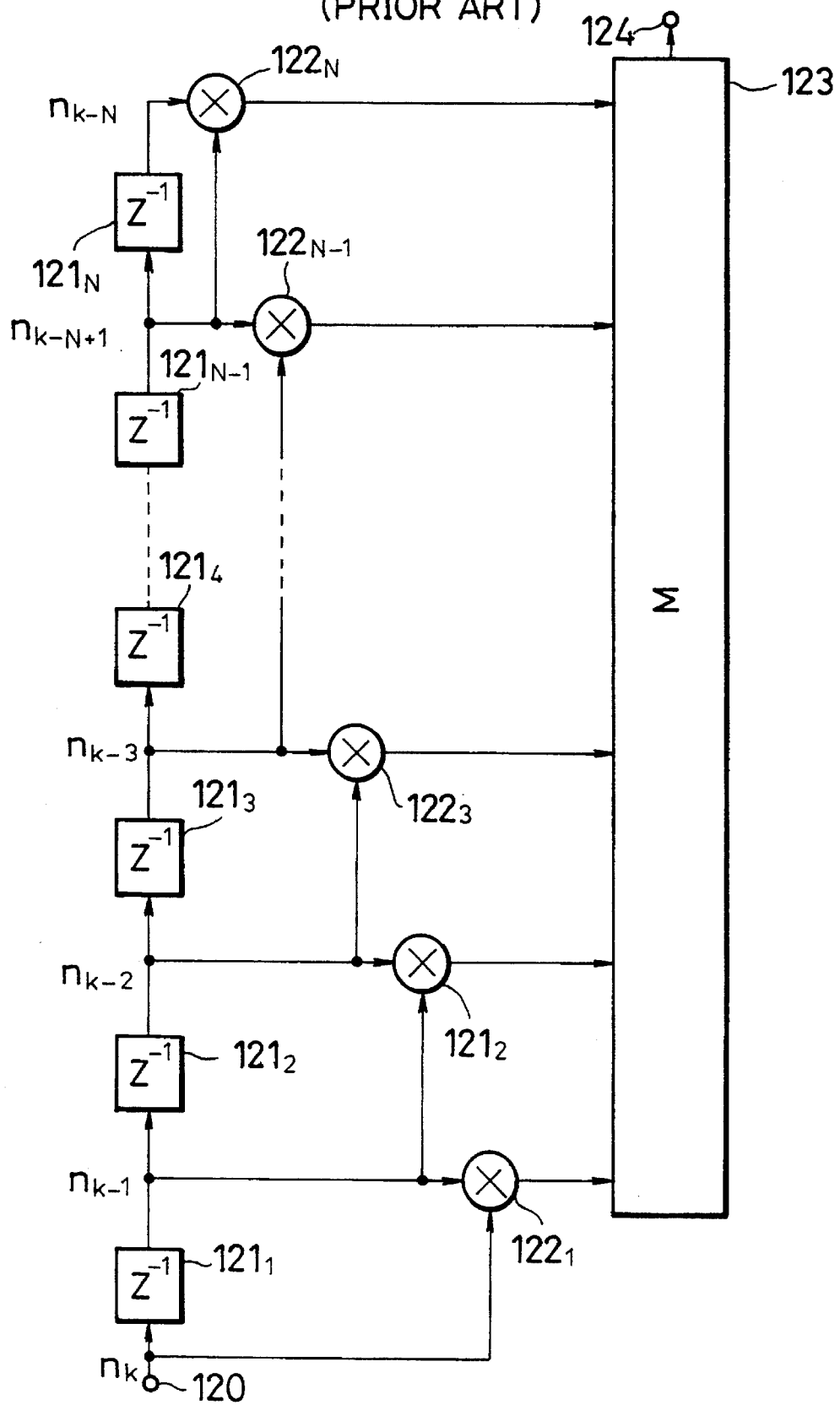
FIG. 4 is a block diagram showing construction of the correlation calculating circuit in the step size controller shown in FIG. 3.
Figure 8:
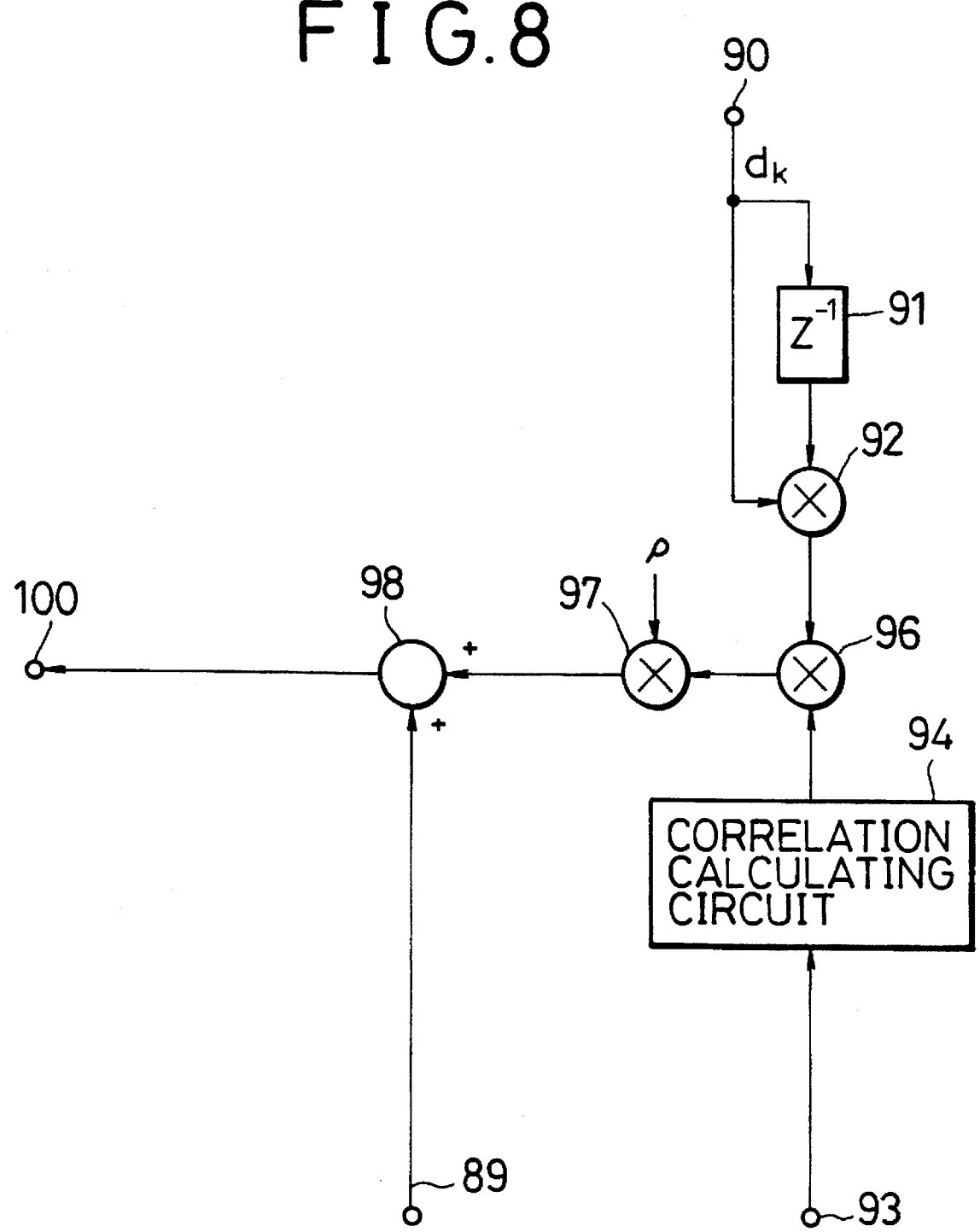
FIG. 8 is a block diagram showing a first example of construction of a step size controller.

FIG. 8 shows a first example of construction of step size controller 18, and function block in FIG. 8 which are denoted by same reference numerals as those of FIG. 3 have same functions. Comparing with above-mentioned step size controller 8 (FIG. 3), the delay element for delaying the output of adder 98 and feeding back the delayed output to adder 98 is not provided in step size controller 18. Instead of this delay element, input terminal 89 which is connected to adder 98 and transmits output of outer delay element 10 (FIG. 7) to adder 98 is provided.

Figure 9:
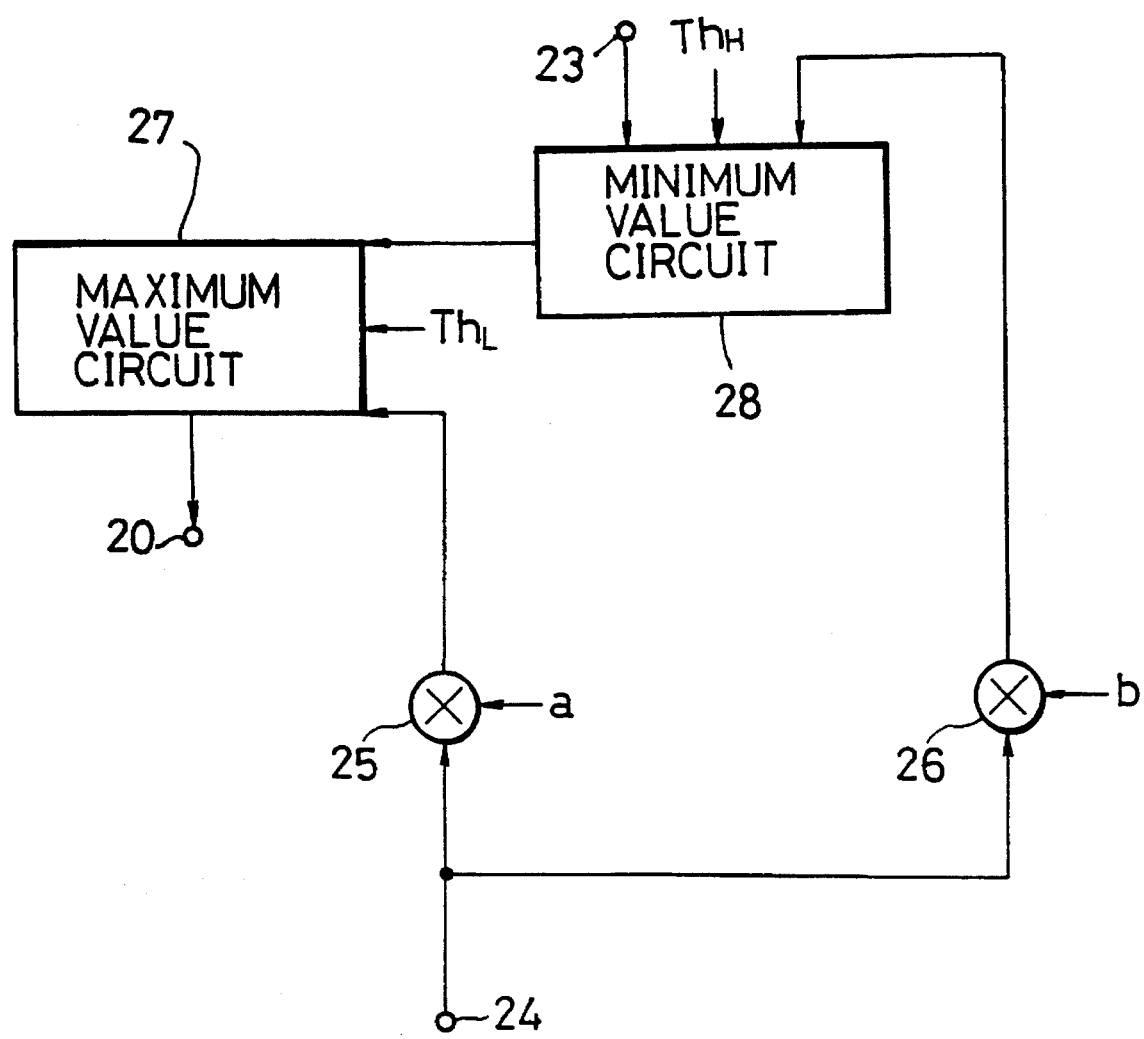
FIG. 9 is a block diagram showing a first example of construction of a limiter.

FIG. 9 shows a first example of construction of limiter 17. Referring to FIG. 9, limiter 17 is composed of a pair of multipliers 25 and 26, 3-input maximum value circuit 27 and 3-input minimum value circuit 28. Output of delay element 10 (FIG. 7), i.e., $\overline{\alpha_{k-1}}$, is transmitted to multipliers 25 and 26 by way of input terminal 24. At multipliers 25 and 26, $\overline{\alpha_{k-1}}$ is multiplied by coefficients $\underline{a}$ and b and is outputted as $a\overline{\alpha_{k-1}}$ and $b\overline{\alpha_{k-1}}$, respectively. $a\overline{\alpha_{k-1}}$ and $b\overline{\alpha_{k-1}}$ are supplied to maximum value circuit 27 and minimum value circuit 28, respectively. Step size $\alpha_k$ is supplied from step size controller 18 (FIG. 7) to minimum value circuit 28 by way of input terminal 23. $Th_H$, which is a threshold value for a maximum value, is supplied to the remaining input terminal of minimum value circuit 28. The three inputs, i.e., $\alpha_k$, $Th_H$ and $b\overline{\alpha_{k-1}}$, are compared with one another, and the minimum input is transmitted as an output of minimum value circuit 28 to maximum value circuit 27. Supplied to the other two input terminals of maximum value circuit 27 are $Th_L$ which is a threshold value for a minimum value and output $a\overline{\alpha_{k-1}}$ of second multiplier 25, and the maximum input of the three inputs is supplied to output terminal 20. In other words, step size $\alpha_k$ supplied to input terminal 23 is limited at the lower limit thereof with $Th_L$ and $a\overline{\alpha_{k-1}}$ and at the upper limit thereof with $Th_H$ and $b\overline{\alpha_{k-1}}$ and is outputted as $\overline{\alpha_k}$ given by the following equation:

$$\overline{\alpha_k} = \begin{cases} \max\{Th_L, a\overline{\alpha_{k-1}}\} & \text{for } \alpha_k \leq \max\{Th_L, a\overline{\alpha_{k-1}}\} \\ \alpha_k & \text{for } \max\{Th_L, a\overline{\alpha_{k-1}}\} < \\ & \alpha_k \leq \min\{Th_H, b\overline{\alpha_{k-1}}\} \\ \min\{Th_H, b\overline{\alpha_{k-1}}\} & \text{for } \min\{Th_H, b\overline{\alpha_{k-1}}\} < \alpha_k \end{cases} \quad (16)$$

Amplitude distributions of $s_k$ and $v_k-u_k$ are generally independent of each other. Accordingly, $$E[|s_k|] \cdot E[|v_k-u_k|]=0 \quad (17)$$

stands. Here, $E[\cdot]$ is the mathematical expectation of $[\cdot]$. By using $\overline{\alpha_k}$ in place of $\alpha_k$, even if $s_k$ makes an obstacle to $v_k-u_k$, an instantaneous influence of $s_k$ upon $v_k-u_k$ can be suppressed by means of limiter 17 to obtain a stabilized step size. While stabilization of the step size is achieved in FIG. 9 by limitation for both a maximum value and a minimum value, even limitation for only one maximum value or one minimum value is effective.

If the maximum value and the minimum value of the step size are limited using a previous value or values of the step size as described above with reference to FIG. 9, then some defect may take place in the case that a characteristic of the unknown system to be identified presents a sudden change so that the error signal is increased suddenly. In this instance, the step size must necessarily be increased suddenly so that the adaptive filter may follow up the change of the characteristic of the unknown system. However, when the value of the Step size is limited by a previous value or values thereof, it can present only a moderate change; accordingly, the speed of following up a sudden change of the system is slow. An example of step size controller 18 which can cope with this defect is shown in FIG. 10.

Figure 10:
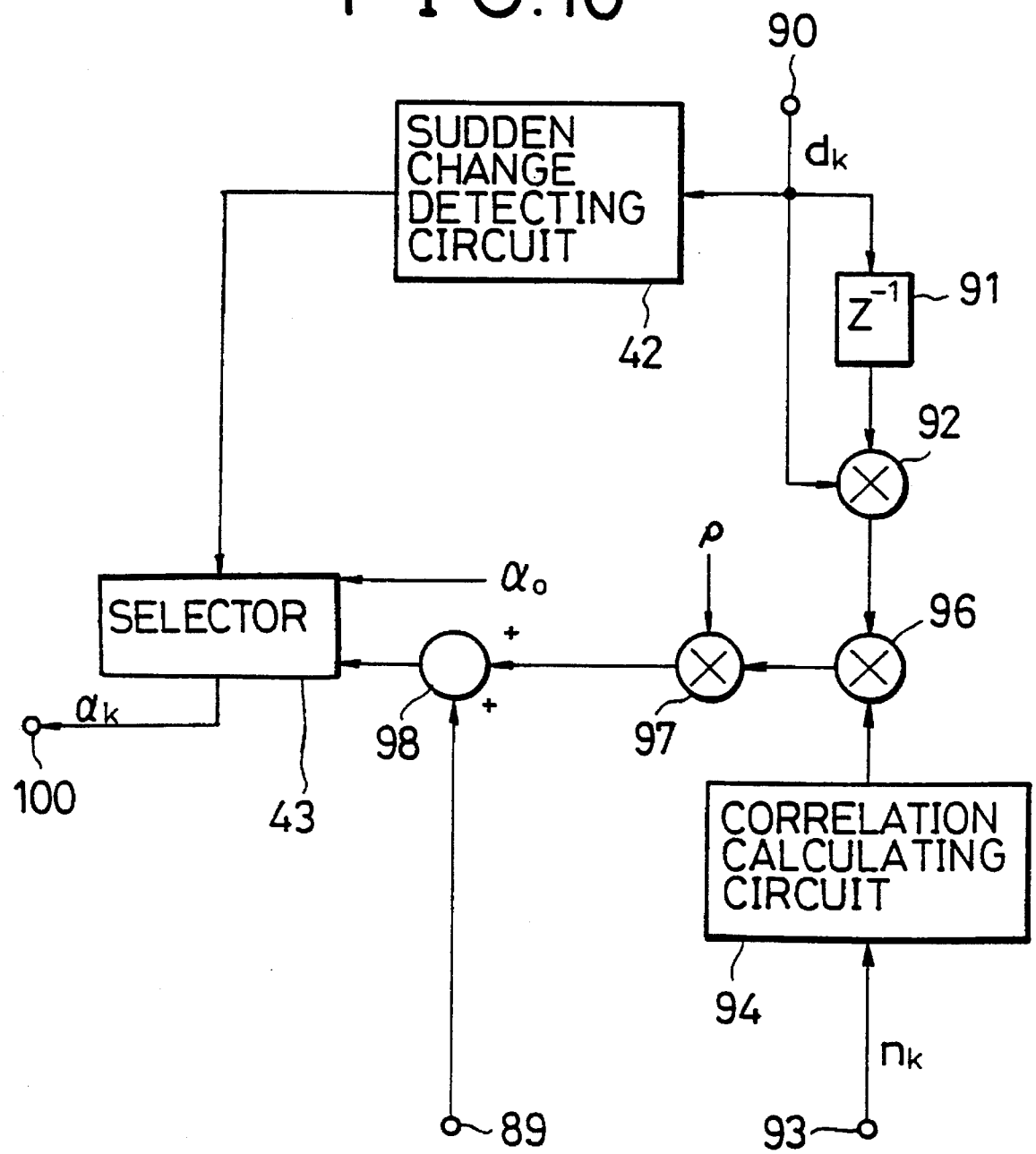
FIG. 10 is a block diagram showing a second example of construction of a step size controller.

Function blocks in FIG. 10 which are denoted by the same reference numerals as those of FIG. 8 have the same functions. Step size controller 18 shown in FIG. 10 is different from that of FIG. 8 in that it includes sudden change detecting circuit 42 for error to which error signal $d_k$ is inputted, and selector 43 is interposed between adder 98 and input terminal 100. An output of adder 98 is inputted to an input terminal of selector 43, and $\alpha_0$ is inputted to the other input terminal of selector 43. Parameter $\alpha_0$ is used for re-setting of the step size. Selector 43 selects $\alpha_0$ or an output of adder 98 in response to a controlling signal from sudden change detecting circuit 42 and transmits the same as an output signal, i.e., as a step size, to output terminal 100. Accordingly, when selector 43 selects a signal from adder 98 and transmits it to output terminal 100, step size controller 18 operates quite similarly to the conventional controller shown in FIG. 8. Thus, the step size is calculated adding a variation to a previous value.

On the other hand, when selector 43 supplies $\alpha_0$ to output terminal 100, the step size is equal to $\alpha_0$ irrespective of a previous value, which corresponds to re-setting of the step size. Sudden change detecting circuit 42 receives as an input thereto an error signal supplied to input terminal 90 and detects a sudden change of the error signal. When a sudden change is detected, sudden change detecting circuit 42 produces "1", but it produces "0" in all other cases. Selector 43 selects $\alpha_0$ when "1" is supplied thereto from sudden change detecting circuit 42, but selects an output signal of adder 98 when "0" is supplied thereto.

Subsequently, an example of construction of sudden change detecting circuit 42 will be described with reference to FIG. 11. The sudden change detecting circuit is provided to detect a sudden change of an error signal inputted to input terminal 50 thereof, and is composed of two multipliers 51 and 56, selector 52, counter 53, 2-input maximum value circuit 54, delay element 55 and comparator 57. The error signal supplied to input terminal 50 is squared by multiplier 51 and transmitted to selector 52 and comparator 57. Constant "0" is supplied to the other input terminal of selector 52. Selector 52 is controlled by an output of counter 53 and transmits either the output of multiplier 51 or "0" to an input terminal of maximum value circuit 54. The output of maximum value circuit 54 is fed back to the other input terminal of maximum value circuit 54 by way of delay element 55. Counter 53 continues its counting up to predetermined integral number $N_c$ and forwards to selector 52, during counting up, a controlling signal in accordance with which selector 52 selects a signal supplied from multiplier 51. After completion of counting up to $N_c$, counter 53 forwards to selector 52 another controlling signal in accordance with which selector 52 selects "0". Since an output of maximum value circuit 54 which was obtained one sample interval prior to the present output is fed back to maximum value circuit 54, the maximum value of values of the first to $N_c$-th samples is detected by and held in the feedback loop. A sample here is the output of multiplier 51 to the second power, i.e., an error signal to the second power. When a sample following the $N_c$-th sample is inputted, selector 52 selects "0" and transmits it to maximum value circuit 54; accordingly, the output of maximum value circuit 54 is a maximum value of the signals supplied from delay element 55, i.e., the maximum value of values of the first to $N_c$-th samples. This signal is transmitted to multiplier 56. At multiplier 56, the maximum value supplied from maximum value circuit 54 is multiplied by constant $e_{th}$, and the result of the multiplication is transmitted to comparator 57. Meanwhile, the squared value of the error signal, which is the output of multiplier 51, is supplied to the other input terminal of comparator 57. Comparator 57 outputs "1" when the squared value of the error signal is higher in magnitude than the output of maximum value circuit 54, but outputs "0" in all other cases, and transmits it to output terminal 58. Selector 43 (FIG. 10) is controlled by the signal supplied to output terminal 58, and $\alpha_0$ or $\alpha_k$ is outputted as the step size from selector 43. If the error signal is represented by $e_k$, inputs to comparator 57 are given by $e_k^2$ and $e_{th} \cdot \max\{e_k^2 | 1 \leq k \leq N_c\}$. Accordingly, step size $\alpha_k$ supplied to output terminal 100 in FIG. 10 is represented in the following equation:

$$\alpha_k = \begin{cases} \alpha_0 & \text{for } e_k^2 > e_{th} \cdot \max\{e_k^2 | 1 \leq k \leq N_c\} \\ \alpha_{k-1} + \rho d_k d_{k-1} n_{k-1}^T n_k & \text{for } e_k^2 \leq e_{th} \cdot \max\{e_k^2 | 1 \leq k \leq N_c\} \end{cases} \quad (18)$$

Step size $\alpha_k$ obtained from equation (18) is transmitted as an output of step size controller 18 to limiter 17.

In the sudden change detecting circuit for error, it is possible to utilize an absolute value of an error signal in place of the squared value of an error signal. FIG. 12 shows an example of an error fluctuation detecting circuit which utilizes the absolute value of an error signal. The sudden change detecting circuit differs from the one shown in FIG. 11 only in that absolute value calculating circuit 59 is provided in place of multiplier 51 connected to input terminal 50. Absolute value calculating circuit 59 calculates the absolute value of an error signal inputted to input terminal 50 and transmits it to selector 52 and comparator 57. Accordingly, when the sudden change detecting circuit shown in FIG. 12 is employed, step size $\alpha_k$ supplied to output terminal 100 shown in FIG. 10 is represented in the following equation:

$$\alpha_k = \begin{cases} \alpha_0 & \text{for} |e_k| > e_{th} \cdot \max\{|e_k| | 1 \leq k \leq N_c\} \\ \alpha_{k-1} + \rho d_k d_{k-1} n_{k-1}^T n_k & \text{for} |e_k| \leq e_{th} \cdot \max\{|e_k| | 1 \leq k \leq N_c\} \end{cases} \quad (19)$$

Step size $\alpha_k$ obtained from equation (19) is transmitted as an output of step size controller 18 to limiter 17.

Figure 13:
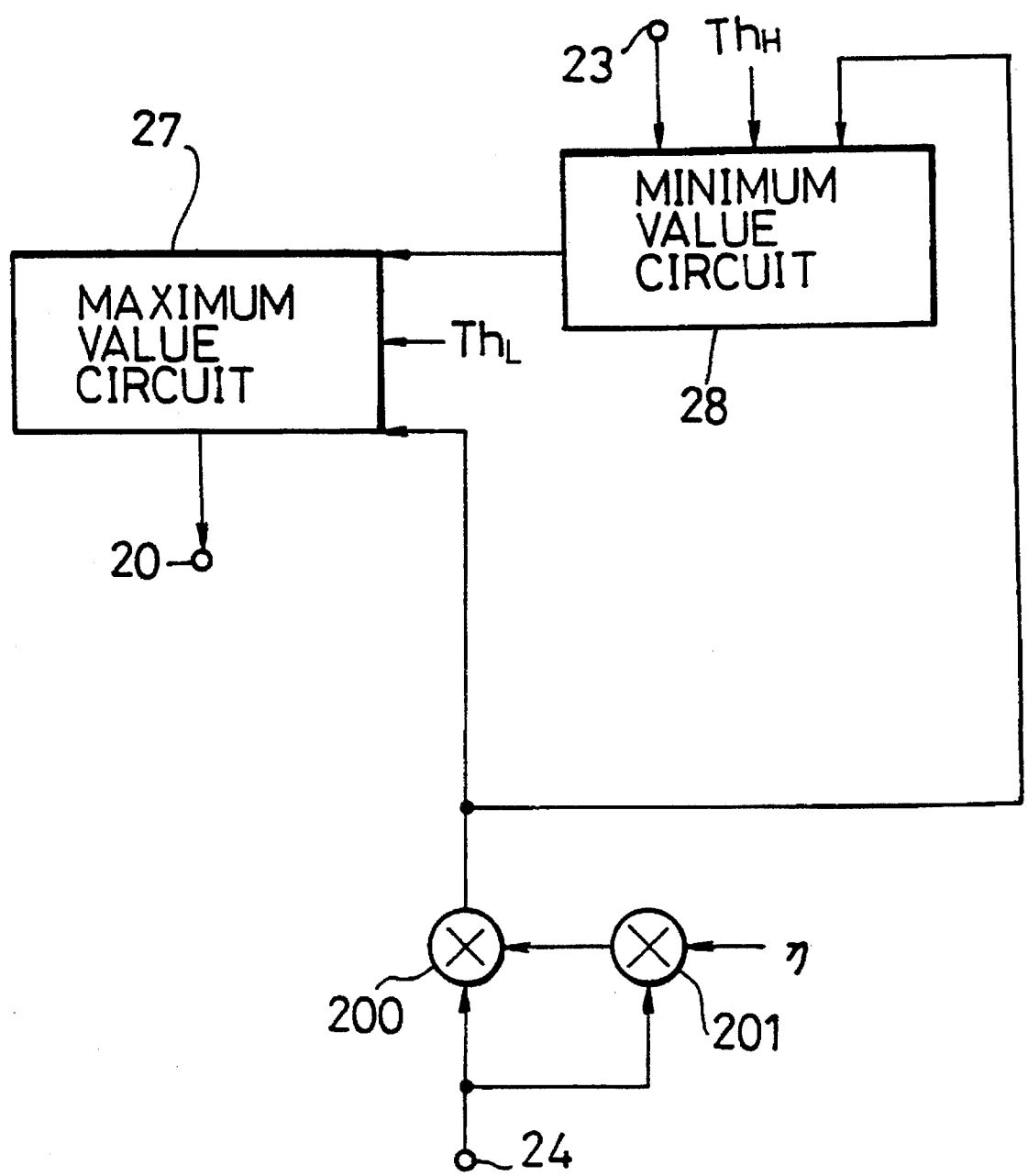
FIG. 13 is a block diagram showing a second example of construction of a limiter.

While the first preferred embodiment of the present invention is described so far, various forms of limiters can be used for limiter 17 in the present embodiment. FIG. 13 is a block diagram showing a second example of construction of limiter 17.

Referring to FIG. 13, the limiter shown includes 3-input maximum value circuit 27, 3-input minimum value circuit 28 and a pair of multipliers 200 and 201. It is to be noted that function blocks in FIG. 13 which are denoted by the same reference numerals to those of FIG. 9 have the same functions.

The output of delay element 10 (FIG. 7), i.e., $\overline{\alpha_{k-1}}$, is transmitted to multipliers 200 and 201 by way of input terminal 24. $\overline{\alpha_{k-1}}$ is multiplied by positive constant $\eta$ at multiplier 201 and is then multiplied further by $\overline{\alpha_{k-1}}$ by the other multiplier 200, so that it is supplied as $\eta\overline{\alpha_{k-1}}^2$ to maximum value circuit 27 and minimum value circuit 28. Step size $\alpha_k$ is supplied from step size controller 18 (FIG. 7) to minimum value circuit 28 by way of input terminal 33. The threshold value for the maximum value, i.e., $Th_H$, is supplied to the remaining input terminal of minimum value circuit 28. The three inputs, i.e., $\alpha_k$, $Th_H$ and $\eta\overline{\alpha_{k-1}}^2$, are compared with one another, and the minimum of the three inputs is transmitted as the output of minimum value circuit 28 to maximum value circuit 27. $\eta\overline{\alpha_{k-1}}^2$ and $Th_L$, which is the threshold value for the minimum value, are supplied to the other two input terminals of maximum value circuit 27. The maximum of the three inputs is outputted as the maximum value from maximum value circuit 27 and is supplied to output terminal 20. In other words, step size $\alpha_k$ supplied to input terminal 23 is limited for the minimum value thereof by threshold value $Th_L$ and $\eta\overline{\alpha_{k-1}}^2$ and for the maximum value thereof by threshold value $Th_H$ and $\eta\overline{\alpha_{k-1}}^2$, so that it is outputted as $\overline{\alpha_k}$ given by the following equation:

$$\overline{\alpha_k} = \begin{cases} \max\{Th_L, \eta\overline{\alpha_{k-1}}^2\} & \text{for } \alpha_k \leq \max\{Th_L, \eta\overline{\alpha_{k-1}}^2\} \\ \alpha_k & \text{for } \max\{Th_L, \eta\overline{\alpha_{k-1}}^2\} < \\ & \alpha_k \leq \min\{Th_H, \eta\overline{\alpha_{k-1}}^2\} \\ \min\{Th_H, \eta\overline{\alpha_{k-1}}^2\} & \text{for } \min\{Th_H, \eta\overline{\alpha_{k-1}}^2\} < \alpha_k \end{cases} \quad (20)$$

Amplitude distributions of $s_k$ and $v_k-u_k$ are generally independent of each other. Accordingly, $$E[|s_k|]\cdot E[|v_k-u_k|]=0 \quad (21)$$

stands. By using $\overline{\alpha_k}$ in place of $\alpha_k$, even if $s_k$ makes an obstacle to $v_k-u_k$, an instantaneous influence of $s_k$ upon $v_k-u_k$ can be suppressed by means of limiter 17 to obtain a stabilized step size.

Figure 14:
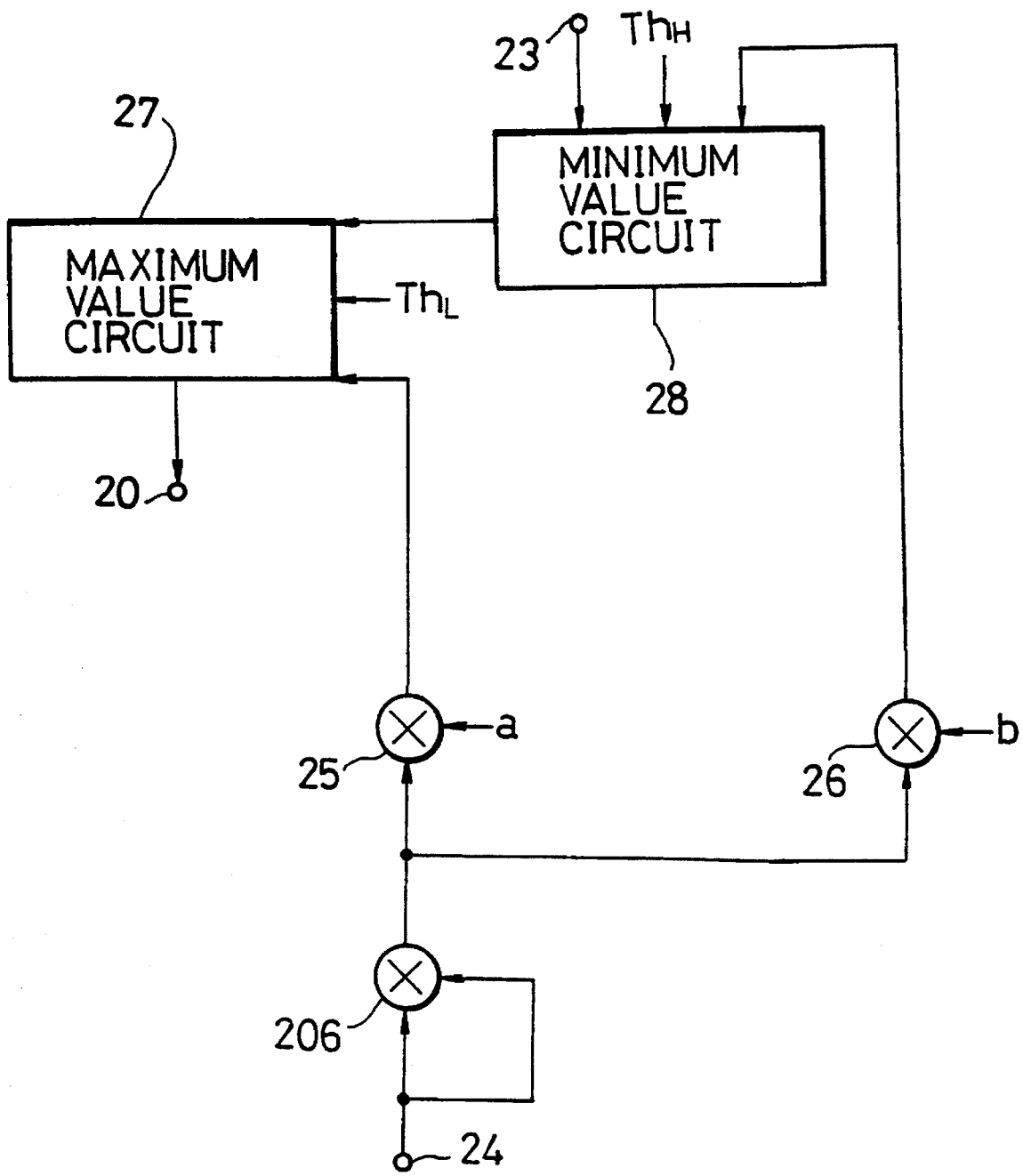
FIG. 14 is a block diagram showing a third example of construction of a limiter.

Subsequently, a third example of construction of limiter 17 will be described with reference to FIG. 14. The limiter is generally constructed such that third multiplier 202 for squaring $\overline{\alpha_{k-1}}$ inputted to input terminal 24 is additionally provided to the construction of the limiter shown in FIG. 9 (first example of construction.) The output of delay element 10 (FIG. 7), i.e., $\overline{\alpha_{k-1}}$, is transmitted to multiplier 202 by way of input terminal 24. $\overline{\alpha_{k-1}}$ is squared by multiplier 202 and is then multiplied by positive constants a and b at first and second multipliers 25 and 26, respectively. Outputs $a\overline{\alpha_{k-1}}^2$ and $b\overline{\alpha_{k-1}}^2$ thus obtained are supplied to maximum value circuit 27 and minimum value circuit 28, respectively. Thereafter, the limiter operates in a similar manner as in the first example of construction shown in FIG. 9. In particular, step size $\alpha_k$ supplied to input terminal 23 is limited for the minimum value thereof by threshold value $Th_L$ and $a\overline{\alpha_{k-1}}^2$ and for the maximum value thereof by threshold value $Th_H$ and $b\overline{\alpha_{k-1}}^2$, so that it is outputted as $\overline{\alpha_k}$ given by the following expression from output terminal 20:

$$\overline{\alpha_k} = \begin{cases} \max\{Th_L, \eta\overline{\alpha_{k-1}}^2\} & \text{for } \alpha_k \leq \max\{Th_L, \eta\overline{\alpha_{k-1}}^2\} \\ \alpha_k & \text{for } \max\{Th_L, \eta\overline{\alpha_{k-1}}^2\} < \\ & \alpha_k \leq \min\{Th_H, \theta\overline{\alpha_{k-1}}^2\} \\ \min\{Th_H, \theta\overline{\alpha_{k-1}}^2\} & \text{for } \min\{Th_H, \theta\overline{\alpha_{k-1}}^2\} < \alpha_k \end{cases} \quad (22)$$

While stabilization of the step size is achieved in the third example of construction by limitation of both the maximum value and the minimum value, even limitation of only one of the maximum value and the minimum value is effective.

Also in the second and third examples of construction of the limiter described above with reference to FIGS. 13 and 14, the maximum value and the minimum value of the step size are limited using a previous value of the step size, and some defect many take place in the case that a characteristic of the unknown system to be identified presents a sudden change so that the error signal is increased suddenly. In this instance, the step size must necessarily be increased suddenly so that the adaptive filter may follow up the change of the characteristic of the unknown system. However, when the value of the step size is limited by a previous value thereof, it can present only a moderate change; accordingly, the speed of following up a sudden change of the system is slow. Therefore, it is very effective to employ a step size controller which includes sudden change detecting circuit 42 described above with reference to FIG. 10.

The first preferred embodiment of the present invention has been described so far. In the embodiment, when a step size which is used for the updating of coefficients is calculated using a gradient of power of an error signal, a limit which relies upon the earlier step size is provided for a variation of the step size obtained so that the step size may be prevented from being made excessively different from the correct value due to noise obstruction or other factors. Further, the power of the identification error signal is monitored so that, when it is detected that a characteristic of the unknown system of an object for identification has presented a sudden change, the step size is reset in order to achieve both quick convergence and low identification error.

Figure 15:
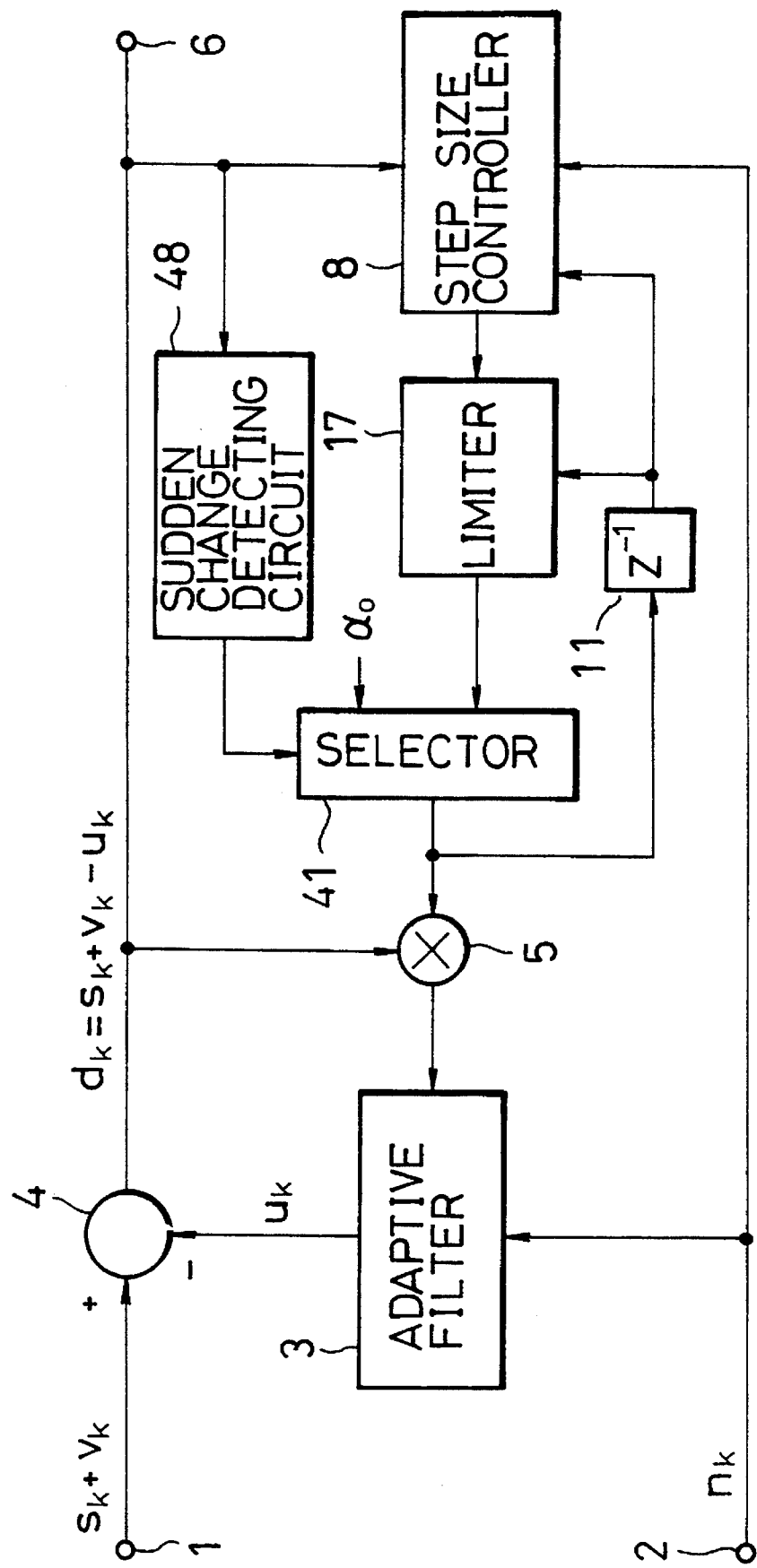
FIG. 15 is a block diagram showing construction of an apparatus for identifying an unknown system using an adaptive filter according to a second preferred embodiment of the present invention.

Subsequently, a second preferred embodiment of the present invention will be described. FIG. 15 is a block diagram showing construction of an apparatus for identifying an unknown system using an adaptive filter in the present embodiment.

The present apparatus is different from the apparatus of the first embodiment described above in the manner of re-setting the step size. In particular, while the step size is first re-set and then limitation of the step size is performed by means of a limiter in the first embodiment, in the present embodiment, re-setting is performed for the step size limited by means of a limiter.

The present apparatus is generally constructed such that sudden change detecting circuit 48 for error and selector 41 are added to the apparatus of the first embodiment shown in FIG. 7. Sudden change detecting circuit 48 is provided independently of step size controller 18, and receives an error signal as an input thereto and outputs "1" when the error signal presents a sudden change, but outputs "0" when the error signal presents no significant change. Sudden change detecting circuit 42 in the first embodiment described hereinabove with reference to FIG. 11 or 12 can be employed as is as sudden change detecting circuit 48.

Selector 41 is provided on the output side of limiter 17 and receives an output of limiter 17 and step size $\alpha_0$ for re-setting. An output of selector 41 is supplied to multiplier 5 and delay element 11. An output of delay element 11 is fed back to limiter 17 and step size controller 18 similarly to delay element 10 (FIG. 7) in the first embodiment. Selector 41 selectively outputs $\alpha_0$ when "1" is supplied thereto as a controlling signal from sudden change detecting circuit 48, but outputs $\overline{\alpha_k}$ which is an output of limiter 17 when "0" is supplied thereto.

Further, any of the limiters described above in connection with the first embodiment (FIGS. 9, 13 and 14) can be used as limiter 17. A step size controller which does not include a sudden change detecting circuit therein, such as, for example, one described hereinabove with reference to FIG. 8 can be employed as step size controller 18. Accordingly, in the present apparatus, when a sudden change is detected from an error signal by sudden change detecting circuit 48, re-set step size $\alpha_0$ is transmitted to multiplier 5 by means of selector 41.

The second embodiment of the present invention has been described so far. In the present embodiment, when a step size which is used for the updating of coefficients is calculated using a gradient of power of an error signal, a limit which relies upon the squared value of a step size in advance is provided for a variation of the step size obtained so that the step size may be prevented from being made excessively different from the correct value due to noise obstruction or other factors. Further, the power of the identification error signal is monitored so that, when it is detected that a characteristic of the unknown system of an object for identification has presented a sudden change, the step size is reset in order to achieve both quick convergence and low identification error.

Figure 16:
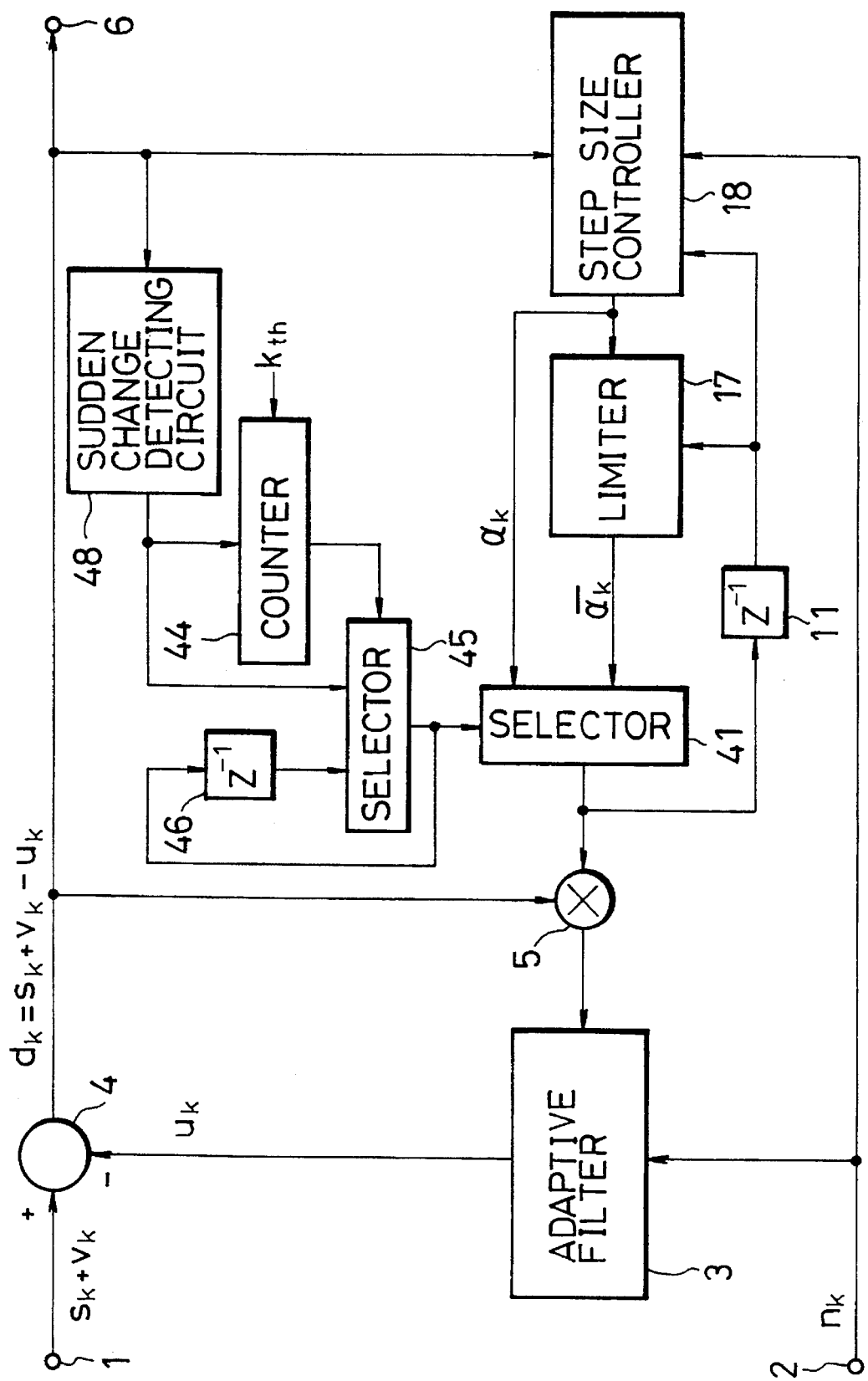
FIG. 16 is a block diagram showing construction of an apparatus for identifying an unknown system using an adaptive filter according to a third preferred embodiment of the present invention.

Subsequently, a third preferred embodiment of the present invention will be described. FIG. 16 shows construction of an apparatus for identifying an unknown system using an adaptive filter in the present embodiment. The present apparatus is generally constructed such that counter 44, selector 45 and delay element 46 are further added to the apparatus of the second embodiment shown in FIG. 15. Selector 41 is provided on the output side of limiter 17, and output $\alpha_k$ of step size controller 8 is directly inputted to selector 41 in place of step size $\alpha_0$ for re-setting. Function blocks in FIG. 16 which are denoted by the same reference numerals to those of FIG. 15 have the same functions.

Output of sudden change detecting circuit 48 for error is connected to counter 44 and an input terminal of selector 45 newly added. An output of selector 45 is fed back to the other input terminal of selector 45 by way of delay element 46. Counter 44 starts counting after the output of sudden change detecting circuit 48 changes from "0" to "1", and controls selector 45 such that selector 45 selectively outputs the output of sudden change detecting circuit 48 when the count value of counter 44 is equal to 1, but selectively outputs a signal supplied from delay element 46 while the count value of counter 44 counts from "2" to a threshold value $k_{th}$ supplied from the outside. Accordingly, selector 45 continues to output "1" for a period of time of $k_{th}$ clocks at counter 44 after the output of sudden change detecting circuit 48 changes from "0" to "1". The output of selector 45 controls selector 41. Selector 41 selectively outputs a signal from limiter 17 when "0" is supplied thereto as a controlling signal, but selectively outputs a signal from step size controller 18 when "1" is supplied thereto as the controlling signal. Accordingly, step size $\alpha_k$, which does not undergo any limitation, is supplied to multiplier 5 for a period of time of $k_{th}$ clocks after a sudden change is detected from the error signal, but limited step size $\overline{\alpha_k}$ obtained from limiter 17 is supplied to multiplier 5 in all other cases.

The limiter described above with reference to FIG. 14 can be used as is as limiter 17. The sudden change detecting circuit for error described hereinabove with reference to FIG. 11 can be used as it is as sudden change detecting circuit 48.

The third embodiment of the present invention has been described so far. In the present embodiment, when a step size which is used for the updating of coefficients is calculated using a gradient of power of an error signal, a limit which relies upon a step size in advance is provided for a variation of the step size obtained so that the step size may be prevented from being made excessively different from a correct value due to noise obstruction or other factors. Further, the power of an identification error signal is monitored so that, when it is detected that a characteristic of the unknown system of an object for identification has presented a sudden change, the limitation to the step size is cancelled for a fixed period of time in order to achieve both quick convergence and low identification error.

Figure 17:
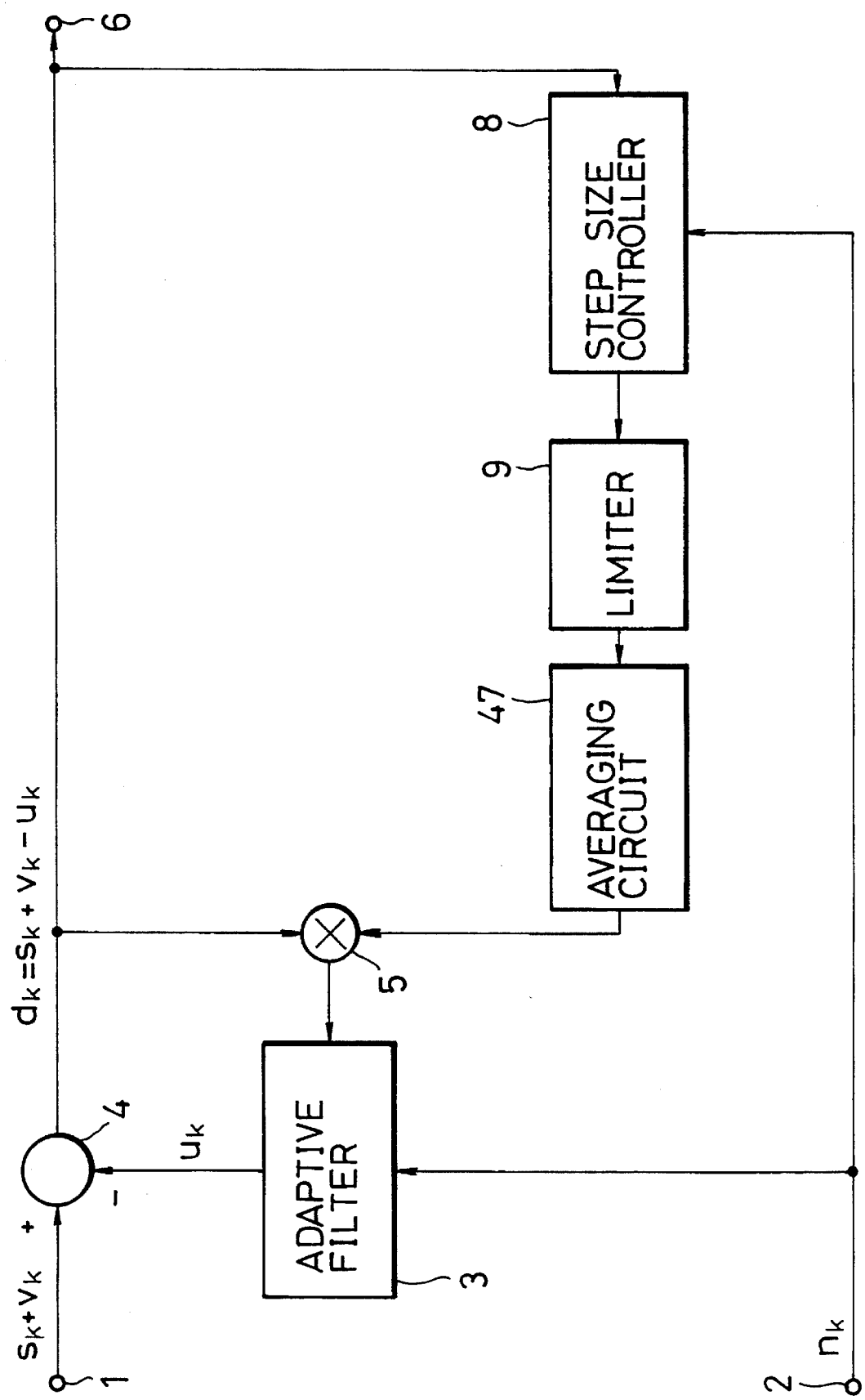
FIG. 17 is a block diagram showing construction of an apparatus for identifying an unknown system using an adaptive filter according to a fourth preferred embodiment of the present invention.

Next, a fourth preferred embodiment of the present invention will be described. FIG. 17 is a block diagram showing construction of an apparatus for identifying an unknown system using an adaptive filter in the present embodiment. Function blocks in FIG. 17 which are denoted by the same reference numerals to those of FIG. 2 have the same functions. The present apparatus is different from the conventional apparatus shown in FIG. 2 in that averaging circuit 47 is interposed between limiter 9 and multiplier 5. Accordingly, a step size obtained from limiter 9 is supplied to multiplier 5 after it is averaged by averaging circuit 47.

The step size obtained from limiter 9 is obstructed by noise $s_k$ since noise $s_k$ is included in output $s_k+v_k-u_k$ of subtracter 4, and is varied from the original step size by an amount which relies on noise amplitude. Noise amplitude $s_k$ is a stochastic process, and the amplitude distribution thereof has no correlation with the amplitude distribution of error signal $v_k-u_k$. In other words, since the equation $$E[s_k(v_k-u_k)]=0 \qquad (23)$$

stands and since $$E[s_k]=0 \qquad (24)$$

also stands, averaging of the output of limiter 9 will average a variation of the step size caused by the influence of noise. The original step size can be obtained approximately at an output of averaging circuit 47, and the bad influence of step size variation caused by noise can be suppressed.

Figure 18:
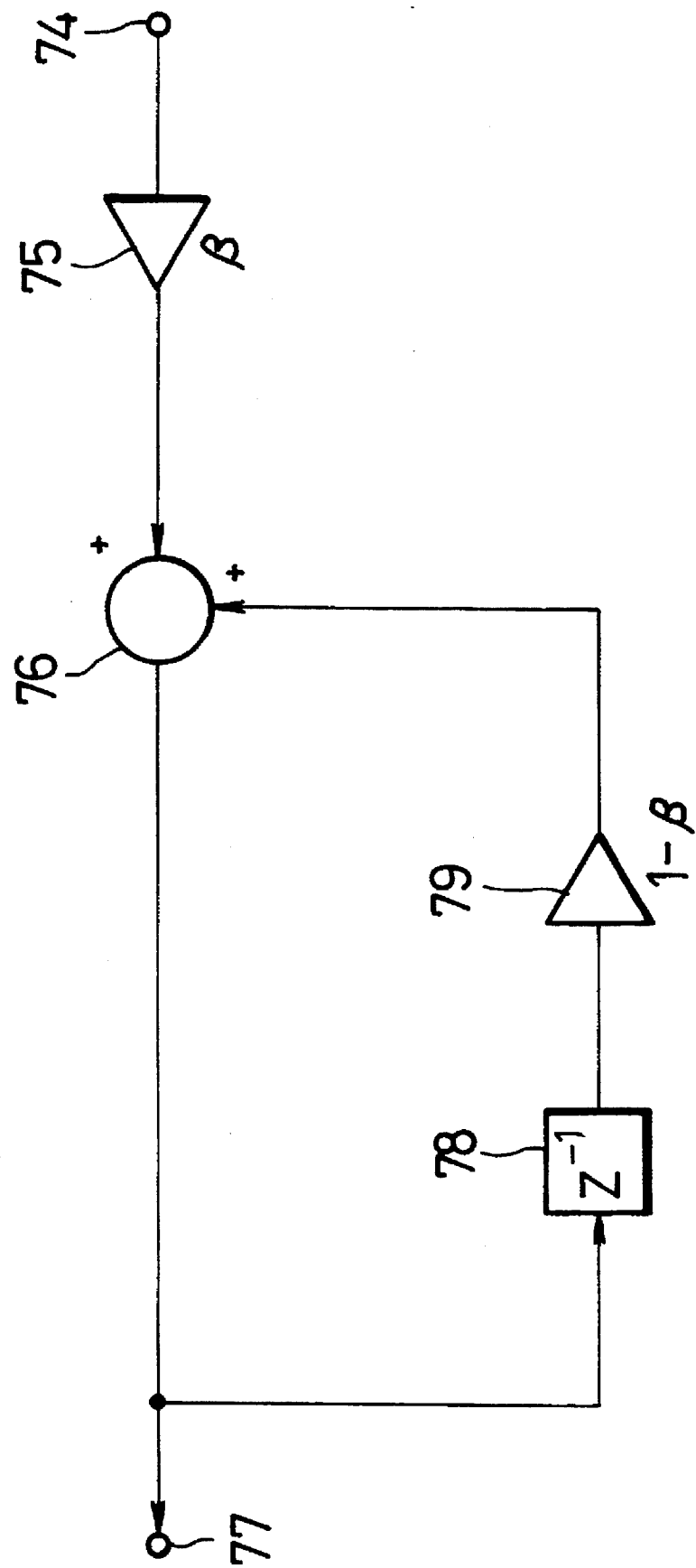
FIG. 18 is a block diagram showing an example of construction of an averaging circuit in the apparatus shown in FIG. 17.

FIG. 18 shows an example of construction of averaging circuit 47. The averaging circuit is composed of two coefficient multipliers 75 and 79, adder 76 and delay element 78. Step size $\alpha_k$ is supplied from limiter 9 to input terminal 74. Step size $\alpha_k$ is multiplied by $\beta$ into $\beta\alpha_k$ by coefficient multiplier 75 and transmitted to adder 76. An output of coefficient multiplier 75 and an output of the other coefficient multiplier 79 are added at adder 76 to obtain averaged step size $\overline{\alpha_k}$, which is transmitted to output terminal 77. Meanwhile, the output of adder 76 is fed back to adder 76 by way of delay element 78 and the other coefficient multiplier 79. Output $\overline{\alpha_{k-1}}$ of delay element 78 is multiplied by $(1-\beta)$ at multiplier 79 into $(1-\beta)\overline{\alpha_{k-1}}$, which makes a feedback signal to adder 76. Accordingly, output signal $\overline{\alpha_k}$ of averaging circuit 47 is given, using input signal $\alpha_k$, by $$\overline{\alpha_k}=\beta\alpha_k+(1-\beta)\overline{\alpha_{k-1}} \qquad (25)$$

The convergence characteristic and the final error of the present apparatus rely upon parameter $\beta$. When $\beta$ is great, the convergence is slow, but the final error is small. When β is small, the convergence is fast, but the final error is great. In order to solve the problem, parameter β may be made variable using the output of limiter 9.

The fourth embodiment of the present invention has been described so far. In the present embodiment, when a step size which is used for the updating of coefficients is calculated using a gradient of power of an error signal, the step size obtained is averaged so that it may be prevented from being made excessively different from the correct value due to noise obstruction or other factors.

Subsequently, a fifth preferred embodiment of the present invention will be described. The present apparatus is different from the apparatus of the fourth embodiment described above in that parameter β which is provided to an averaging circuit is varied in response to an averaged step size which is an output of the averaging circuit and in that an sudden change detecting circuit for error is provided to detect a sudden change or fluctuation of the unknown system to change over the step size to $β_0$.

Figure 19:
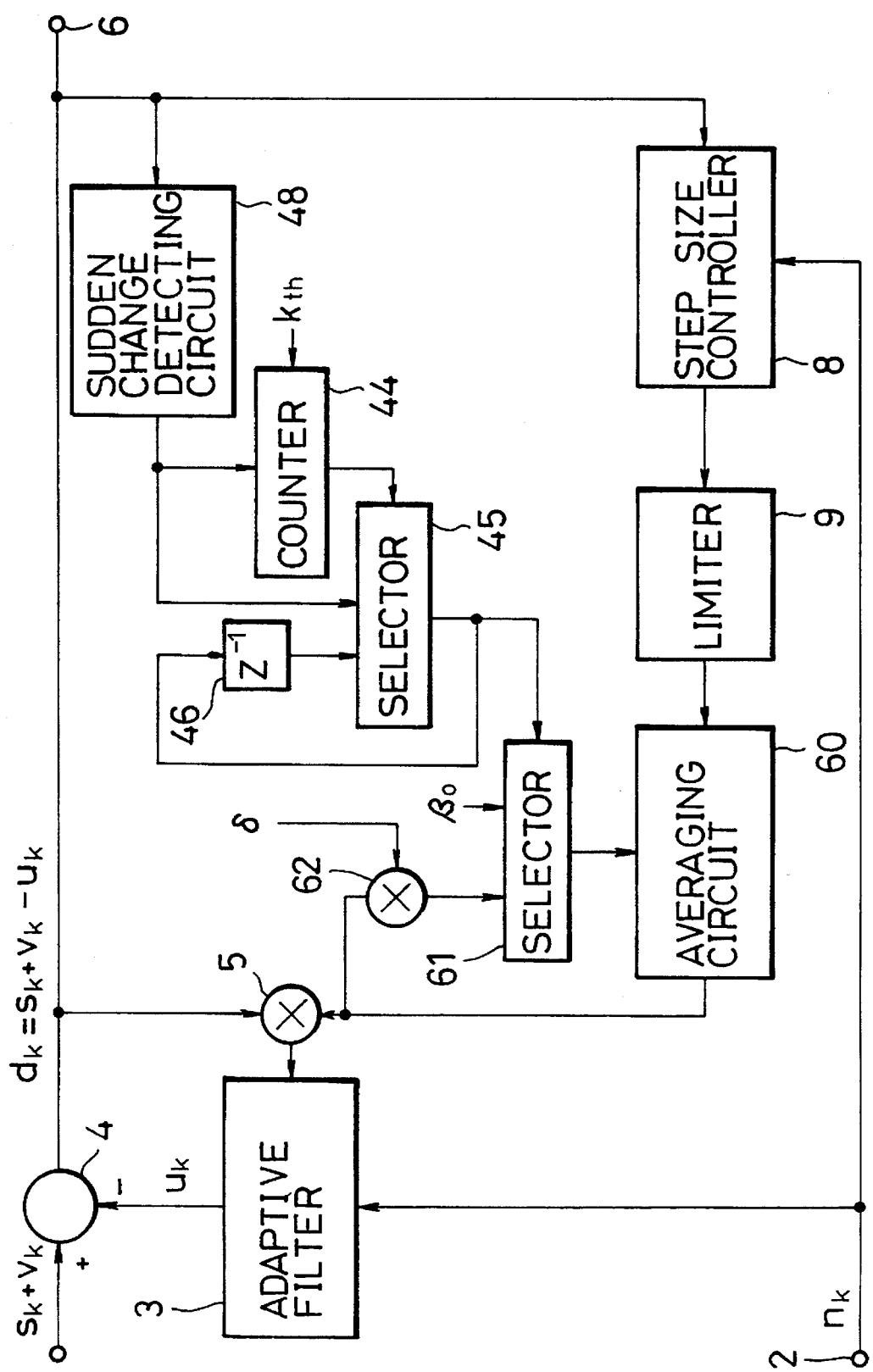
FIG. 19 is a block diagram showing construction of an apparatus for identifying an unknown system using an adaptive filter according to a fifth preferred embodiment of the present invention.

FIG. 19 shows construction of an apparatus for identifying an unknown system using an adaptive filter in the present embodiment. The present apparatus is different from the apparatus shown in FIG. 17 in that it additionally includes sudden change detecting circuit 48, counter 44, two selectors 45 and 61 and multiplier 62. Further, averaging circuit 60 is connected to receive variable parameter β. Function blocks in FIG. 19 which are denoted by the same reference numerals as those of FIG. 16 or 17 have the same functions.

Output of averaging circuit 60 is transmitted to multiplier 5 and newly added multiplier 62. Latter multiplier 62 multiplies an output signal of averaging circuit 60 by positive constant δ and transmits the product to selector 61. Another positive constant $β_0$ is supplied to the other input terminal of selector 61. Selector 61 thus selectively outputs the output of multiplier 62 or $β_0$ as a parameter to averaging circuit 60 in response to a controlling signal from other selector 45. When the output of multiplier 62 is supplied to averaging circuit 60, the value obtained by multiplication of the averaged step size by positive constant δ is fed back to averaging circuit 60.

Figure 20:
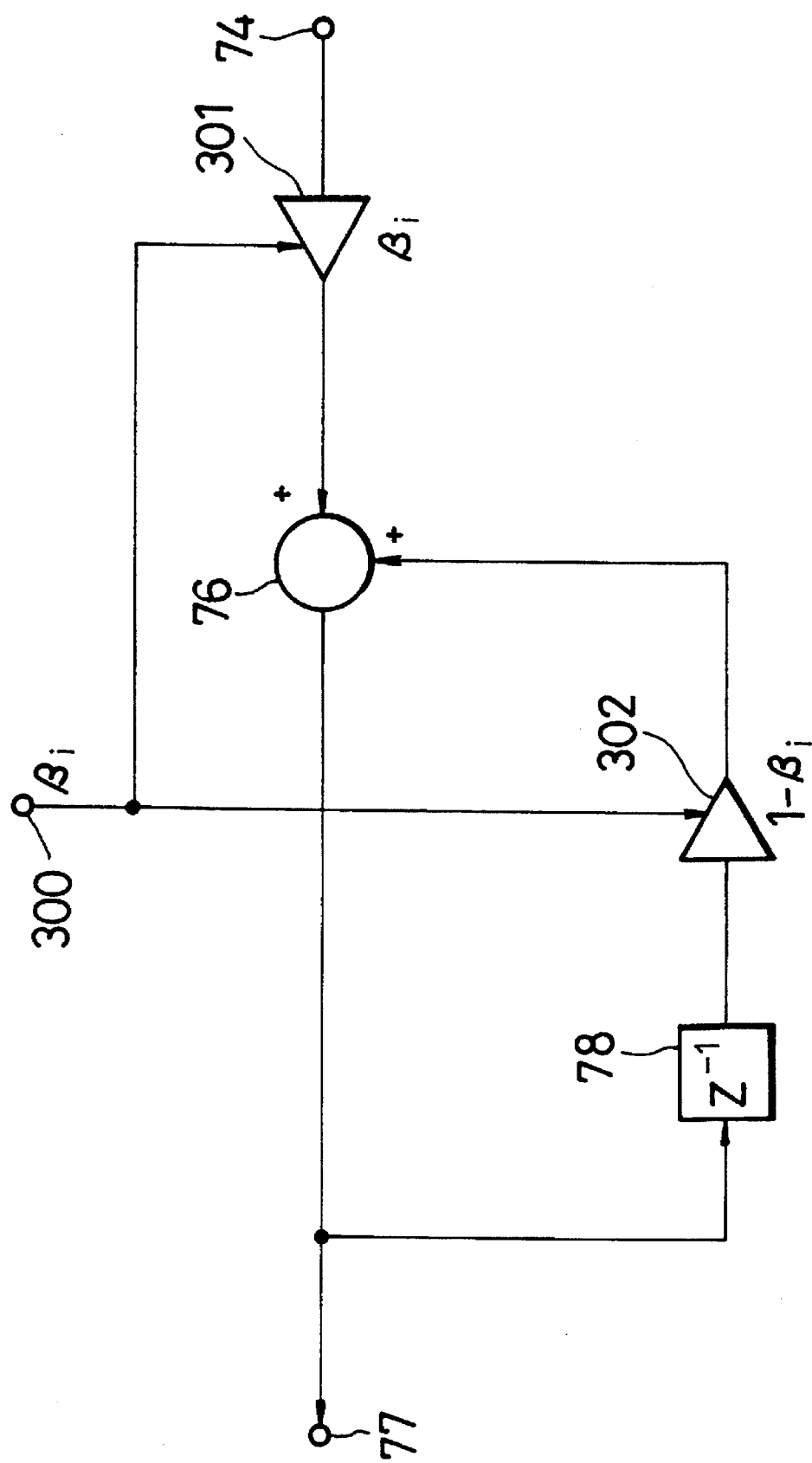
FIG. 20 is a block diagram showing construction of an averaging circuit in the apparatus shown in FIG. 19.

FIG. 20 shows an example of the detailed construction of averaging circuit 60. Averaging circuit 60 is a modification of averaging circuit 47 shown in FIG. 18 in that multipliers 301 and 302 replace coefficient multipliers 75 and 79, respectively, for determining a time constant for averaging. Common parameter $β_i$ is supplied to multipliers 301 and 302 by way of parameter input terminal 300. Multiplier 301 multiplies a signal from input terminal 74 by $β_i$ and transmits the product to adder 76. Multiplier 302 multiplies the output of delay element 78 by $(1-β_i)$ and transmits the product to adder 76.

If the step size is averaged using a circuit having a time constant which varies in response to a step size in advance, then some defect takes place in such a case wherein a characteristic of an unknown system to be identified presents a sudden change so that an error signal is suddenly increased. In this instance, step size must necessarily be increased suddenly so that the adaptive filter may follow up the change of the characteristic of the unknown system. However, when the value of step size is averaged with a great time constant, it can present only a moderate change; accordingly, the speed of following up sudden changes of the system is slow. In the present embodiment, sudden change detecting circuit 48 is provided so that, when a sudden change of an error signal is detected, the time constant for averaging is decreased.

The sudden change detecting circuit for error described hereinabove with reference to FIG. 11 can be used as sudden change detecting circuit 48. Referring back to FIG. 19, an output of sudden change detecting circuit 48 is supplied to counter 44 and selector 45. A feedback signal from delay element 46 is also supplied to selector 45. Counter 44 starts its counting up after the output of sudden change detecting circuit 48 changes from "0" to "1", and controls selector 45 such that selector 45 selectively outputs an output of sudden change detecting circuit 48 when the count value of counter 44 is equal to 1, but selectively outputs a signal supplied from delay element 46 while the count value of counter 44 counts from 2 to threshold value $k_{th}$ supplied from the outside. Accordingly, selector 45 continues to output "1" for a period of time of $k_{th}$ clocks after the output of sudden change detecting circuit 48 changes from "0" to "1". The output of selector 45 controls selector 61. Selector 61 selectively outputs a signal from multiplier 62 when "0" is supplied thereto as a controlling signal, but selectively outputs positive constant $β_0$ when "1" is supplied thereto as the controlling signal. Accordingly, Be is supplied as a parameter to averaging circuit 60 for a period of time of $k_{th}$ clocks after a sudden change is detected from an error signal; consequently, the time constant for step size averaging at averaging circuit 60 is decreased. On the other hand, at any time other than for a period of time of $k_{th}$ clocks after a sudden change is detected from an error signal, the step size averaged by averaging circuit 60 and multiplied by δ is supplied as a parameter to averaging circuit 60. In this instance, the time constant of averaging circuit 60 increases as step size decreases. Accordingly, the time constant is maximum in the converged condition.

The fifth embodiment of the present invention has been described so far. In the present embodiment, when the step size which is used for the updating of coefficients is calculated using a gradient of power of an error signal, the step size obtained is averaged so that the step size may be prevented from being made excessively different from a correct value due to noise obstruction or other factors. Further, power of the identification error signal is monitored, and when it is detected that a characteristic of the unknown system for an object of identification has changed suddenly, the time constant for averaging is held decreased for a fixed period of time, thereby achieving both quick convergence and low identification error.

In the first to fifth embodiments described above, adaptive filter 3 is controlled using parameter $α_k$ ($\overline{α_k}$), which is a variable value of step size α, based on the LMS algorithm. As is apparent from equations (4) and (7) given above, the difference between the LMS algorithm and the LIM algorithm resides in whether α or μ which is obtained by division of α by an average power $σ_n^2$ inputted to the filter is used as the step size. Accordingly, the methods of varying the step size described so far can be applied as is to the LIM algorithm.

Figure 21:
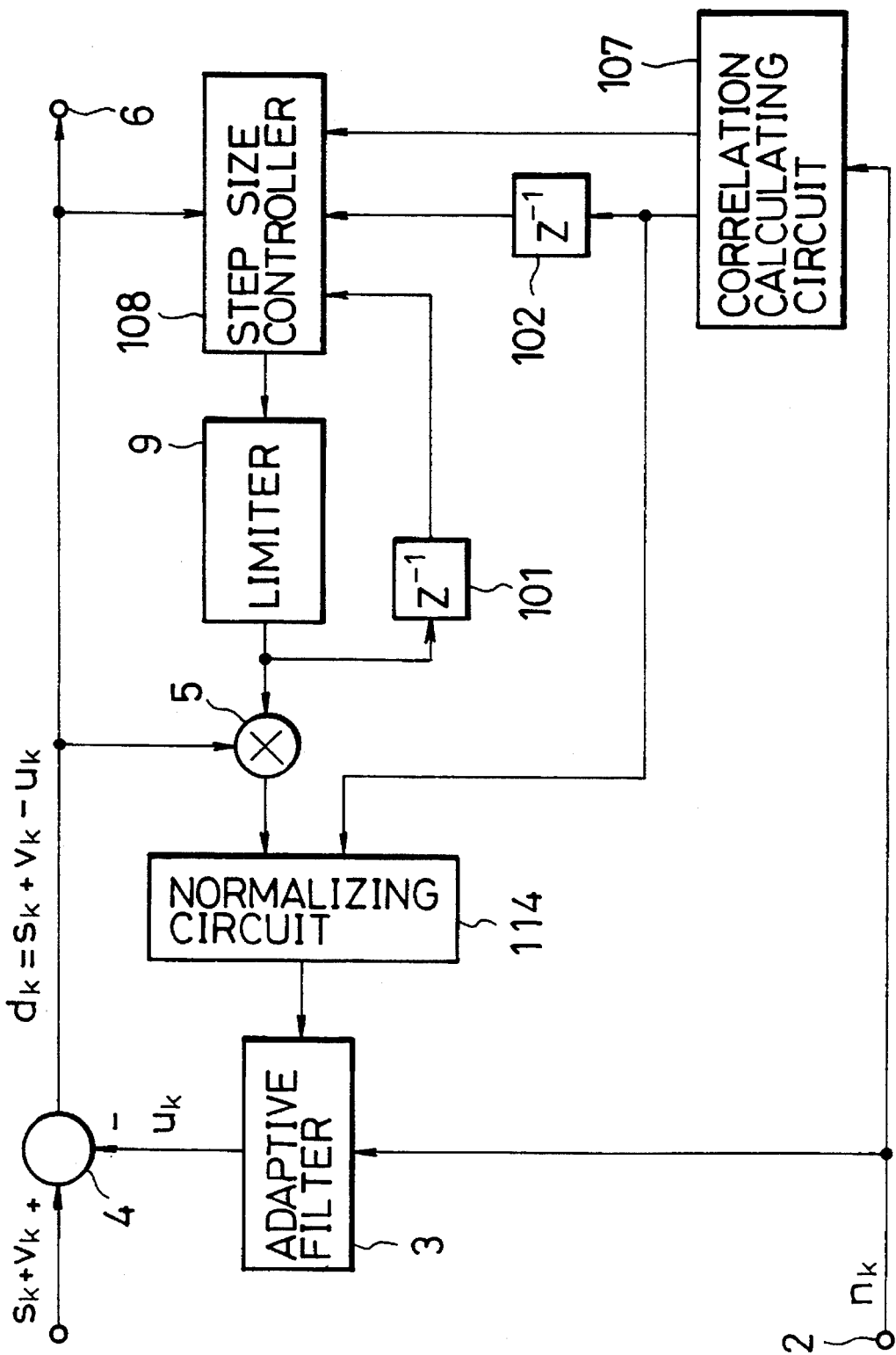
FIG. 21 is a block diagram showing construction of an apparatus for identifying an unknown system using an adaptive filter according to a sixth preferred embodiment of the present invention.

Next, a sixth preferred embodiment of the present invention will be described. FIG. 21 is a block diagram showing construction of an apparatus for identifying an unknown system using an adaptive filter according to the present embodiment. Function blocks in FIG. 21 which are denoted by the same reference numerals as those of FIG. 2 have the same functions. The significant difference of the present apparatus from the apparatus shown in FIG. 2 resides in that an output of limiter 17 is fed back to step size controller 108 by way of delay element 101 and normalizing circuit 114 is interposed between multiplier 5 and adaptive filter 3. Further, construction of step size controller 108 is different from that of step size controller 8 shown in FIG. 2 and correlation calculating circuit 107 is externally provided for step size controller 108. Correlation calculating circuit 107 has a pair of outputs, one of which is connected directly to step size controller 108. The other output of correlation calculating circuit 107 is connected to normalizing circuit 114 and also to step size controller 108 by way of delay element 102. Normalizing circuit 114 is provided to normalize the output of multiplier 5 with input power to adaptive filter 3.

Figure 22:
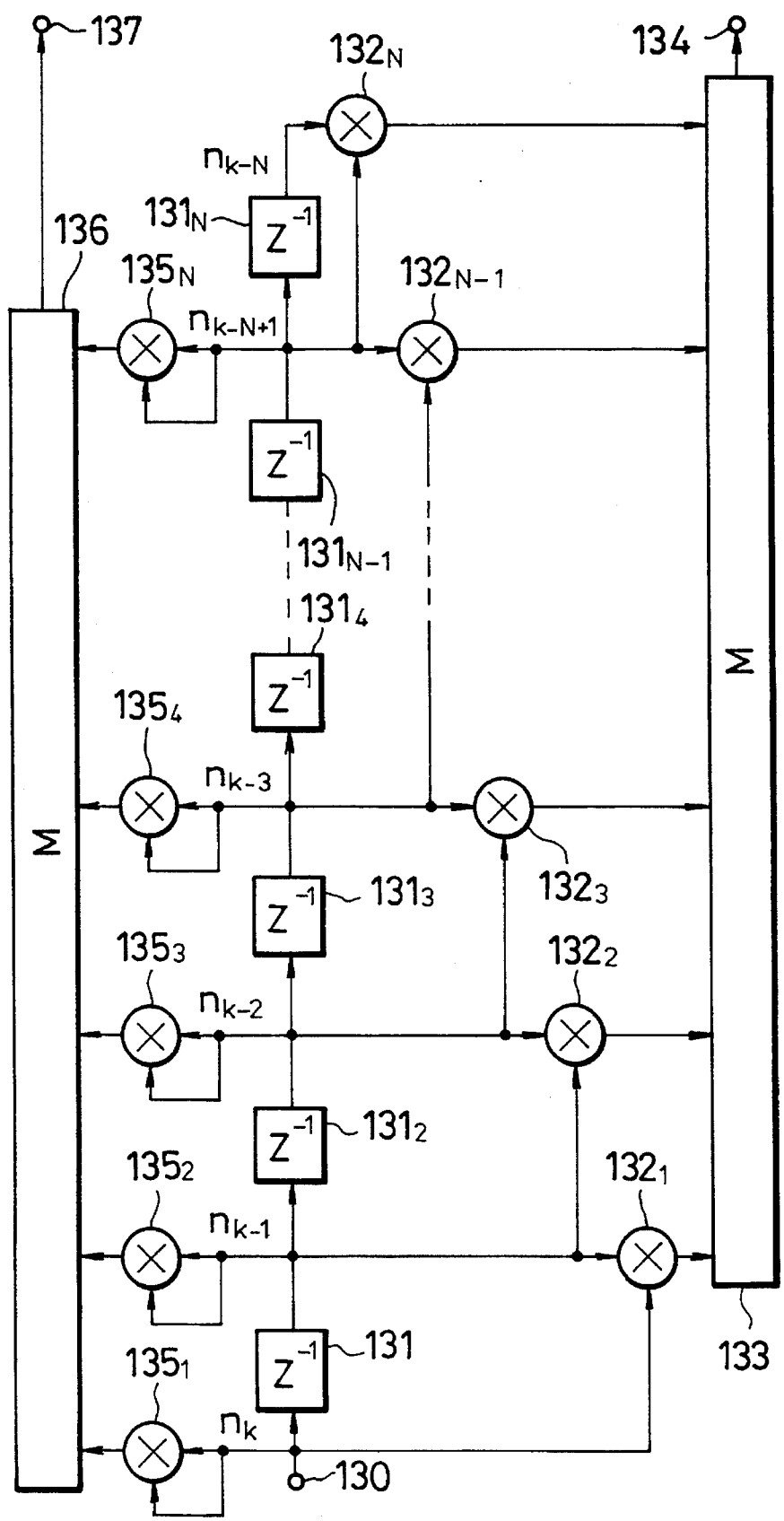
FIG. 22 is a block diagram showing an example of construction of a correlation calculating circuit.

First, construction of correlation calculating circuit 107 will be described with reference to FIG. 22. Correlation calculating circuit 107 is composed of N delay elements $131_1$ to $131_N$, 2N multipliers $132_1$ to $132_N$ and $135_1$ to $135_N$, first N-input adder 133 and second N-input adder 136. Delay elements $131_1$ to $131_N$ are connected in series and form a delay line with taps. Reference signal $n_k$ is supplied to first delay element $131_1$ by way of input terminal 130. Multipliers $132_1$ to $132_N$ calculate products of inputs to and outputs of corresponding delay elements $131_1$ to $131_N$, respectively, and output the products to first adder 133. In other words, the product of input $n_{k-i+1}$ and output $n_{k-i}$ of i-th ($1 \leq i \leq N$) delay element $131_i$ is calculated by i-th multiplier $132_i$. First adder 133 calculates the sum total of outputs of multipliers $132_1$ to $132_N$ and outputs the sum total by way of output terminal 134. As a result, the value given by $$\sum_{j=k}^{k-N-1} n_{j-1} n_j = n_{k-1}^T \cdot n_k \tag{26}$$

is outputted from first adder 133, and this $n_{k-1}^T \cdot n_k$ is outputted as correlation $C_k$ from output terminal 134.

Multipliers $135_1$ to $135_N$ calculate squares of inputs to corresponding delay elements $131_1$ to $131_N$, respectively, and output the results to second adder 136. For example, at i-th multiplier $135_i$, square $n_{k-i+1}^2$ of input $n_{k-i+1}$ to i-th delay element $131_i$ is calculated. Second adder 136 calculates the sum total of outputs of multipliers $135_1$ to $135_N$ and outputs the sum total to the outside by way of output terminal 137. Accordingly, the value given by $$P_k = \sum_{j=k}^{k-N-1} n_j^2 = n_{k-1}^T n_k \tag{27}$$

is outputted from output terminal 137. Here, $P_k$ is an input power to adaptive filter 3. Correlation $C_k$ is supplied to step size controller 108, and filter input power $P_k$ is supplied to delay element 102 and normalizing circuit 114.

Figure 23:
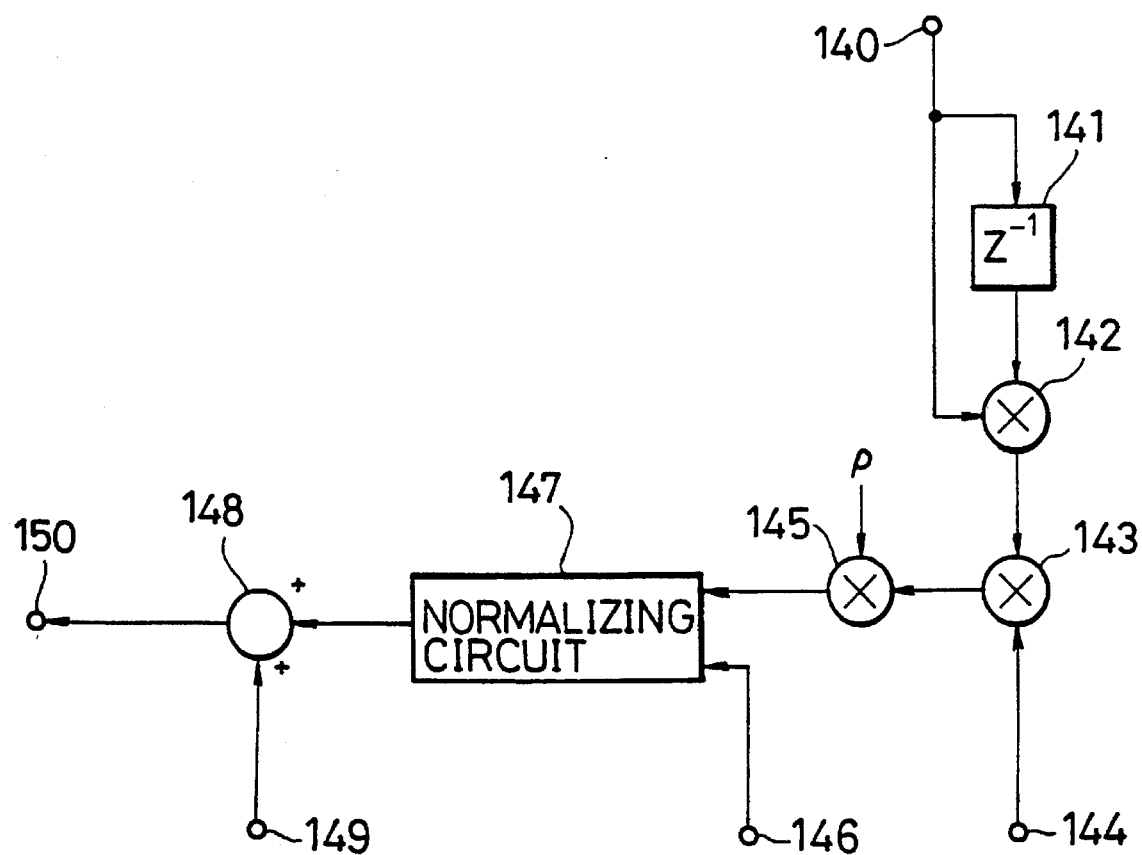
FIG. 23 is a block diagram showing a third example of construction of a step size controller.

Construction of step size controller 108 will be described with reference to FIG. 23. Step size controller 108 is composed of delay element 141, three multipliers 142, 143 and 145, normalizing circuit 147 and adder 148. Normalizing circuit 147 can be constituted from a dividing circuit.

Difference signal $d_k$ inputted to input terminal 140 is delayed by one sample period by delay element 141 to make $d_{k-1}$, which is supplied to multiplier 142. Signal $d_k$ is also supplied to multiplier 142, and $d_k d_{k-1}$ which is an output of multiplier 142 is supplied to second multiplier 143. Correlation $C_k$ ($=n_{k-1}^T n_k$) is also supplied to second multiplier 143 from correlation calculating circuit 107 by way of input terminal 144. An output of multiplier 143 is multiplied by $\rho$ by multiplier 145 and supplied to normalizing circuit 147. An output of delay element 102 (FIG. 21), i.e., filter input power $P_{k-1}$, is supplied to normalizing circuit 147 by way of input terminal 146.

Normalizing circuit 147 normalizes output $\rho \cdot d_k \cdot d_{k-1} \cdot n_{k-1}^T \cdot n_k$ of multiplier 145 with filter input power $P_{k-1}$ and outputs the result to adder 148. The result of normalization is $\rho \cdot d_k \cdot d_{k-1} n_{k-1}^T \cdot n_k / P_{k-1}$.

An output of delay circuit 101 is also supplied to adder 148 by way of input terminal 146. Since an input to delay circuit 101 is an output of limiter 17, the output of delay circuit 101 makes output $\alpha_{k-1}$ of limiter 17 one sample period earlier. An output of adder 148 is connected to output terminal 150 of step size controller 108. Accordingly, the value given by $$\alpha_k = \alpha_{k-1} + \rho \cdot d_k \cdot d_{k-1} \cdot n_{k-1}^T \cdot n_k / P_{k-1} \tag{28}$$

is obtained at output terminal 150. Equation (28) has a normalized form of the second term of the right side of equation (10) with $P_{k-1}$. By normalization, stabilized control of step size can be achieved even with an unsteady signal.

Figure 5:
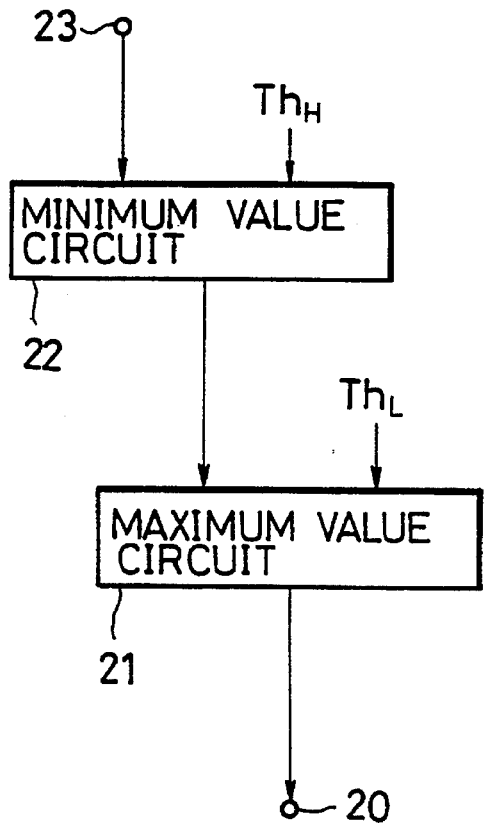
FIG. 5 is a block diagram showing an example of construction of the limiter in the apparatus shown in FIG. 2.
Figure 6:
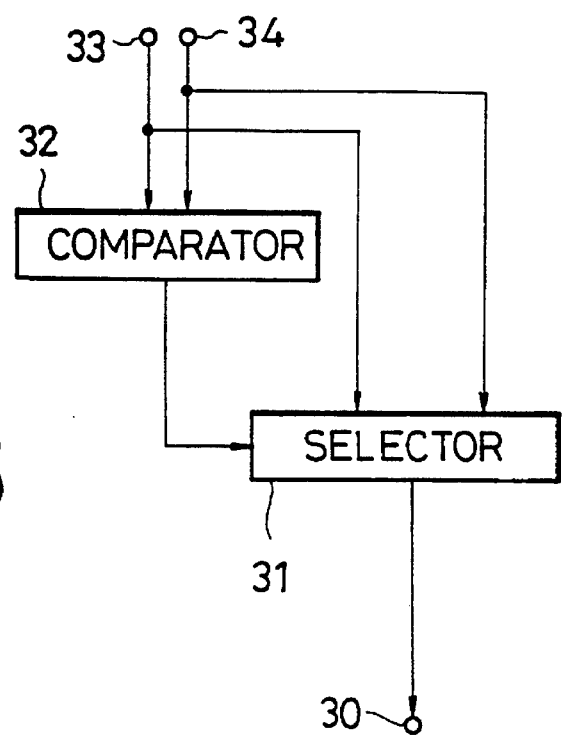
FIG. 6 is a block diagram showing construction of the maximum value circuit and the minimum value circuit in the limiter shown in FIG. 5.

The limiter of conventional construction described above with reference to FIG. 5 can be used as is as limiter 17. Output $\alpha_k$ of limiter 17 is transmitted to delay element 101 and multiplier 5. At multiplier 5, multiplication of the output of limiter 17 and signal $d_k$ is performed, and product $\alpha_k \cdot d_k$ thereof is supplied to normalizing circuit 114. Also filter input power $P_k$ is supplied to normalizing circuit 114 from correlation calculating circuit 107. Normalizing circuit 107 normalizes $\alpha_k \cdot d_k$ with $P_k$ and transmits thus normalized value $\alpha_k \cdot d_k / P_k$ to adaptive filter 3. At adaptive filter 3, updating of coefficients is performed using this value $\alpha_k \cdot d_k / P_k$. Accordingly, the coefficient updating equation at adaptive filter 3 is given by $$c_k = c_{k-1} + \alpha_k \cdot d_k \cdot n_{k-1} / P_k \tag{29}$$

Considering that $P_k$ is defined by equation (27), equation (29) is equivalent to that of the LIM algorithm given by equation (7), except that step size is controlled adaptively. In particular, in the present embodiment, quick and stabilized convergence can be realized for an unsteady signal compared with the conventional SGA-GAS algorithm. The relation of convergence by the present embodiment to that by the conventional SGA-GAS algorithm is contrasted to the relation of the LIM algorithm to the LMS algorithm.

The sixth embodiment of the present invention is described so far, and in the present embodiment, when the step size to be used for the updating of coefficients is calculated using a gradient of power of an error signal, the step size is normalized with a filter input power so that stabilized quick convergence is realized for a nonstationary signal.

Figure 24:
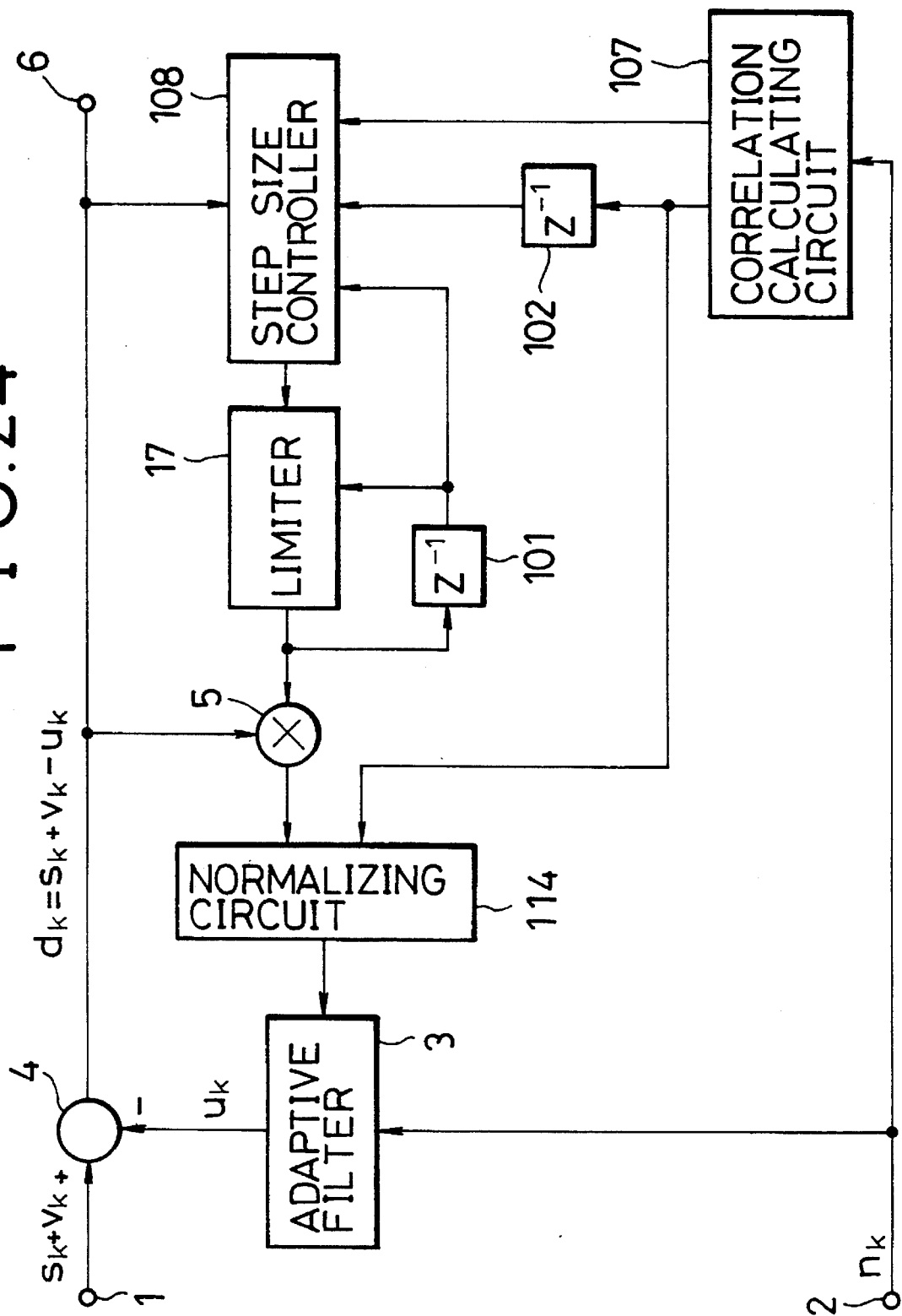
FIG. 24 is a block diagram showing construction of an apparatus for identifying an unknown system using an adaptive filter according to a seventh preferred embodiment of the present invention.

Subsequently, a seventh preferred embodiment of the present invention will be described. FIG. 24 shows construction of an apparatus for identifying an unknown system using an adaptive filter according to the present embodiment. The present apparatus is different from the apparatus of the sixth embodiment described above in construction of limiter 17 and also in that the output of delay element 101 is also fed back to limiter 17.

The limiter in the first embodiment described above with reference to FIG. 9 can be used as is as limiter 17 in the present embodiment. In this instance, $\alpha_k$ is supplied from step size controller 108 to input terminal 23 of FIG. 9. Limited step size $\overline{\alpha_{k-1}}$ obtained at output terminal 20 is fed back to input terminal 24 by way of delay element 101. Accordingly, as described above in connection with the first embodiment, step size 60 supplied to input terminal 23 of limiter 17 is defined for the lower limit thereof by threshold value $Th_L$ and $a\overline{\alpha_{k-1}}$ and for the upper limit thereof by threshold value $Th_H$ and $b\overline{\alpha_{k-1}}$ so that the following limited step size $\overline{\alpha_k}$ given by the following equation is obtained:

$$\overline{\alpha_k} = \begin{cases} \max\{Th_L, \eta\overline{\alpha_{k-1}}\} & \text{for } \alpha_k \leq \max\{Th_L, \eta\overline{\alpha_{k-1}}\} \\ \alpha_k & \text{for } \max\{Th_L, \eta\overline{\alpha_{k-1}}\} < \\ & \alpha_k \leq \min\{Th_H, \theta\overline{\alpha_{k-1}}\} \\ \min\{Th_H, \theta\overline{\alpha_{k-1}}\} & \text{for } \min\{Th_H, \theta\overline{\alpha_{k-1}}\} < \alpha_k \end{cases} \quad (30)$$

where max{A, B} and min{A, B} represent the maximum value and the minimum value of A and B, respectively. Limited step size $\overline{\alpha_k}$ is transmitted as an output of limiter 17 to multiplier 5 and delay element 101. Since the output of multiplier 5 is applied to adaptive filter 3 by way of normalizing circuit 114, calculation B similar to that of the sixth embodiment described above will lead to the following coefficient updating equation at adaptive filter 3:

$$c_k = c_{k-1} + (\overline{\alpha_k}/P_k) \cdot d_k \cdot n_{k-1} \quad (31)$$

Amplitude distributions of $s_k$ and $v_k - u_k$ are generally independent of each other. Accordingly, $$E[|s_k|] \cdot E[|v_k - u_k|] = 0 \quad (32)$$

stands. By using $\overline{\alpha_k}$ in place of $\alpha_k$, even if $s_k$ causes an obstacle to $v_k - u_k$, the instantaneous influence of $s_k$ upon $v_k - u_k$ can be suppressed by means of limiter 17 to obtain a stabilized step size. While stabilization of a step size is achieved by limitation of both the maximum value and the minimum value in the limiter, it is also effective to provide a limitation only for either the maximum value or the minimum value. Further, it is also possible to set a limiting value for an increase of step size and a limiting value for a decrease of step size equal to each other. An example of a limiter which limits the step size with an equal limiting value whether step size is increasing or decreasing is shown in FIG. 25.

Figure 25:
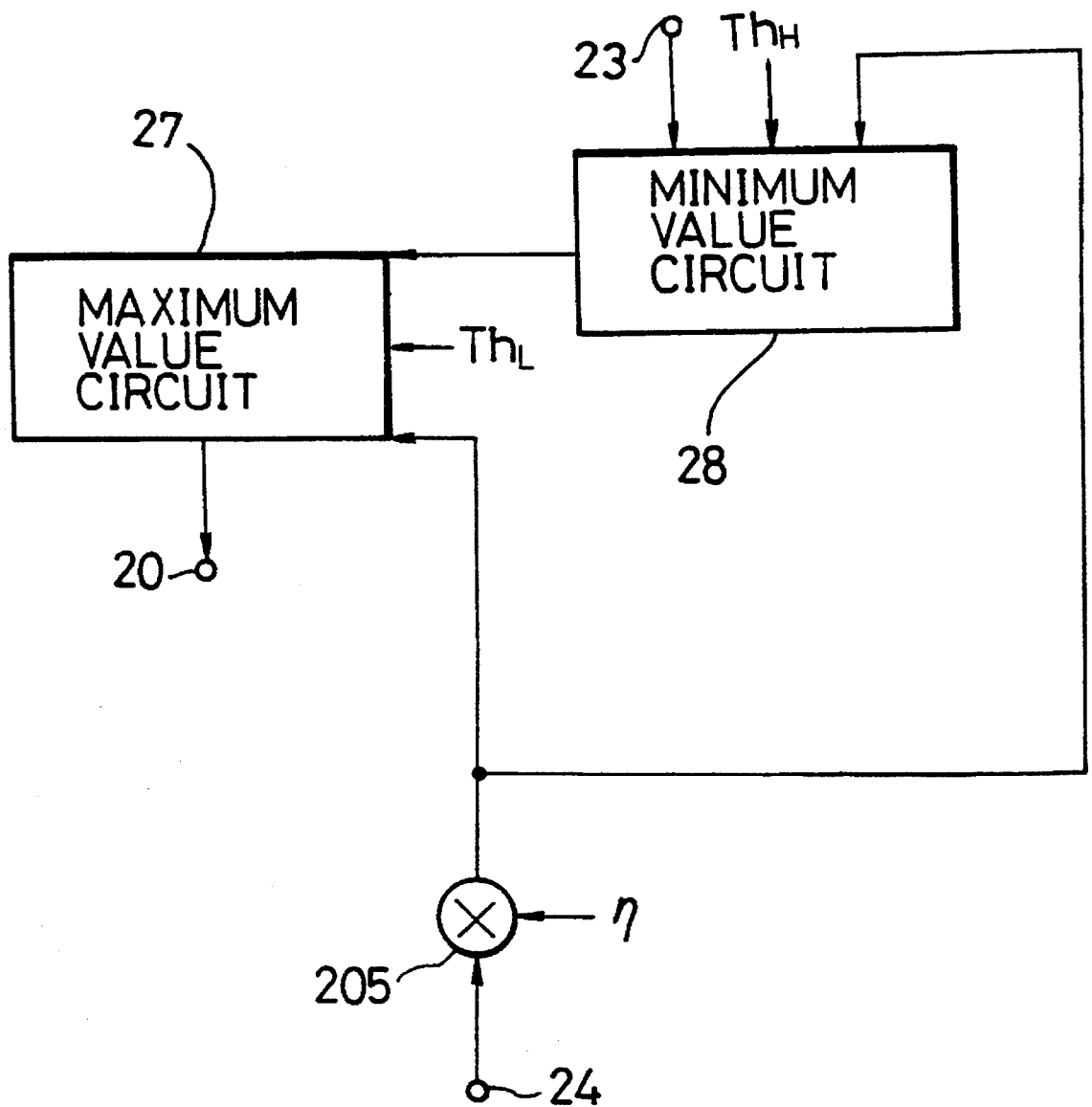
FIG. 25 is a block diagram showing a further example of construction of the limiter.

In the limiter shown in FIG. 25, a feedback signal supplied from delay element 101 to input terminal 24 is multiplied by a at multiplier 25 and is transmitted as a $\overline{\alpha_{k-1}}$ to maximum value circuit 27 and minimum value circuit 28. Thereafter, the identifying apparatus which employs the limiter shown in FIG. 25 operates in the same manner as the identifying apparatus which employs the limiter shown in FIG. 9 except that the maximum step size value is limited using $\min\{Th_H, a\overline{\alpha_{k-1}}\}$ in place of $\min\{Th_H, b\overline{\alpha_{k-1}}\}$ in equation (30).

Further, the limiter in the first embodiment described above with reference to FIG. 14 can be used as limiter 17 in the present embodiment. In case the limiter shown in FIG. 14 is used, considering that step size is normally smaller than 1, limiting values $\max\{Th_L, \eta\overline{\alpha_{k-1}}^2\}$ and $\min\{Th_H, \theta\overline{\alpha_{k-1}}^2\}$ for increase and decrease of step size increase in proportion to the squared value of limited step sizes $\overline{\alpha_{k-1}}$ one sample period earlier. Accordingly, the smaller the step size, the stronger the limitation. As the influence of $s_k$ increases, that is, as step size decreases, it becomes more stable.

Further, the limiter in the first embodiment described above with reference to FIG. 13 can be used as limiter 17 in the present embodiment. In the limiter 17 shown in FIG. 13, as in the limiter shown in FIG. 25, the limiting value for increase of the step size and the limiting value for decrease of the step size are set equal to each other. In this instance, limited step size $\overline{\alpha_k}$ is given by the following equation:

$$\overline{\alpha_k} = \begin{cases} \max\{Th_L, \eta\overline{\alpha_{k-12}}\} & \text{for } \alpha_k \leq \max\{Th_L, \eta\overline{\alpha_{k-12}}\} \\ \alpha_k & \text{for } \max\{Th_L, \eta\overline{\alpha_{k-12}}\} < \\ & \alpha_k \leq \min\{Th_H, \eta\overline{\alpha_{k-12}}\} \\ \min\{Th_H, \eta\overline{\alpha_{k-12}}\} & \text{for } \min\{Th_H, \eta\overline{\alpha_{k-12}}\} < \alpha_k \end{cases} \quad (33)$$

The seventh embodiment of the present invention is described so far. In the present embodiment, when the step size to be used for the updating of coefficients is calculated using a gradient of power of an error signal, step size is normalized with a filter input power so that stabilized quick convergence is realized for an unsteady signal. Further, since a limit which depends upon the earlier step size is provided for the variation of a step size thus obtained, step size can be prevented from being made excessively different from a correct value due to noise obstruction or other factors.

Figure 26:
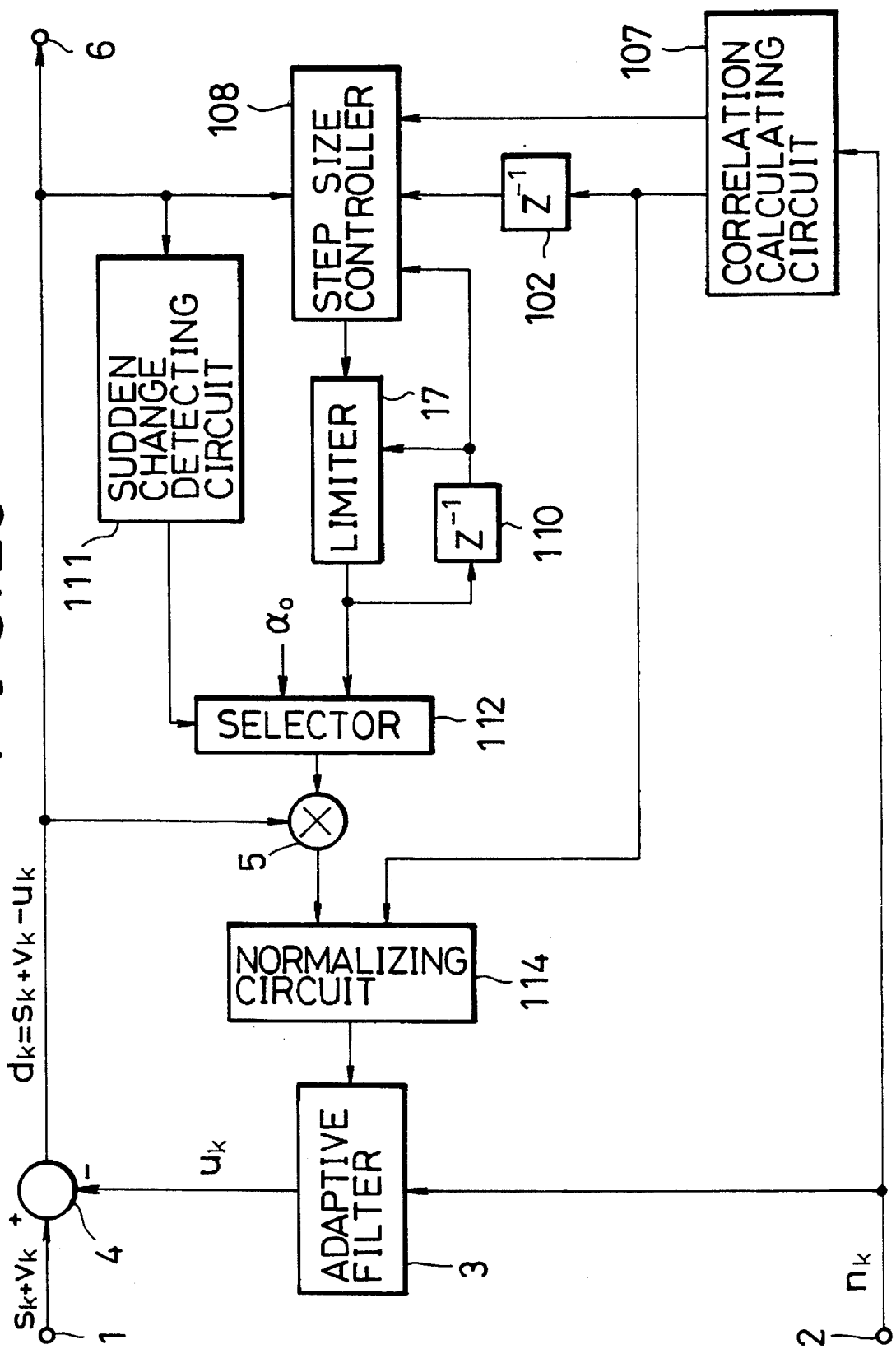
FIG. 26 is a block diagram showing construction of an apparatus for identifying an unknown system using an adaptive filter according to an eighth preferred embodiment of the present invention.

Subsequently, an eighth preferred embodiment of the present invention will be described. FIG. 26 is a block diagram showing construction of an apparatus for identifying an unknown system using an adaptive filter according to the present embodiment.

If the maximum value and the minimum value for step size are limited using a previous value or values of the step size as in the seventh embodiment described above, then in the case that a characteristic of an unknown system to be identified presents a sudden change so that an error signal is increased suddenly, the identifying apparatus cannot cope with such a sudden change. In this instance, step size must necessarily be increased suddenly so that the adaptive filter may follow up the change of the characteristic of the unknown system. However, when the step size value is limited by a previous value or values thereof, it can present only a moderate change; accordingly, the speed of following up a sudden change of the system is slow. Thus, in the present embodiment, a sudden change in an unknown system to be identified is detected by means of a sudden change detecting circuit for error and re-setting of a step size is performed in accordance with the detected result.

The apparatus shown in FIG. 26 is generally constructed such that sudden change detecting circuit 111 for error and selector 112 are added to the construction of the apparatus shown in FIG. 24. Sudden change detecting circuit 111 receives error signal $d_k$ as an input thereto and outputs a controlling signal to selector 112. Selector 112 is interposed between limiter 17 and multiplier 5. Limited step size $\overline{\alpha_k}$, which is an output of limiter 17, is inputted to an input terminal of selector 112, and predetermined step size $\alpha_0$ is inputted to the other input terminal of selector 112. Selector 112 selectively transmits a signal from limiter 17 to multiplier 5 when the controlling signal from sudden change detecting circuit 111 is "0", but selectively transmits predetermined step size $\alpha_0$ to multiplier 5 when the controlling signal is "1".

Sudden change detecting circuit 42 described above in connection with the first embodiment can be used as is as sudden change detecting circuit 111 of the present embodiment. In particular, any of sudden change detecting circuits 42 shown in FIGS. 11 and 12 can be used as sudden change detecting circuit 111.

Figure 11:
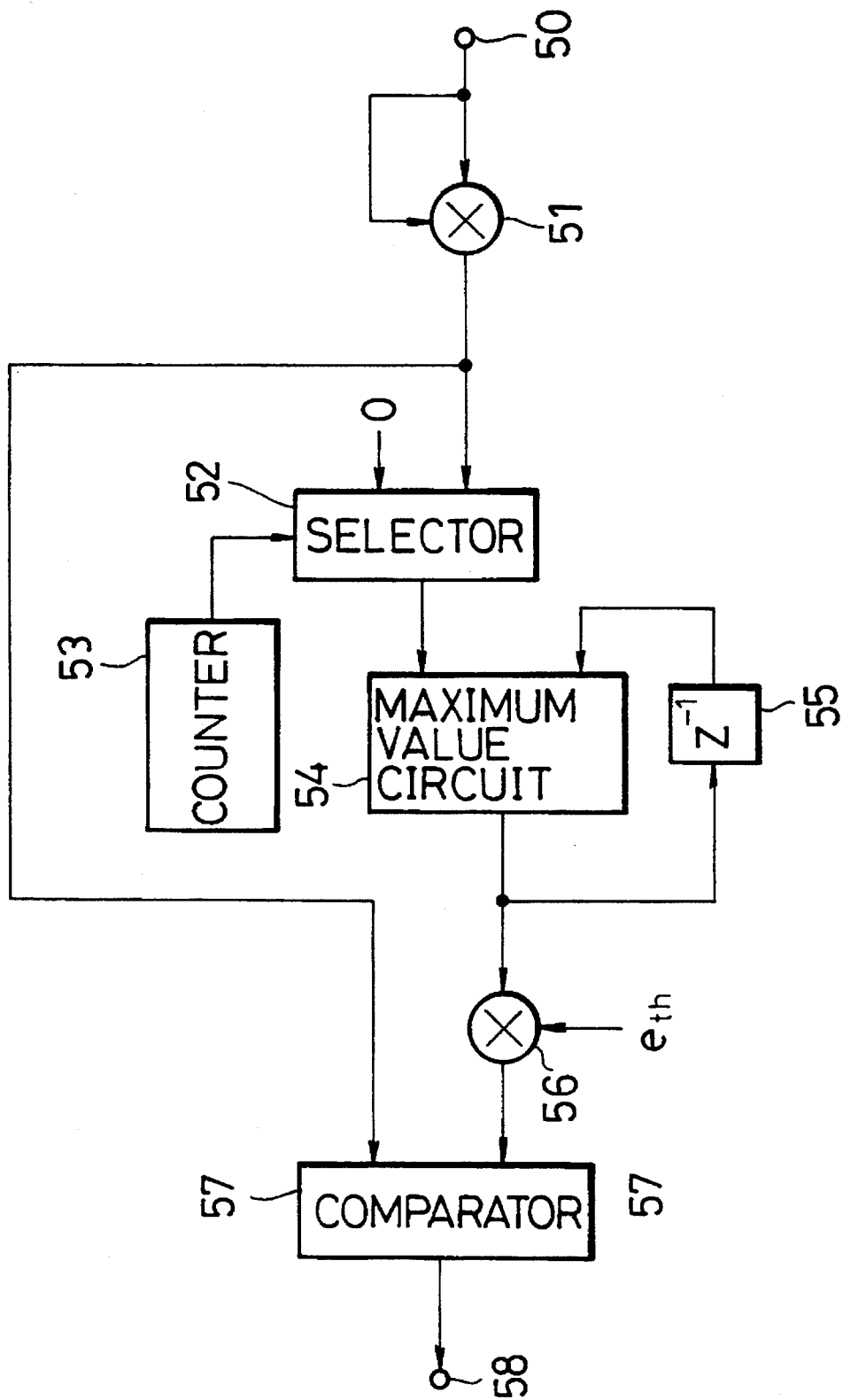
FIG. 11 is a block diagram showing an example of construction of a sudden change detecting circuit for error.
Figure 12:
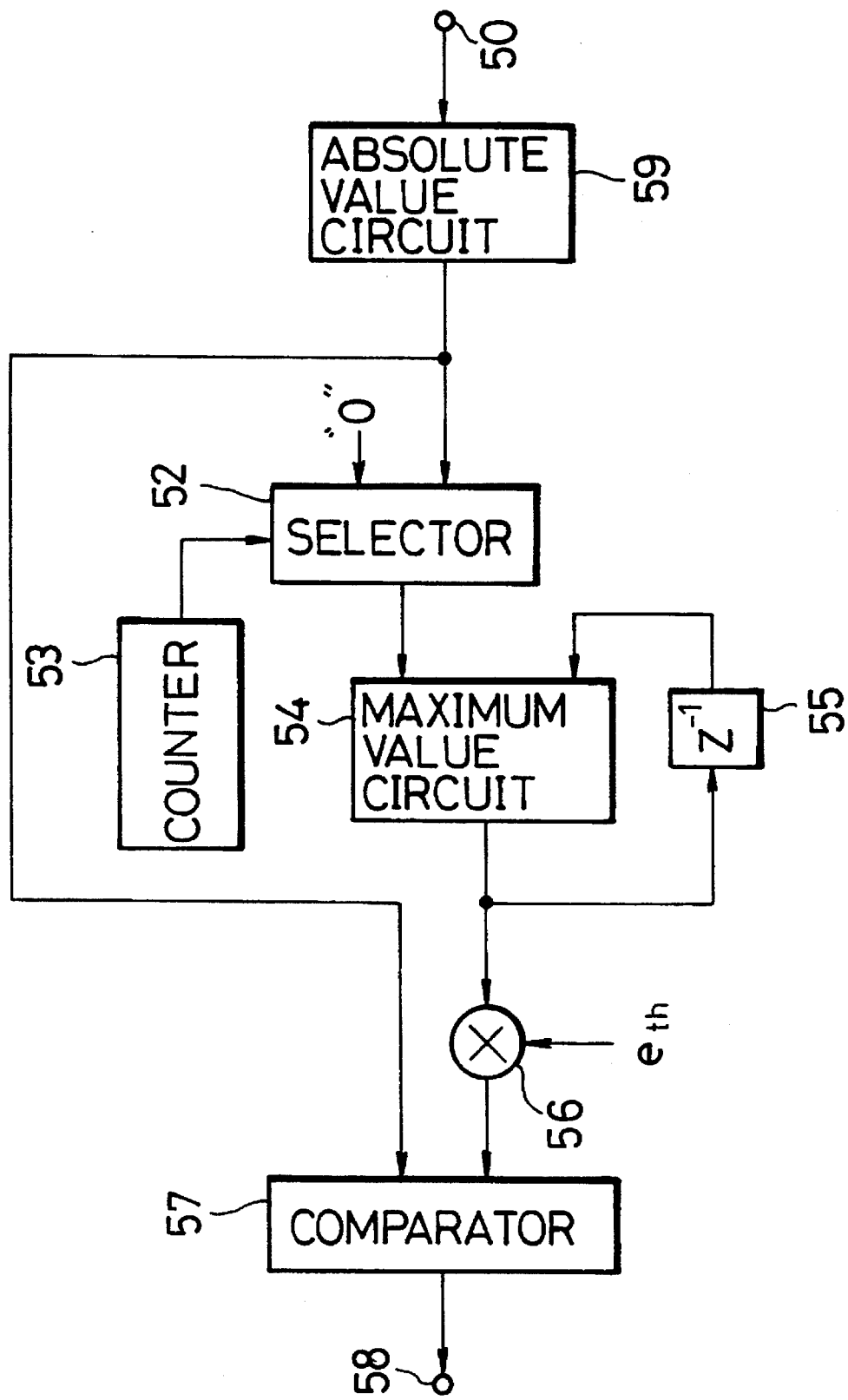
FIG. 12 is a block diagram showing another example of construction of a sudden change detecting circuit for error.

In the sudden change detecting circuit for error shown in FIG. 11, a sudden change in error signal $d_k$ is detected based on squared value $d_k^2$ of error signal $d_k$. In the sudden change detecting circuit shown in FIG. 12, a sudden change in error signal $d_k$ is detected based on absolute value $|d_k|$ of error signal $d_k$. Whichever two sudden change detecting circuits for error is used, when a sudden change in error signal $d_k$ is detected, a controlling signal of "1" is outputted, and in any other case, another controlling signal of "0" is outputted, from sudden change detecting circuit 111. When a sudden change in error signal $d_k$ is detected, predetermined step size $\alpha_0$ is outputted from selector 112 to multiplier 5. But when no significant change of error signal $d_k$ is detected, limited step size $\overline{\alpha_k}$ from limiter 17 is supplied to multiplier 5. That predetermined step size $\alpha_0$ is inputted in place of limited step size $\overline{\alpha_k}$ to multiplier 5 means that step size re-setting has been performed. Since predetermined step size $\alpha_k$ does not rely on a previous step size, even if error signal $d_k$ presents a sudden change, the identifying apparatus can cope with the sudden change.

The eighth embodiment of the present invention is described so far, and in the present embodiment, when step size to be used for the updating of coefficients is calculated using a gradient of power of an error signal, step size is normalized with a filter input power so that stabilized quick convergence is realized for an unsteady signal. Further, since a limit or limits which depend on previous value of step size are provided for variation of the step size thus obtained, the step size can be prevented from being made excessively different from the correct value due to noise obstruction or other factors. Still further, an identification error signal is monitored, and when it is detected that a characteristic of the unknown system for an object of identification has changed suddenly, the step size is re-set to achieve both quick convergence and small identification error.

Figure 27:
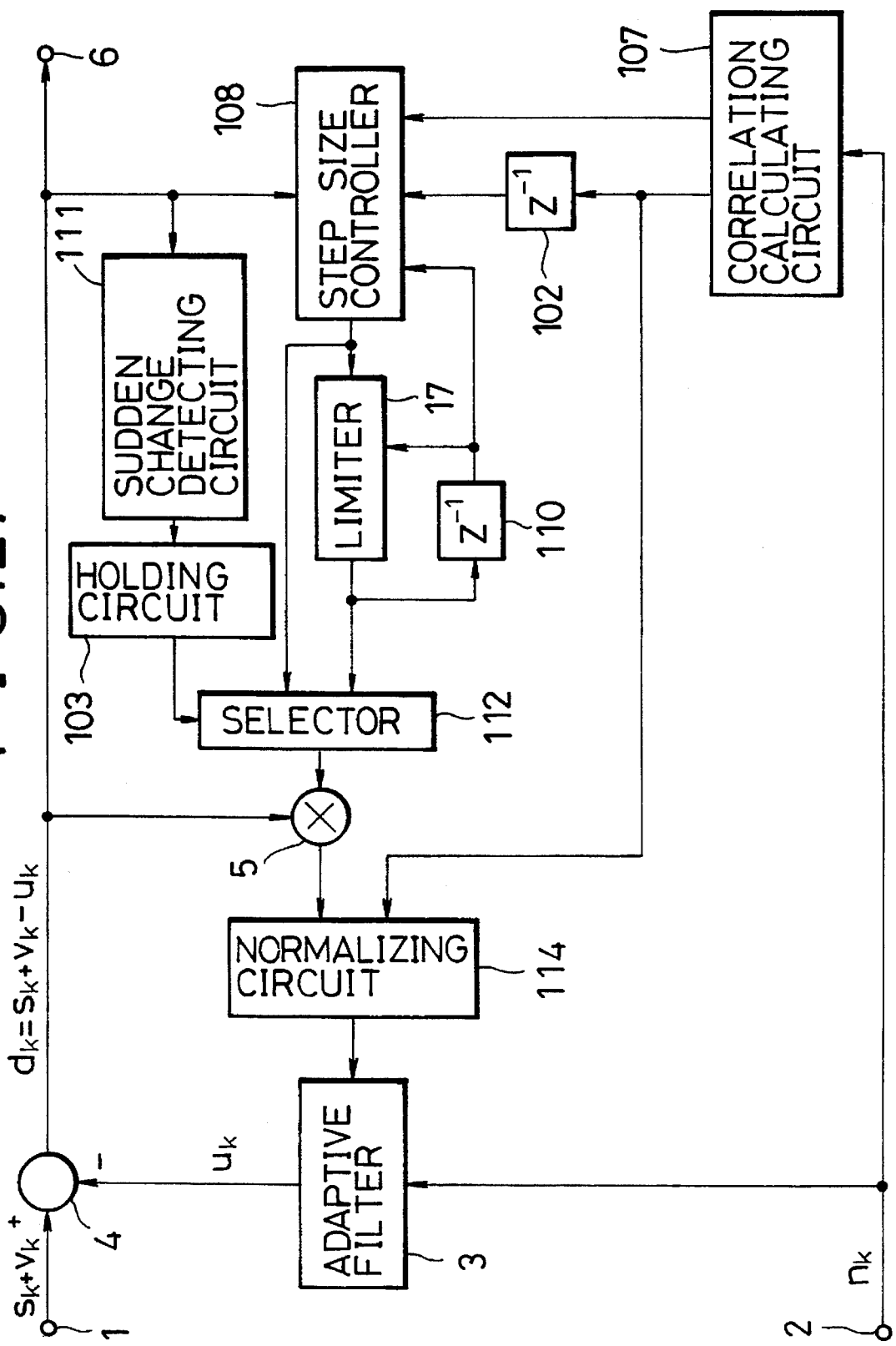
FIG. 27 is a block diagram showing construction of an apparatus for identifying an unknown system using an adaptive filter according to a ninth preferred embodiment of the present invention.

Subsequently, a ninth preferred embodiment of the present invention will be described. FIG. 27 is a block diagram showing construction of an apparatus for identifying an unknown system using an adaptive filter according to the present embodiment. While, in the eighth embodiment described above, re-setting of a step size is performed when a sudden change in error signal $d_k$ is detected, in the present embodiment, the step size limitation is cancelled for a fixed period of time. The apparatus of the present embodiment is different from the apparatus of the eighth embodiment described above in that holding circuit 103 is interposed between sudden change detecting circuit 111 and selector 112 and output $\alpha_k$ of step size controller 108 is inputted to selector 112 in place of predetermined step size $\alpha_0$.

The sudden change detecting circuit for error described above with reference to FIG. 11 or 12 can be used as is as sudden change detecting circuit 111, as in the eighth embodiment described above. When a sudden change of error signal $d_k$ is detected by sudden change detecting circuit 111, holding circuit 103 outputs "1" to selector 112 for a fixed period of time beginning with the moment of detection of the change.

Figure 28:
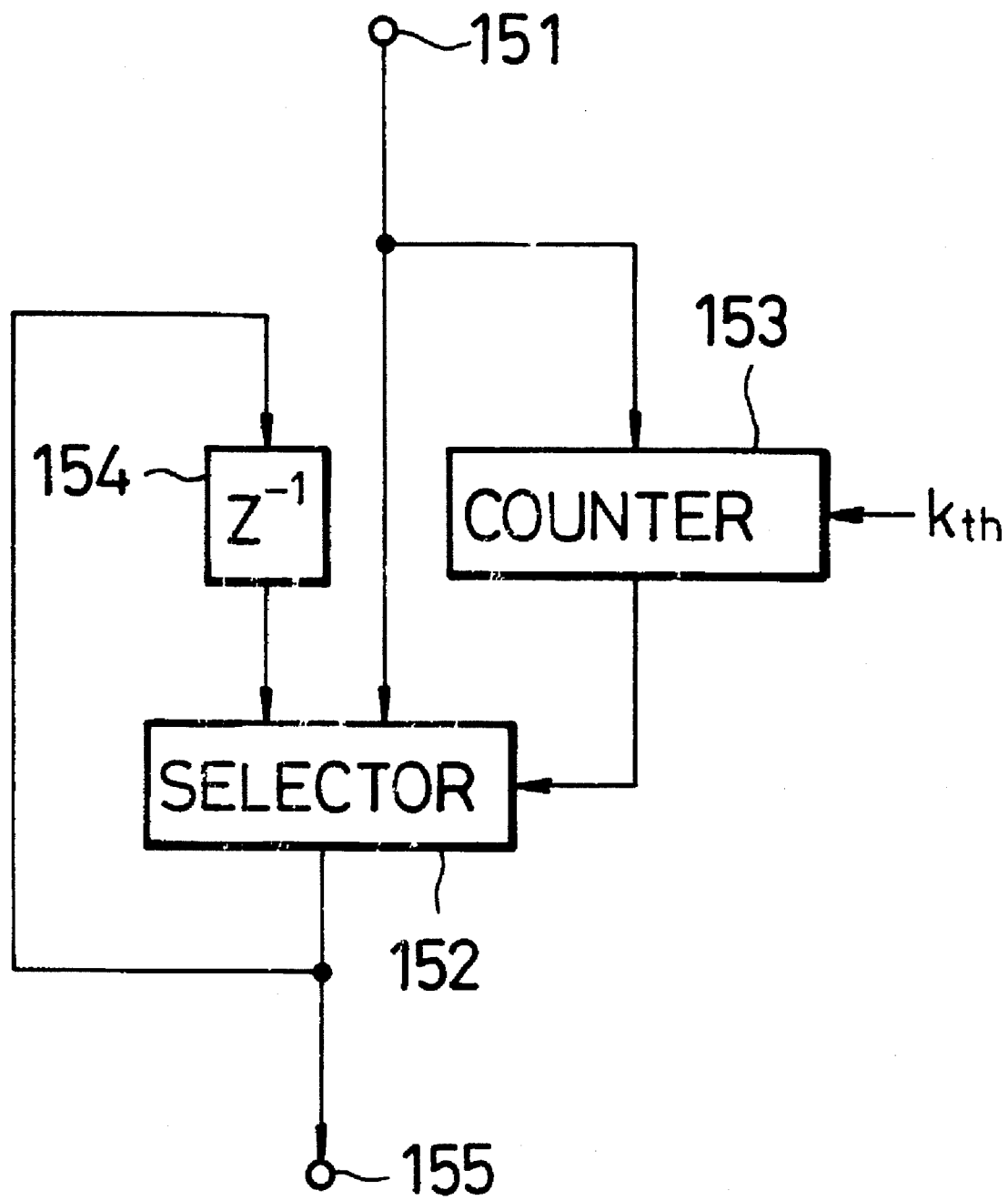
FIG. 28 is a block diagram showing construction of a holding circuit in the apparatus shown in FIG. 27.

An example of the construction of holding circuit 103 is shown in FIG. 28. Holding circuit 103 is composed of selector 152, counter 153 and delay element 154. A signal from sudden change detecting circuit 111 is supplied to input terminal 151 and is transmitted to selector 152 and counter 153. An output of selector 152 is supplied to output terminal 155 and is fed back simultaneously to selector 152 by way of delay element 154. Counter 153 resets its counting when "1" is supplied to input terminal 151. When counter 153 has a value between "0" and $K_{th}$ inclusive, it controls selector 152 so as to select a feedback signal from delay element 154 and transmit the same to output terminal 155 so that selector 152 may normally select a signal supplied thereto from input terminal 151. Accordingly, when a sudden change of error signal $d_k$ is detected by sudden change detecting circuit 111, the value "1" is inputted to input terminal 151 of holding circuit 103; consequently, value "1" will continue to be supplied to output terminal 155 for a $K_{th}+1$ sample period after the change is detected.

Selector 112 selectively transmits output $\overline{\alpha_k}$ of limiter 17 to multiplier 5 when "0" is outputted from holding circuit 103, but selectively transmits output $\alpha_k$ of step size controller 108 to multiplier 5 when "1" is outputted from holding circuit 103. Consequently, when a sudden change in error signal $d_k$ is detected, the limitation of the step size is cancelled for a period of time defined by parameter $K_{th}$ at holding circuit 103. The identifying apparatus can cope with a sudden change in error signal $d_k$.

The ninth embodiment of the present invention is described so far. In the present embodiment, when the step size to be used for the updating of coefficients is calculated using a gradient of power of an error signal, step size is normalized with a filter input power so that stabilized quick convergence is realized for an unsteady signal. Further, since a limit or limits which depend on a previous value of step size are provided for variation of the step size thus obtained, step size can be prevented from being made excessively different from the correct value due to noise obstruction or other factors. Still further, an identification error signal is monitored, and when it is detected that a characteristic of the unknown system for an object of identification has changed suddenly, the step size limitation is cancelled for a fixed period of time; consequently, both quick convergence and low identification error can be achieved.

In the sixth to ninth embodiments described above, the normalized value of step size $\alpha_k$ ($\overline{\alpha_k}$) with filter input power $P_{k-1}$ ($P_k$) is inputted to adaptive filter 3. The difference between the LMS algorithm and the LIM algorithm resides in whether $\alpha$ is used or a value ($\mu$) obtained by division of $\alpha$ by a filter average input power is used as the step size. The sixth to ninth embodiments can each be considered to be equivalent to the LIM algorithm in which step size $\mu$ is made variable.

It is to be understood that variations and modifications of the method of and the apparatus for identifying an unknown system using an adaptive filter disclosed herein will be evident to those skilled in the art. It is intended that all such modifications and variations be included within the scope of the appended claims.

What is claimed is:

1. A method of identifying an unknown system using an adaptive filter, which delays an input signal successively by one sample period to form a plurality of samples, calculates products between the samples and corresponding samples of a plurality of multiplicands provided correspondingly to the plurality of samples, and outputs the sum total of the products, wherein the unknown system is identified by adding to each of the multiplicands a product among a difference signal obtained by subtraction of an output of said adaptive filter from an output of the unknown system, the sample corresponding to the multiplicand and a parameter as an updated amount for unit updating to update the multiplicands so that the difference signal is decreased, characterized in that a value which increases in proportion to a gradient of the difference signal with respect to the parameter is added to the parameter to obtain a sum and the parameter is modified using a limited sum obtained by applying a limit to the sum, and a threshold value for applying the limit is determined using a previous limited sum or sums.

2. An identifying method as set forth in claim 1, characterized in that a value obtained by multiplying the previous limited sum by a predetermined first constant, a predetermined second constant and the sum are compared with one another, and a minimum of the three is determined as the limited sum.

3. An identifying method as set forth in claim 1, characterized in that a value obtained by multiplying the previous limited sum by a predetermined first constant, a predetermined second constant and the sum are compared with one another, and a maximum of the three is determined as the limited sum.

4. An identifying method as set forth in claim 1, characterized in that a value obtained by multiplying the previous limited sum by a predetermined first constant, a predetermined second constant and the sum are compared with one another and a minimum value among them is found, and the minimum value, a value obtained by multiplying the pervious limited sum by a predetermined third constant and a predetermined fourth constant are compared with one another and a maximum of the three is determined as the limited sum.

5. An identifying method as set forth in claim 1, characterized in that the threshold value is calculated using a squared value of the previous limited sum or sums.

6. An identifying method as set forth in claim 5, characterized in that a value obtained by multiplying a squared value of the previous limited sum by a predetermined first constant, a predetermined second constant and the sum are compared with one another, and a minimum of the three is determined as the limited sum.

7. An identifying method as set forth in claim 5, characterized in that a value obtained by multiplying a squared value of the previous limited sum by a predetermined first constant, a predetermined second constant and the sum are compared with one another, and a maximum of the three is determined as the limited sum.

8. An identifying method as set forth in claim 5, characterized in that a value obtained by multiplying a squared value of the previous limited sum by a predetermined first constant, a predetermined second constant and the sum are compared with one another to find a minimum value of the three, and the minimum value, a value obtained by multiplying the squared value of the previous limited sum by a predetermined sixth constant and a predetermined fourth constant and a maximum of the three is determined as the limited sum.

9. An identifying method as set forth in claim 5, characterized in that a value obtained by multiplying a squared value of the previous limited sum by a predetermined first constant is determined as a threshold value and the threshold value, a predetermined second constant and the sum are compared with one another to determine a minimum of the three as a minimum value, and the minimum value, the threshold value and a predetermined third constant are compared with one another and a maximum of three is determined as the limited sum.

10. A method of identifying an unknown system using an adaptive filter, which delays an input signal successively by one sample period to form a plurality of samples, calculates products between the samples and corresponding samples of a plurality of multiplicands provided correspondingly to the plurality of samples, and outputs the sum total of the products, wherein the unknown system is identified by adding to each of the multiplicands a product among a difference signal obtained by subtraction of an output of said adaptive filter from an output of the unknown system, the sample corresponding to the multiplicand and a parameter as an updated amount for unit updating to update the multiplicands so that the difference signal is decreased, characterized in that a value which increases in proportion to a gradient of the difference signal with respect to the parameter is added to the parameter to obtain a sum and when a sudden change in the difference signal is detected, the sum is replaced with a predetermined constant, and the parameter is modified using a limited sum obtained by applying a limit to the sum, and further, a threshold value for applying the limit is determined using a previous limited sum or sums.

11. An identifying method as set forth in claim 10, characterized in that a sudden change of the difference signal is detected such that a squared value of the difference signal is calculated, and then a maximum value among all the squared values after starting of identification of the unknown system until the number of clocks reaches a predetermined second constant is found, whereafter the maximum value is multiplied by a predetermined third constant to obtain a product and then the product is successively compared with the squared values.

12. An identifying method as set forth in claim 10, characterized in that a sudden change of the difference signal is detected such that an absolute value of the difference signal is calculated, and then a maximum value among all the absolute values after starting of identification of the unknown system until the number of clocks reaches a predetermined second constant is found, whereafter the maximum value is multiplied by a predetermined third constant to obtain a product and then the product is successively compared with the absolute values.

13. An identifying method as set forth in claim 2, characterized in that the threshold value is calculated using a squared value of the previous limited sum or sums.

14. An identifying method as set forth in claim 13, characterized in that a sudden change of the difference signal is detected such that a squared value of the difference signal is calculated, and then a maximum value among all the squared values after starting of identification of the unknown system until the number of clocks reaches a predetermined second constant is found, whereafter the maximum value is multiplied by a predetermined third constant to obtain a product and then the product is successively compared with the squared values.

15. An identifying method as set forth in claim 13, characterized in that a sudden change of the difference signal is detected such that an absolute value of the difference signal is calculated, and then a maximum value among all the absolute values after starting of identification of the unknown system until the number of clocks reaches a predetermined second constant is found, whereafter the maximum value is multiplied by a predetermined third constant to obtain a product and then the product is successively compared with the absolute values.

16. A method of identifying an unknown system using an adaptive filter, which delays an input signal successively by one sample period to form a plurality of samples, calculates products between the samples and corresponding samples of a plurality of multiplicands provided correspondingly to the plurality of samples, and outputs the sum total of the products, wherein the unknown system is identified by adding to each of the multiplicands a product among a difference signal obtained by subtraction of an output of said adaptive filter from an output of the unknown system, the sample corresponding to the multiplicand and a parameter as an updated amount for unit updating to update the multiplicands so that the difference signal is decreased, characterized in that a value which increases in proportion to a gradient of the difference signal with respect to the parameter is added to the parameter to obtain a sum and a limited sum is calculated by applying a limit to the sum, and when a sudden change in the difference signal is detected, the limited sum is replaced with a predetermined constant, and then the parameter is modified using the thus replaced limited sum and a threshold value for applying the limit is determined using a previous limited sum or sums.

17. An identifying method as set forth in claim 16, characterized in that a sudden change of the difference signal is detected such that a squared value of the difference signal is calculated, and then a maximum value among all the squared values after starting of identification of the unknown system until the number of clocks reaches a predetermined second constant is found, whereafter the maximum value is multiplied by a predetermined third constant to obtain a product and then the product is successively compared with the squared values.

18. An identifying method as set forth in claim 16, characterized in that a sudden change of the difference signal is detected such that an absolute value of the difference signal is calculated, and then a maximum value among all the absolute values after starting of identification of the unknown system until the number of clocks reaches a predetermined second constant is found, whereafter the maximum value is multiplied by a predetermined third constant to obtain a product and then the product is-successively compared with the absolute values.

19. A identifying method as set forth in claim 16, characterized in that the threshold value is calculated using a squared value of the previous limited sum or sums.

20. An identifying method as set forth in claim 19, characterized in that a sudden change of the difference signal is detected such that a squared value of the difference signal is calculated, and then a maximum value among all the squared values after starting of identification of the unknown system until the number of clocks reaches a predetermined second constant is found, whereafter the maximum value is multiplied by a predetermined third constant to obtain a product and then the product is successively compared with the squared values.

21. An identifying method as set forth in claim 19, characterized in that a sudden change of the difference signal is detected such that an absolute value of the difference signal is calculated, and then a maximum value among all the absolute values after starting of identification of the unknown system until the number of clocks reaches a predetermined second constant is found, whereafter the maximum value is multiplied by a predetermined third constant to obtain a product and then the product is successively compared with the absolute values.

22. An identifying apparatus for identifying a characteristic of an unknown system using an adaptive filter, characterized in that said apparatus comprises:

a subtracter for subtracting an output of said adaptive filter from an output signal of the unknown system to obtain a difference signal;

a step size controller for receiving the difference signal and an input signal to said adaptive filter and successively calculating a step size for use for the updating of coefficients of said adaptive filter;

a limiter for receiving an output of said step size controller and limiting the received output;

a first delay element for feeding back an output of said limiter to said limiter and said step size controller; and a first multiplier for multiplying the output of said limiter by the difference signal; and in that an output of said first multiplier is used as the step size for the updating of coefficients of said adaptive filter.

23. An identifying apparatus as set forth in claim 22, characterized in that said step size controller comprises a second delay element for receiving the difference signal and delaying the received difference signal by one sample period, a second multiplier for multiplying an output of said second delay element by the difference signal, a correlation calculating circuit for receiving the input signal to said adaptive filter and calculating a correlation of the input signal, a third multiplier for multiplying an output of said correlation calculating circuit by an output of said second multiplier, a fourth multiplier for multiplying an output of said third multiplier by a fixed value, and an adder for adding an output of said fourth multiplier and a previous value of limited step size.

24. An identifying apparatus as set forth in claim 22, characterized in that said step size controller comprises an error change detecting circuit for receiving the difference signal and detecting a sudden change of the received difference signal, a second delay element for receiving the difference signal and delaying the received difference signal by one sample period, a second multiplier for multiplying an output of said second delay element by the difference signal, a correlation calculating circuit for receiving the input signal to said adaptive filter and calculating a correlation of the input signal, a third multiplier for multiplying an output of said correlation calculating circuit by an output of said second multiplier, a fourth multiplier for multiplying an output of said third multiplier by a fixed value, an adder for adding an output of said fourth multiplier and a previous value of limited step size, and a selector selector for receiving an output of said adder and a predetermined constant and selectively outputting one of the two received signals in response to an output of said error change detecting circuit.

25. An identifying apparatus as set forth in claim 22, characterized in that said limiter comprises a second multiplier for receiving the feedback signal and multiplying the received feedback signal by a predetermined first constant, and a minimum value circuit for receiving an output of said second multiplier, the input signal to said limiter and a predetermined second constant and detecting a minimum value of the three received signals.

26. An identifying apparatus as set forth in claim 22, characterized in that said limiter comprises a second multiplier for receiving the feedback signal and multiplying the received feedback signal by a predetermined first constant, and a maximum value circuit for receiving an output of said second multiplier, the input signal to said limiter and a predetermined second constant and outputting a maximum value of the three received signals.

27. An identifying apparatus as set forth in claim 22, characterized in that said limiter comprises a second multiplier for receiving the feedback signal and multiplying the received feedback signal by a predetermined first constant, a minimum value circuit for receiving an output of said second multiplier, the input signal to said limiter and a predetermined second constant and detecting a minimum value of the three received signals, an third multiplier for receiving the feedback signal and multiplying the received feedback signal by a predetermined third constant, and a maximum value circuit for receiving an output of said third multiplier, an output of said minimum value circuit and a predetermined fourth constant and detecting a maximum value of three received signals.

28. An identifying apparatus as set forth in claim 22, characterized in that said limiter comprises a second multiplier for receiving the feedback signal and squaring the received feedback signal, a third multiplier for multiplying an output of said second multiplier by a predetermined first constant, and a minimum value circuit for receiving an output of said third multiplier by a predetermined first constant, and a minimum value circuit for receiving an output of said third multiplier, the input signal to said limiter and a predetermined second constant and detecting a minimum value of the three received signals.

29. An identifying apparatus as set forth in claim 22, characterized in that said limiter comprises a second multiplier for receiving the feedback signal and squaring the received feedback signal, a third multiplier for multiplying an output of said second multiplier by a predetermined first constant, and a maximum value circuit for receiving an output of said third multiplier, the input signal to said limiter and a predetermined second constant and detecting a maximum value of the three received signals.

30. An identifying apparatus as set forth in claim 22, characterized in that said limiter comprises a second multiplier for receiving the feedback signal and squaring the received feedback signal, a third multiplier for multiplying an output of said second multiplier by a predetermined first constant, a minimum value circuit for receiving an output of said third multiplier, the input signal to said limiter and a predetermined second constant and detecting a minimum value of the three multiplying an output of said second multiplier by a predetermined third constant, and a maximum value circuit for receiving an output of said fourth multiplier, an output of said minimum value circuit and a predetermined fourth constant and outputting a maximum value of the three received signals.

31. An identifying apparatus as set forth in claim 22, characterized in that said limiter comprises a second multiplier for receiving the feedback signal and multiplying the received feedback signal by a predetermined first constant, a third multiplier for multiplying an output of said second multiplier by the feedback signal, a minimum value circuit for receiving an output of said third multiplier, the input signal to said limiter and a predetermined second constant and detecting a minimum value of the three received signals, and a maximum value circuit for receiving an output of said third multiplier, an output of said minimum value circuit and a predetermined third constant and outputting a maximum value of the three received signals.

32. An identifying apparatus for identifying a characteristic of an unknown system using an adaptive filter, characterized in that said apparatus comprises:

a subtracter for subtracting an output of said adaptive filter from an output signal of the unknown system to obtain a difference signal;

an error change detecting circuit for receiving the difference signal and detecting a sudden change of the received difference signal;

a step size controller for receiving the difference signal and an input signal to said adaptive filter and successively calculating a step size for use for the updating of coefficients of said adaptive filter;

a limiter for receiving an output of said step size controller and limiting the received output;

a first selector for receiving an output of said limiter and a predetermined constant and selectively outputting one of the two received signals in response to an output of said error change detecting circuit;

a second delay element for feeding back an output of said first selector to said limiter and said step size controller; and a first multiplier for multiplying the output of said limiter by the difference signal; and in that an output of said first multiplier is used as the step size for the updating of coefficients of said adaptive filter.

33. An identifying apparatus as set forth in claim 32, characterized in that said step size controller comprises a second delay element for receiving the difference signal and delaying the received difference signal by one sample period, a second multiplier for multiplying an output of said second delay element by the difference signal, a correlation calculating circuit for receiving the input signal to said adaptive filter and calculating a correlation of the input signal, a third multiplier for multiplying an output of said correlation calculating circuit by an output of said second multiplier, a fourth multiplier for multiplying an output of said third multiplier by a fixed value, and an adder for adding an output of said fourth multiplier and a previous value of limited step size.

34. An identifying apparatus as set forth in claim 32, characterized in that said error change detecting circuit comprises a second multiplier for receiving the difference signal and squaring the received difference signal, a counter, a second selector for receiving an output of said second multiplier and the constant "0" and selecting one of the two received signals in response to an output of said counter, a second delay element, a maximum value circuit for receiving an output of said second selector and an output of said second delay element and outputting a maximum value of the two received outputs, a third multiplier for multiplying an output of said maximum value circuit by a predetermined second constant, and a comparator circuit for comparing an output of said second multiplier and the output of said second multiplier and outputting information of which of them is greater; and in that said second delay element receives the output of said maximum value circuit, delays the received output by one sample clock period and feeds back the delayed output to said maximum value circuit.

35. An identifying apparatus as set forth in claim 32, characterized in that said error change detecting circuit comprises an absolute value of the difference signal, a counter, a second selector for receiving an output of said absolute value circuit and the constant "0" and selecting one of the two received signals in response to an output of said counter, a second delay element, a maximum value circuit for receiving an output of said second selector and an output of said second delay element and outputting a maximum value of the two received outputs, a second multiplier for multiplying an output of said maximum value circuit by a predetermined second constant, and a comparator circuit for comparing an output of said second multiplier and an output of said absolute value circuit and outputting information of which of them is greater, and in that said second delay element receives the output of said maximum value circuit, delays the received output by one sample clock period and feeds back the delayed output to said first maximum value circuit.

36. A method of identifying an unknown system using an adaptive filter, which delays an input signal successively by one sample period to form a plurality of samples, calculates products between the samples and corresponding samples of a plurality of multiplicands provided correspondingly to the plurality of samples, and outputs the sum total of the products, wherein the unknown system is identified by adding to each of the multiplicands a product among a difference signal obtained by subtraction of an output of said adaptive filter from an output of the unknown system, the sample corresponding to the multiplicand and a parameter as an updated amount for unit updating to update the multiplicands so that the difference signal is decreased, characterized in that a value which increases in proportion to a gradient of the difference signal with respect to the parameter is added to the parameter to obtain a sum and a limit is applied to the sum to obtain a limited sum, and when a sudden change in the difference signal is detected, the sum is regarded as the limited sum only for a period of time of a number of clocks equal to a predetermined first constant, and then the parameter is modified using the limited sum, and a threshold value for applying the limit is determined using a previous limited sum or sums.

37. An identifying method as set forth in claim 36, characterized in that a sudden change of the difference signal is detected such that a squared value of the difference signal is calculated, and then a maximum value among all squared values after starting of identification of the unknown system until the number of clocks reaches a predetermined second constant is found, whereafter the maximum value is multiplied by a predetermined third constant to obtain a product and then the product is successively compared with the squared values.

38. An identifying method as set forth in claim 36, characterized in that a value obtained by multiplying a squared value of the limited sum in the past by a predetermined second constant, a predetermined third constant and the sum are compared with one another to find out a minimum value of the three, and the minimum value, a value obtained by multiplying a squared value of the limited sum in the past by a predetermined fourth constant and a predetermined fifth constant and a maximum of the three is determined as the limited sum.

39. An identifying apparatus for identifying a characteristic of an unknown system using an adaptive filter, characterized in that said apparatus:

a subtracter for subtracting an output of said adaptive filter from an output signal of the unknown system to obtain a difference signal;

a first delay element;

an error change detecting circuit for receiving the difference signal and detecting a sudden change of the received difference signal;

a counter for receiving an output of said error change detecting circuit and counting clocks;

a first selector for receiving an output of said error change detecting circuit and an output of said first delay element and selectively outputting one of the two received outputs in response to an output of said counter;

a step size controller for receiving the difference signal and an input signal to said adaptive filter and successively calculating a step size for use for the updating of coefficients of said adaptive filter;

a limiter for receiving an output of said step size controller and limiting the received output;

a second selector for receiving an output of said limiter and the output of said step size controller and selectively outputting one of the two received outputs in response to an output of said first selector;

a second delay element for feeding back an output of said second selector to said limiter; and a first multiplier for multiplying the output of said second selector by the difference signal; and that said first delay element delays the output of said first selector and feeds back the delayed output to an input of said first selector; and an output of said first multiplier is used as a step size for the updating of coefficients of said adaptive filter.

40. An identifying apparatus as set forth in claim 39, characterized in that said step size controller comprises a third delay element for receiving the difference signal and delaying the received difference signal by one sample period, a second multiplier for multiplying an output of said third delay element by the difference signal, a correlation calculating circuit for receiving the input signal to said adaptive filter and calculating a correlation of the input signal, a third multiplier for multiplying an output of said correlation calculating circuit by an output of said second multiplier, a fourth multiplier for multiplying an output of said third multiplier by a fixed value, and an adder for adding an output of said fourth multiplier and a previous value of limited step size.

41. An identifying apparatus as set forth in claim 39, characterized in that said error change detecting circuit comprises a second multiplier for receiving the difference signal and squaring the received difference signal, a counter, a third selector for receiving an output of said second multiplier and the constant "0" and selecting one of the two received signals in response to an output of said counter, a third delay element, a maximum value circuit for receiving an output of said third selector and an output of said third delay element and outputting a maximum value of the two received outputs, a third multiplier for multiplying an output of said maximum value circuit by a predetermined constant, and a comparator circuit for comparing an output of said third multiplier and the output of said second multiplier and outputting information of which of them is greater, and that said third delay element receives the output of said maximum value circuit, delays the received output by one sample clock period and feeds back the delayed output to said maximum value circuit.

42. An identifying apparatus as set forth in claim 39, characterized in that said limiter comprises a second multiplier for receiving the feedback signal and squaring the received feedback signal, a third multiplier for multiplying an output of said second multiplier by a predetermined first constant, a minimum value circuit for receiving an output of said third multiplier, the input signal to said limiter and a predetermined second constant and detecting a minimum value of the three received signals, a fourth multiplier for multiplying an output of said second multiplier by a predetermined third constant, and a maximum value circuit for receiving an ouput of said fourth multiplier, an output of said minimum value circuit and a predetermined fourth constant and outputting a maximum value of the three received signals.

43. A method of identifying an unknown system using an adaptive filter, which delays an input signal successively by one sample period to form a plurality of samples, calculates products between the samples and corresponding samples of a plurality of multiplicands provided correspondingly to the plurality of samples, and outputs the sum total of the products, wherein the unknown system is identified by adding to each of the multiplicands a product among a difference signal obtained by subtraction of an output of said adaptive filter from an output of the unknown system, the sample corresponding to the multiplicand and a parameter as an updated amount for unit updating to update the multiplicands so that the difference signal is decreased, characterized in that a value which increases in proportion to a gradient of the difference signal with respect to the parameter is added to the parameter to obtain a sum and a limit is applied to the sum to obtain a limited sum, and then, an average value of these limited sums is calculated and is determined as the parameter for calculation of the updated amount.

44. An identifying method as set forth in claim 43, characterized in that the time constant for calculation of the average value is calculated using an average value in advance and is replaced, when sudden change in the difference signal is detected, by a constant corresponding to an initial value of the parameter.

45. An identifying method as set forth in claim 44, characterized in that a sudden change of the difference signal is detected such that a squared value of the difference signal is calculated, and then a maximum value among all squared values after starting of identification of the unknown system until the number of clocks reaches a predetermined first constant is found, whereafter the maximum value is multiplied by a predetermined second constant to obtain a product and then the product is successively compared with the squared values.

46. An identifying method as set forth in claim 44, characterized in that a sudden change of the difference signal is detected such that an absolute value of the difference signal is calculated, and then a maximum value among all absolute values after starting of identification of the unknown system until the number of clocks reaches a predetermined first constant is found, whereafter the maximum value is multiplied by a predetermined second constant to obtain a product and then the product is successively compared with the absolute values.

47. An identifying apparatus for identifying a characteristic of an unknown system using an adaptive filter, characterized in that said apparatus:

a subtracter for subtracting an output of said adaptive filter from an output signal of the unknown system to obtain a difference signal;

a step size controller for receiving the difference signal and an input signal to said adaptive filter and successively calculating a step size for use for the updating of coefficients of said adaptive filter;

a limiter for receiving an output of said step size controller and limiting the received output; and an averaging circuit for receiving an output of said limiter and calculating an average value from the received output; and in that an output of said averaging circuit is used as a step size for the updating of coefficients of said adaptive filter.

48. An identifying apparatus as set forth in claim 47, characterized in that said limiter comprises a minimum value circuit for receiving the input signal to said limiter and a predetermined first constant and detecting a minimum value of the two received signals, and a maximum value circuit for receiving an output of said minimum value circuit and a predetermined second constant and outputting a maximum value of the two received signals.

49. An identifying apparatus as set forth in claim 47, characterized in that said averaging circuit comprises a first multiplier for multiplying an output of said limiter by a first constant, an second multiplier, an adder for adding an output of said first multiplier and an output of said second multiplier and outputting the sum as an average value, and a delay element for receiving an output of said adder and delaying the received output by one clock period, and that said multiplier multiplies an output of said delay element by a second constant and feeds back the product to said second adder.

50. An identifying apparatus for identifying a characteristic of an unknown system using an adaptive filter, characterized in that said apparatus:

a subtracter for subtracting an output of said adaptive filter from an output signal of the unknown system to obtain a difference signal;

an error change detecting circuit for receiving the difference signal and detecting a sudden change of the received difference signal;

a counter for receiving an output of said error change detecting circuit and counting clocks;

a first delay element;

a first selector for receiving an output of said error change detecting circuit and an output of said first delay element and selectively outputting one of the two received outputs in response to an output of said counter;

a step size controller for receiving the difference signal and an input signal to said adaptive filter and successively calculating a step size for use for the updating of coefficients of said adaptive filter;

a limiter for receiving an output of said step size controller and limiting the received output;

an averaging circuit for receiving an output of said limiter and calculating an average value from the received output; and a second selector for receiving an output of said averaging circuit and a predetermined constant and selectively outputting one of the two received signals in response to an output of said first selector; and that said first delay element delays the output of said first selector and feeds back the delayed output to an input of said first selector; and in that an output of said averaging circuit is used as a step size for the updating of coefficients of said adaptive filter.

51. An identifying apparatus as set forth in claim 50, characterized in that said step size controller comprises a first delay element for receiving the difference signal and delaying the received difference signal by one sample period, a first multiplier for multiplying an output of said first delay element by the difference signal, a correlation calculating circuit for receiving the input signal to said adaptive filter and calculating a correlation of the input signal, a first multiplier for multiplying an output of said correlation calculating circuit by an output of said first multiplier, a third multiplier for multiplying an output of said second multiplier by a fixed value, a second delay element, and ad adder for adding an output of said third multiplier and an output of said second delay element; and in that said second delay element delays an output of said adder and feeds back the delayed output to said adder.

52. An identifying apparatus as set forth in claim 50, characterized in that said error change detecting circuit comprises a first multiplier for receiving the difference signal and squaring the received difference signal, a counter, a selector for receiving an output of said first multiplier and the constant "0" and selecting one of the two received signals in response to an output of said counter, a delay element, a maximum value circuit for receiving an output of said selector and an output of said delay element and outputting a maximum value of the two received outputs, a second multiplier for multiplying an output of said maximum value circuit by a predetermined constant, and a comparator circuit for comparing an output of said second multiplier and the output of said first multiplier and outputting information of which of them is greater; and in that said delay element receives the output of said maximum value circuit, delays the received output by one sample clock period and feeds back the delayed output to said maximum value circuit.

53. An identifying apparatus as set forth in claim 50, characterized in that said error change detecting circuit comprises an absolute value detecting circuit for receiving the difference signal and calculating an absolute value of the received difference signal, a counter, a selector for receiving an output of said absolute value detecting circuit and the constant "0" and selecting one of the two received signals in response to an output of said counter, a delay element, a maximum value circuit for receiving an output of said selector and an output of said delay element and outputting a maximum value of the two received signals, a multiplier for multiplying an output of said maximum value circuit by a predetermined constant, and a comparator circuit for comparing an output of said multiplier and the output of said absolute value detecting circuit and outputting information of which of them is greater; and in that said delay element receives the output of said maximum value circuit, delays the received output by one sample clock period and feeds back the delayed output to said maximum value circuit.

54. An identifying apparatus as set forth in claim 50, characterized in that said averaging circuit comprises a first multiplier for multiplying an output of said limiter by a first variable, an second multiplier, an adder for adding an output of said first multiplier and outputting the sum as an average value, and a delay element for receiving an output of said adder and delaying the received output by one clock period; and in that said second multiplier multiplies an output of said second delay element by a second variable and feeds back the product to said adder, and the first and second variables are determined using the feedback signal from said second selector.

55. An identifying apparatus as set forth in claim 50, characterized in that said step size controller comprises a second delay element for receiving the difference signal and delaying the received difference signal by one sample period, a first multiplier for multiplying an output of said second delay element by the difference signal, a correlation calculating circuit for receiving the input signal to said adaptive filter and calculating a correlation of the input signal, a second multiplier for multiplying an output of said correlation calculating circuit by an output of said first multiplier, a third multiplier by a fixed value, a third delay element, and an adder for adding an output of said third multiplier and an output of said third delay element; and in that said third delay element delays an output of said adder and feeds back the delayed output to said adder.

56. An identifying apparatus as set forth in claim 50, characterized in that said error change detecting circuit comprises a first multiplier for receiving the difference signal and squaring the received difference signal, a counter, a third selector for receiving an output of said first multiplier and the constant "0" and selecting one of the two received signals in response to an output of said counter, a second delay element, a maximum value circuit for receiving an output of said third selector and an output of said second delay element and outputting a maximum value of the two received outputs, a second multiplier for multiplying an output of said maximum value circuit by a predetermined second constant, and a comparator circuit for comparing an output of said second multiplier and the output of said first multiplier and outputting information of which of them is greater; and in that said second delay element receives the output of said maximum value circuit, delays the received output by one sample clock period and feeds back the delayed output to said maximum value circuit.

57. An identifying apparatus as set forth in claim 50, characterized in that said error change detecting circuit comprises an absolute value detecting circuit for receiving the difference signal, a counter, a third selector for receiving an output of said absolute value detecting circuit and the constant "0" and selecting one of the two received signals in response to an output of said counter, a second delay element, a maximum value circuit for receiving an output of said third selector and an output of said second delay element and outputting a maximum value of the two received signals, a multiplier for multiplying an output of said maximum value circuit by a predetermined second constant, and a comparator circuit for comparing an output of said multiplier and the output of said absolute value detecting circuit and outputting information of which of them is greater; and in that said second delay element receives the output of said maximum value circuit, delays the received output by one sample clock period and feeds back the delayed output to said maximum value circuit.

58. An identifying apparatus as set forth in claim 50, characterized in that said limiter comprises a minimum value circuit for receiving the input signal to said limiter and a predetermined second constant and detecting a minimum value of the two received signals, and a maximum value circuit for receiving an output of said minimum value circuit and a predetermined third constant and outputting a maximum value of the two received signals.

59. A method of identifying an unknown system using an adaptive filter, which delays an input signal successively by one sample period to form a plurality of samples, calculates products between the samples and corresponding samples of a plurality of multiplicands provided correspondingly to the plurality of samples, and outputs the sum total of the products, wherein the unknown system is identified by adding to each of the multiplicands a normalized value of a product among a difference signal obtained by subtraction of an output of said adaptive filter from an output of the unknown system, the sample corresponding to the multiplicand and a parameter as an updated amount for unit updating to update the multiplicands so that the difference signal is decreased, said normalized value being obtained by normalization of the product with a value of input power to said adaptive filter, characterized in that a value which increases in proportion to a gradient of the difference signal normalized with the value of input power to said filter with respect to the parameter is added to the parameter to obtain a sum, and the parameter is modified using the sum.

60. An identifying method as set forth in claim 59, characterized in that a value obtained by multiplication of the limited sum in the past by a predetermined first constant, a predetermined second constant and the sum are compared with one another, and a minimum value of the three is determined as the limited sum.

61. An identifying method as set forth in claim 59, characterized in that a value obtained by multiplication of the previous limited sum by a predetermined first constant, a predetermined second constant and the sum are compared with one another, and a maximum value of the three is determined as the limited sum.

62. An identifying method as set forth in claim 59, characterized in that a value obtained by multiplication of the previous limited sum by a predetermined fifth constant, a predetermined sixth constant and the sum are compared with one another to detect a minimum value among the three, and the minimum value, a value obtained by multiplication of the limited sum in the past by a predetermined first constant and a predetermined second constant are compared with one another, and a maximum value of the three is determined as the limited sum.

63. An identifying method as set forth in claim 59, characterized in that a value obtained by multiplication of a squared value of the limited sum in the past by a predetermined first constant, a predetermined second constant and the sum are compared with one another, and a minimum value of the three is determined as the limited sum.

64. An identifying method as set forth in claim 59, characterized in that a value obtained by multiplication of a squared value of the previous limited sum by a predetermined first constant, a predetermined second constant and the sum are compared with one another, and a maximum value of the three is determined as the limited sum.

65. An identifying method as set forth in claim 59, characterized in that a value obtained by multiplication of a squared value of the previous limited sum by a predetermined first constant, a predetermined second constant and the sum are compared with one another to detect a minimum value among the three, and the minimum value, a value obtained by multiplication of the squared value by a predetermined third constant and a predetermined fourth constant are compared with one another, and a maximum value of the three is determined as the limited sum.

66. A method of identifying an unknown system using an adaptive filter, which delays an input signal successively by one sample period to form a plurality of samples, calculates products between the samples and corresponding samples of a plurality of multiplicands provided correspondingly to the plurality of samples, and outputs the sum total of the products, wherein the unknown system is identified by adding to each of the multiplicands a normalized value of a product among a difference signal obtained by subtraction of an output of said adaptive filter from an output of the unknown system, the sample corresponding to the multiplicand and a parameter as an updated amount for unit updating to update the multiplicands so that the difference signal is decreased, said normalized value being obtained by normalization of the product with a value of input power to said adaptive filter, characterized in that a value which increases in proportion to a gradient of the difference signal normalized with the value of input power to said filter with respect to the parameter is added to the parameter to obtain a sum and the parameter is modified using a limited sum obtained by applying a limit to the sum, and a threshold value for applying the limit is calculated using a previous limited sum or sums.

67. An identifying method as set forth in claim 56, characterized in that the threshold value is calculated using a squared value of the previous limited sum or sums.

68. An identifying method as set forth in claim 67, characterized in that, when a sudden change in the difference signal is detected, the limited sum is replaced by a predetermined variable, and then the parameter is modified using the limited sum.

69. An identifying method as set forth in claim 68, characterized in that a sudden change of the difference signal is detected such that a squared value of the difference signal is calculated, and then a maximum value among all the squared values after starting of identification of the unknown system until the number of clocks reaches a predetermined first constant is found, whereafter the maximum value is multiplied by a predetermined second constant to obtain a product and then the product is successively compared with the squared values.

70. An identifying method as set forth in claim 68, characterized in that a sudden change of the difference signal is detected such that an absolute value of the difference signal is calculated, and then a maximum value among all the absolute values after starting of identification of the unknown system until the number of clocks reaches a predetermined third constant is found, whereafter the maximum value is multiplied by a predetermined second constant to obtain a product and then the product is successively compared with the absolute values.

71. An identifying method as set forth in claim 67, characterized in that, when a sudden change in the difference signal is detected, the sum is regarded as the limited sum only for a period of time of a number of clocks equal to a predetermined constant, and then the parameter is modified using the limited sum.

72. An identifying method as set forth in claim 71, characterized in that a sudden change of the difference signal is detected such that a squared value of the difference signal is calculated, and then a maximum value among all the squared values after starting of identification of the unknown system until the number of clocks reaches a predetermined first constant is found, whereafter the maximum value is multiplied by a predetermined second constant to obtain a product and then the product is successively compared with the squared values.

73. An identifying method as set forth in claim 71, characterized in that a sudden change of the difference signal is detected such that an absolute value of the difference signal is calculated, and then a maximum value among all the absolute values after starting of identification of the unknown system until the number of clocks reaches a predetermined first constant is found, whereafter the maximum value is multiplied by a predetermined second constant to obtain a product and then the product is successively compared with the absolute values.

74. An identifying method as set forth in claim 56, characterized in that, when a sudden change in the difference signal is detected, the limited sum is replaced by a predetermined variable, and then the parameter is modified using the thus replaced limited sum.

75. An identifying method as set forth in claim 74, characterized in that a sudden change of the difference signal is detected such that a squared value of the difference signal is calculated, and then a maximum value among all the squared values after starting of identification of the unknown system until the number of clocks reaches a predetermined first constant is found, whereafter the maximum value is multiplied by a predetermined second constant to obtain a product and then the product is successively compared with the squared values.

76. An identifying method as set forth in claim 74, characterized in that a sudden change of the difference signal is detected such that an absolute value of the difference signal is calculated, and then a maximum value among all the absolute values after starting of identification of the unknown system until the number of clocks reaches a predetermined first constant is found, whereafter the maximum value is multiplied by a predetermined second constant to obtain a product and then the product is successively compared with the absolute values.

77. An identifying method as set forth in claim 56, characterized in that, when a sudden change in the difference signal is detected, the sum is regarded as the limited sum only for a period of time of a number of clocks equal to a predetermined constant, and then the parameter is modified using the limited sum.

78. An identifying method as set forth in claim 77, characterized in that a sudden change of the difference signal is detected such that a squared value of the difference signal is calculated, and then a maximum value among all the squared values after starting of identification of the unknown system until the number of clocks reaches a predetermined first constant is found, whereafter the maximum value is multiplied by a predetermined second constant to obtain a product and then the product is successively compared with the squared values.

79. An identifying method as set forth in claim 77, characterized in that a sudden change of the difference signal is detected such that an absolute value of the difference signal is calculated, and then a maximum value among all the absolute values after starting of identification of the unknown system until the number of clocks reaches a predetermined first constant is found, whereafter the maximum value is multiplied by a predetermined second constant to obtain a product and then the product is successively compared with the absolute values.

80. An identifying apparatus for identifying a characteristic of an unknown system using an adaptive filter, characterized in that said apparatus:

a subtracter for subtracting an output of said adaptive filter from an output signal of the unknown system to obtain a difference signal;

a correlation calculating circuit for receiving an input signal to said adaptive filter and calculating and outputting a power value and a correlation of the input signal;

a first delay element for receiving the power value and delaying the received power value by one sample period;

a second delay element;

a step size controller for receiving the difference signal, the correlation value, an output of said first delay element and an output of said second delay element and successively calculating a step size for use for the updating of coefficients of said adaptive filter;

a limiter for receiving an output of said step size controller and limiting the received output;

a first multiplier for multiplying an output of said limiter by the difference signal; and a first normalizing circuit for normalizing an output of said first multiplier with the power value; and in that said second delay element delays the output of said limiter by one sample period and feeds back the thus delayed output to said step size controller; and an output of said first normalizing circuit is used as a step size for the updating of coefficients of said adaptive filter.

81. An identifying apparatus as set forth in claim 80, characterized in that said second delay element delays the output of said limiter by one sample period and also feeds back the thus delayed output to said limiter.

82. An identifying apparatus as claimed in claim 80, characterized in that said limiter comprises a minimum value circuit for receiving the input signal to said limiter and a predetermined first constant and for detecting a minimum value of the two received signals, and a maximum value circuit for receiving an output of said minimum value circuit and a predetermined second constant and outputting a maximum of them.

83. An identifying apparatus for identifying a characteristic of an unknown system using an adaptive filter, characterized in that said apparatus comprises:

a subtracter for subtracting an output of said adaptive filter from an output signal of the unknown system to obtain a difference signal;

an error change detecting circuit for receiving the difference signal and detecting a sudden change of an identification error of said adaptive filter included in the received difference signal;

a correlation calculating circuit for receiving an input signal to said adaptive filter and calculating and outputting a power value and a correlation of the input signal;

a first delay element for receiving the power value and delaying the received power value by one sample period;

a second delay element;

a step size controller for receiving the difference signal, the correlation value, an output of said first delay element and an output of said second delay element and successively calculating a step size for use for the updating of coefficients of said adaptive filter;

a limiter for receiving an output of said step size controller and limiting the received output;

a selector for receiving an output of said limiter and a predetermined first constant and selectively outputting one of the two received signals in response to an output of said error change detecting circuit;

a first multiplier for multiplying an output of said selector by the difference signal; and a first normalizing circuit for normalizing an output of said first multiplier with the power value; and in that said second delay element delays the output of said limiter by one sample period and feeds back the thus delayed output to said step size controller and said limiter; and an output of said first normalizing circuit is used as a step size for the updating of coefficients of said adaptive filter.

84. An identifying apparatus as set forth claim 83, characterized in that said step size controller comprises a third delay element for receiving the difference signal and delaying the received difference signal by one sample period, a second multiplier for multiplying an output of said third delay element by the difference signal, a third multiplier for multiplying the correlation value by an output of said second multiplier, a fourth multiplier for multiplying an output of said third multiplier by a fixed value, a second normalizing circuit for normalizing an output of said fourth multiplier with the power value, and an adder for adding an output of said second normalizing circuit and the output of said second delay element.

85. An identifying apparatus as set forth in claim 83, characterized in that said error change detecting circuit comprises a second multiplier for receiving the difference signal and squaring the received difference signal, a counter, a second selector for receiving an output of said second multiplier and the constant "0" and selecting one of the two received signals in response to an output of said counter, a third delay element, a maximum value circuit for receiving an output of said second selector and an output of said third delay element and outputting a maximum value of the two received signals, a third multiplier for multiplying an output of said maximum value circuit by a predetermined second constant, and a comparator circuit for comparing an output of said third multiplier and the output of said second multiplier and outputting information of which of them is greater; and in that said third delay element delays the output of said maximum value circuit by one sample clock period and feeds back the delayed output to said maximum value circuit.

86. An identifying apparatus as set forth in claim 83, characterized in that said error change detecting circuit comprises an absolute value circuit for calculating an absolute value of the difference signal, a counter, a second selector for receiving an output of said absolute value circuit and the constant "0" and selecting one of the two received signals in response to an output of said counter, a third delay element, a maximum value circuit for receiving an output of said second selector and an output of said third delay element and outputting a maximum value of the two received signals, a second multiplier for multiplying an output of said maximum value circuit by a predetermined second constant, and a comparator circuit for comparing an output of said second multiplier and the output of said absolute value circuit and outputting information of which of them is greater; and in that said third delay element receives the output of said maximum value circuit, delays the received output by one sample clock period and feeds back the delayed output to said maximum value circuit.

87. An identifying apparatus as set forth in claim 83, characterized in that said limiter comprises a second multiplier for multiplying the feedback signal by a predetermined second constant, a minimum value circuit for receiving an output of said second multiplier, the input signal to said limiter and a predetermined third constant and detecting a minimum value of the three received signals, and a maximum value circuit for receiving the output of said second multiplier, an output of said minimum value circuit and a predetermined fourth constant and outputting a maximum value of the three received signals.

88. An identifying apparatus as set forth in claim 83, characterized in that said limiter comprises an second multiplier for multiplying the feedback signal by a predetermined second constant, a minimum value circuit for receiving an output of said second multiplier, the input signal to said limiter and a predetermined third constant and detecting a minimum value of the three received signals, a third multiplier for multiplying the feedback signal by a predetermined fourth constant, and a maximum value circuit for receiving an output of said third multiplier, an output of said minimum value circuit and a predetermined fifth constant and outputting a maximum value of the three received signals.

89. An identifying apparatus as set forth in claim 83, characterized in that said limiter comprises a second multiplier for receiving the feedback signal and squaring the received feedback signal, a third multiplier for multiplying an output of said second multiplier by a predetermined second constant, and a minimum value circuit for receiving an output of said third multiplier, the input signal to said limiter and a predetermined third constant and detecting a minimum value of the three received signals.

90. An identifying apparatus as set forth in claim 83, characterized in that said limiter comprises a second multiplier for receiving the feedback signal and squaring the received feedback signal, a third multiplier for multiplying an output of said second multiplier by a predetermined second constant, and a maximum value circuit for receiving an output of said third multiplier, the input signal to said limiter and a predetermined third constant and detecting a maximum value of the three received signals.

91. An identifying apparatus as set forth in claim 83, characterized in that said limiter comprises a second multiplier for receiving the feedback signal and squaring the received feedback signal, an third multiplier for multiplying an output of said second multiplier by a predetermined second constant, a minimum value circuit for receiving an output of said third multiplier, the input signal to said limiter and a predetermined third constant and detecting a minimum value of the three received signals, a fourth multiplier for multiplying the output of said second multiplier by a predetermined fourth constant, and a maximum value circuit for receiving an output of said fourth multiplier, an output of said minimum value circuit and a predetermined fifth constant and detecting a maximum value of the three received signals.

92. An identifying apparatus as set forth in claim 78, characterized in that said limiter comprises an second multiplier for receiving the feedback signal and multiplying the received feedback signal by a predetermined second constant, a third multiplier for multiplying an output of said third multiplier, the input signal to said limiter and a predetermined third constant and detecting a minimum value of the received three signals, and a maximum value circuit for receiving the output of said third multiplier, an output of said minimum value circuit and a predetermined fourth constant and outputting a maximum value of the three received signals.

93. An identifying apparatus for identifying a characteristic of an unknown system using an adaptive filter, characterized in that said apparatus:

a subtracter for subtracting an output of said adaptive filter from an output signal of the unknown system to obtain a difference signal;

an error change detecting circuit for receiving the difference signal and detecting a sudden change of an identification error of said adaptive filter included in the received difference signal;

a holding circuit for holding an output of said error change detecting circuit for a fixed period of time;

a correlation calculating circuit for receiving an input signal to said adaptive filter and calculating and outputting a power value and a correlation of the input signal;

a first delay element for receiving the power value and delaying the received power value by one sample period;

a second delay element;

a step size controller for receiving the difference signal, the correlation value, an output of said first delay element and an output of said second delay element and successively calculating a step size for use for the updating of coefficients of said adaptive filter;

a limiter for receiving an output of said step size controller and limiting the received output;

a selector for receiving an output of said limiter and the output of said step size controller and selectively outputting one of the two received signals in response to an output of said holding circuit;

a first multiplier for multiplying an output of said selector by the difference signal; and a first normalizing circuit for normalizing an output of said first multiplier with the power value; and in that said second delay element delays the output of said limiter by one sample period and feeds back the thus delayed output to said step size controller and said limiter; and an output of said first normalizing circuit is used as a step size for the updating of coefficients of said adaptive filter.

\* \* \* \* \*